United States Patent
Kojima et al.

(10) Patent No.: US 10,971,415 B2
(45) Date of Patent: Apr. 6, 2021

(54) SEMICONDUCTOR DEVICE, MANUFACTURING METHOD FOR SEMICONDUCTOR DEVICE, SEMICONDUCTOR MODULE, AND POWER CONVERSION DEVICE

(71) Applicant: Hitachi Power Semiconductor Device, Ltd., Hitachi (JP)

(72) Inventors: Kyoko Kojima, Tokyo (JP); Hiroyuki Matsushima, Tokyo (JP); Kazuhiro Suzuki, Tokyo (JP)

(73) Assignee: HITACHI POWER SEMICONDUCTOR DEVICE, LTD., Hitachi (JP)

( * ) Notice: Subject to any disclaimer, the term of this patent is extended or adjusted under 35 U.S.C. 154(b) by 274 days.

(21) Appl. No.: 16/305,146

(22) PCT Filed: Jan. 13, 2017

(86) PCT No.: PCT/JP2017/001074
§ 371 (c)(1),
(2) Date: Nov. 28, 2018

(87) PCT Pub. No.: WO2017/216991
PCT Pub. Date: Dec. 21, 2017

(65) Prior Publication Data
US 2020/0321258 A1    Oct. 8, 2020

(30) Foreign Application Priority Data

Jun. 15, 2016  (JP) .............................. JP2016-118868

(51) Int. Cl.
*H01L 21/00* (2006.01)
*H01L 23/08* (2006.01)
(Continued)

(52) U.S. Cl.
CPC .............. *H01L 23/08* (2013.01); *H01L 21/56* (2013.01); *H01L 23/29* (2013.01);
(Continued)

(58) Field of Classification Search
CPC ..... H01L 21/56; H01L 21/561; H01L 21/565; H01L 21/78; H01L 21/4842; H01L 23/08;
(Continued)

(56) References Cited

U.S. PATENT DOCUMENTS

| | | | | |
|---|---|---|---|---|
| 6,200,121 B1* | 3/2001 | Tsuruta | ............ | B29C 45/14655 257/724 |
| 6,853,089 B2* | 2/2005 | Ujiie | ....................... | H01L 21/56 257/782 |
| 2003/0052419 A1* | 3/2003 | Ujiie | ....................... | H01L 24/06 257/787 |

FOREIGN PATENT DOCUMENTS

| JP | 2007-201247 A | 8/2007 |
|---|---|---|
| JP | 2012-156153 A | 8/2012 |

(Continued)

OTHER PUBLICATIONS

Agarwal et al., "SiC Power Devices—An Overview", 2004, Mat. Res. Soc. Symp. Proc. vol. 815, pp. J1.1.1-J1.1.12 (Dec. 2004).*
(Continued)

*Primary Examiner* — Nikolay K Yushin
(74) *Attorney, Agent, or Firm* — Miles & Stockbridge, P.C.

(57) ABSTRACT

In a semiconductor device using a wide bandgap semiconductor material having a bandgap larger than that of silicon, reliability of the semiconductor device is improved by achieving a structure in which electric field strength in the vicinity of an outer end portion of a semiconductor chip is relaxed. A side surface of the semiconductor chip CHP1*a* is formed of a region R1 including a first corner, a region R2 including a second corner, and a region R3 interposed (Continued)

between the region R1 and the region R2. At this point, in a case of defining a minimum film thickness of a high electric field-resistant sealing member MR in the region R3 as t1 and defining a maximum film thickness of the high electric field-resistant sealing member MR in the region R1 as t2, a relation of $t2 \leq 1.5 \times t1$ is satisfied.

14 Claims, 35 Drawing Sheets

(51) Int. Cl.
  *H01L 25/065* (2006.01)
  *H01L 29/20* (2006.01)
  *H01L 21/56* (2006.01)
  *H01L 23/29* (2006.01)
  *H01L 29/16* (2006.01)

(52) U.S. Cl.
  CPC ...... *H01L 25/0655* (2013.01); *H01L 29/1602* (2013.01); *H01L 29/1608* (2013.01); *H01L 29/2003* (2013.01); *H01L 2224/48227* (2013.01)

(58) Field of Classification Search
  CPC ..... H01L 23/31; H01L 23/29; H01L 25/0655; H01L 25/042; H01L 25/18; H01L 25/00; H01L 2224/0603; H01L 2224/48227; H01L 2224/49111; H01L 2224/4917; H01L 2224/92247; H01L 2224/4847; H01L 2224/73265; H01L 2224/02166; H01L 2224/49113
  See application file for complete search history.

(56) References Cited

FOREIGN PATENT DOCUMENTS

| JP | 2013-191716 A | 9/2013 |
| JP | 2013-239607 A | 11/2013 |
| JP | 2014-110277 A | 6/2014 |
| JP | 2014-236166 A | 12/2014 |

OTHER PUBLICATIONS

Vouyovitch et al., "Dielectric Breakdown of Epoxy-Based Composites", 2006, IEEE Transactions on Dielectrics and Electrical Insulation vol. 13, No. 2; pp. 282-292, published Apr. 2006.*

Patel at al. "Synthesis of alkyd resin", 2008, Journal of Polymer Science, vol. 107, Issue3, pp. 1724-1729, published Feb. 5, 2008.*

* cited by examiner $t2 \leq 1.5 \times t1$ t2=t1

FIG. 36

| | LATERAL DIMENSION (mm) | VERTICAL DIMENSION (mm) | APPLICATION METHOD | RESIN WIDTH 1 | RESIN WIDTH 2 | t2 (μm) | t1 (μm) | WAFER WARPAGE | DICING YIELD RATE | PEELING RESISTANCE |
|---|---|---|---|---|---|---|---|---|---|---|
| CHIP A | 6 | 5 | FIRST METHOD | 0.9 | 0.9 | 110 | 95 | ○ | ○ | ○ |
| CHIP B | 7 | 5 | THIRD METHOD | 0.9 | 0.9 | 90 | 100 | ○ | ○ | ○ |
| CHIP C | 6 | 4.5 | FIRST METHOD | 0.9 | 0.9 | 80 | 75 | ○ | ○ | ○ |
| CHIP D | 8 | 6 | THIRD METHOD | 0.9 | 0.9 | 80 | 100 | ○ | ○ | ○ |
| CHIP E | 8 | 6 | NO MODULATION | 0.9 | 0.9 | 160 | 100 | × | × | × |

SEMICONDUCTOR DEVICE, MANUFACTURING METHOD FOR SEMICONDUCTOR DEVICE, SEMICONDUCTOR MODULE, AND POWER CONVERSION DEVICE

TECHNICAL FIELD

The present invention relates to a semiconductor device, a manufacturing technique therefor, a semiconductor module, and a power conversion device, and relates to an effective technique applied to, for example: a semiconductor device using a wide bandgap semiconductor material having a bandgap larger than that of silicon; and a manufacturing technique therefor.

BACKGROUND ART

JP 2013-191716 A (PTL 1) discloses a technique in which electric field strength generated inside a silicone gel from an electric field relaxation region provided in a peripheral region of a SiC element is reduced to secure stable breakdown characteristic. In this technique, it is disclosed that an inorganic layer consisting of silicon oxide and a resin layer formed on an upper portion of the inorganic layer are provided between the electric field relaxation region and the silicone gel.

JP 2014-236166 A (PTL 2) discloses a technique in which a curvature radius of a corner portion of a p-type termination region on a [−1-120] direction side from a center of a semiconductor chip is set larger than a curvature radius of a corner portion of a p-type termination region on a [11-20] direction side from the center of the semiconductor chip.

CITATION LIST

Patent Literature

PTL 1: JP 2013-191716 A
PTL 2: JP 2014-236166 A

SUMMARY OF INVENTION

Technical Problem

For example, a wide bandgap semiconductor material having a bandgap larger than that of silicon has a high dielectric breakdown field strength, and therefore, it is possible to provide a design in which electric field strength inside a semiconductor chip is enhanced, and a manufacturing cost can be reduced by downsizing an electric field relaxation portion (termination portion) formed in a peripheral edge portion of the semiconductor chip.

Here, a sealing material for the wide bandgap semiconductor material is required to have high dielectric breakdown strength because electric field strength applied to a sealing body contacting the wide bandgap semiconductor material is also increased. For example, in a case of silicon, a portion immediately above an electric field relaxation portion of a semiconductor chip is sealed with a sealing member such as a silicone gel, but in a case of a wide bandgap semiconductor material, electric field strength exceeds dielectric breakdown field strength of the silicone gel, and therefore, it is studied to insert an insulation member between the electric field relaxation portion and the silicone gel.

At this point, the insulation member is formed in a process of mounting a semiconductor chip on an insulation substrate after obtaining the semiconductor chip by dicing a semiconductor wafer. In other words, an insulation material to be a base of the insulation member is dropped with pinpoint accuracy onto the electric field relaxation portion formed at a peripheral edge portion of the semiconductor chip. However, in this case, a shape of an outer end portion of the insulation member is formed in a tapered shape having a trailing edge because of the dropping technique with pinpoint accuracy. Due to this, a film thickness of the insulation member becomes small in the vicinity of the outer end portion of the semiconductor chip, and there may be a possibility that electric field strength cannot be sufficiently relaxed.

Regarding this point, when the electric field relaxation portion is designed to have a sufficiently large width, the electric field strength in the vicinity of the outer end portion of the semiconductor chip can be relaxed, but in this case, a size of the electric field relaxation portion not functioning as a semiconductor element forming portion becomes large, thereby causing increase in a manufacturing cost.

Therefore, to effectively utilize an excellent material physical property of the wide bandgap semiconductor material, it is demanded to devise a shape of the insulation member such that the electric field strength can be relaxed in the vicinity of the outer end portion of the semiconductor chip even though the electric field relaxation portion is reduced.

An object of the invention is to improve reliability of a semiconductor device by achieving a structure in which electric field strength in the vicinity of an outer end portion of a semiconductor chip is relaxed in the semiconductor device using a wide bandgap semiconductor material having a bandgap larger than that of silicon. Other problems and novel characteristics will be clarified in the description of the present specification and the accompanying drawings.

Solution to Problem

A semiconductor device according to one embodiment includes a semiconductor chip including a semiconductor material having a bandgap larger than that of silicon. Here, the semiconductor chip includes, in a side view: an insulation member formed on a surface of the semiconductor substrate; and a sealing member formed on the insulation member and having dielectric breakdown field strength smaller than that of the insulation member. Additionally, the side surface of the semiconductor chip is formed of a first region including a first corner, a second region including a second corner, and a third region interposed between the first region and the second region. At this point, in a case of defining a minimum film thickness of the insulation member in the third region as t1 and defining a maximum film thickness of the insulation member in the first region as t2, a relation of $t2 \leq 1.5 \times t1$ is satisfied.

A manufacturing method for a semiconductor device according to one embodiment includes a step (a) of preparing a semiconductor wafer that includes a semiconductor material having a bandgap larger than that of silicon and has a surface. Additionally, provided are: a step (b) of applying a paste-state insulation material to the first application region and the second application region along a first direction of the surface; and a step (c) of applying the paste-state insulation material to the first application region and the third application region along a second direction crossing with the first direction on the surface. At this point, in the step (b), an application amount of the insulation material in the first application region is set smaller than an application amount of the insulation material in the second application region.

Advantageous Effects of Invention

According to one embodiment, reliability of the semiconductor device can be improved.

BRIEF DESCRIPTION OF DRAWINGS

FIG. 36 is a diagram illustrating specific numerical examples of respective parameters for each of a plurality of chips defined by the respective parameters.

DESCRIPTION OF EMBODIMENTS

In the following embodiments, the invention will be described in a plurality of sections or a plurality of divided embodiments for the sake of convenience when necessary, but unless otherwise particularly specified, the sections or embodiments are mutually related, and one section or one embodiment is in a relation to provide a modification example, details, and a supplemental description, and the like of all or part of other sections or other embodiments.

Additionally, in the following embodiments, in a case of referring to a numeric value of an element or the like (including number, value, amount, range, or the like thereof), the numeric value is not limited to a specified value and may also be equal to or more or less than the specified value, unless otherwise particularly specified and obviously limited to the specific value in principle.

Furthermore, in the following embodiments, it is needless to mention that a constituent element thereof (including an element step or the like) is not necessarily essential, unless otherwise particularly specified or obviously considered essential in principle.

Similarly, in the following embodiments, in a case of referring to a shape, a positional relation, or the like of a constituent element or the like, the one substantially approximate or similar to a shape or the like thereof is included, unless otherwise particularly specified and obviously considered inappropriate in principle. The same is applied to the mentioned numeric values and ranges.

Additionally, note that a same member will be denoted by a same reference sign in all of the drawings to describe the embodiments, and repetition of the same description will be omitted. Meanwhile, hatching may be added even in a plan view for easy understanding for the drawings.

<Exemplary Configuration of Three-Phase Motor System>

Figure 1:
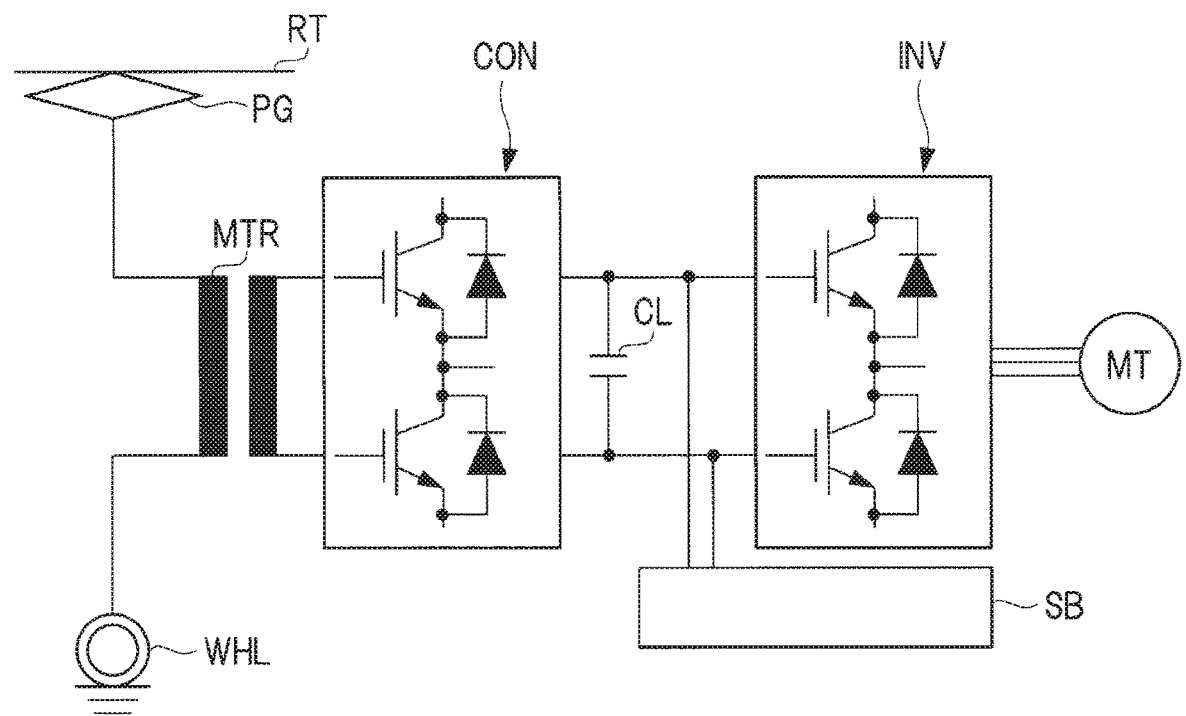
FIG. 1 is a block diagram illustrating an exemplary three-phase motor system applied to a railway car.

FIG. 1 is a block diagram illustrating an exemplary three-phase motor system (power conversion device) applied to a railway car, for example. As illustrated in FIG. 1, electric power is supplied to the railway car from an overhead line RT via a pantograph PG. At this point, high AC voltage supplied from the overhead line RT is, for example, 25 kV or 15 kV. The high AC voltage supplied from the overhead line RT to the railway car via the pantograph PG is stepped down to AC voltage of, for example, 3.3 kV by an insulation type main transformer MTR. The AC voltage that has been stepped down is rectified into DC voltage (3.3 kV) by a converter CON. After that, the DC voltage converted by the converter CON is converted to three-phase AC voltage having the phases shifted by 120 degrees by an inverter INV via a capacitor CL. Then, the three-phase AC voltage converted by the inverter INV is supplied to a three-phase motor MT. As a result, a wheel WHL is rotated by driving the three-phase motor MT, thereby enabling the railway car to travel.

Figure 2:
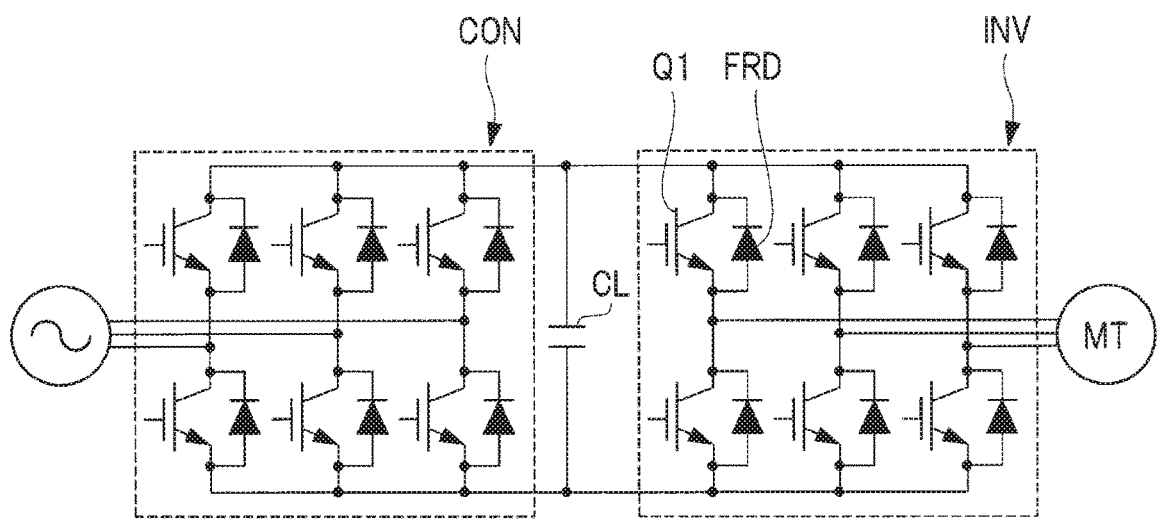
FIG. 2 is a circuit diagram illustrating a circuit configuration of a converter and an inverter.

Thus, the three-phase motor system of the railway car includes the converter CON and the inverter INV. FIG. 2 is a circuit diagram illustrating a circuit configuration of the converter CON and that of the inverter INV illustrated in FIG. 1. As illustrated in FIG. 2, each of the converter CON and the inverter INV includes six power transistors Q1 and six free wheel diodes FRD. For example, focusing on the inverter INV, an upper arm (high-side switch) and a lower arm (low-side switch) are provided corresponding to each of the three phases (U phase, V phase, and W phase), and each of the upper arm and the lower arm is formed of one power transistor Q and one free wheel diode FRD connected in parallel to each other. At this point, while the power transistor Q1 functions as a switching element, the free wheel diode functions as a rectifying element that feeds reflux current caused by inductance included in the three-phase motor MT, for example.

As described above, the power semiconductor elements such as the power transistor Q1 and the free wheel diode FRD are used as main components having a switching function and a rectification function in power conversion equipment such as the inverter INV and the converter CON. For example, an insulated gate bipolar transistor (IGBT) using silicon (Si) as a substrate material is used as the power transistor Q1, and a pn junction diode using silicon as a substrate material is used as the free wheel diode FRD.

Regarding this point, recently, it is studied to use, as a substrate material of a power semiconductor element, a wide bandgap semiconductor material having a bandgap larger than that of silicon, and development of a power semiconductor element using such a wide bandgap semiconductor material is in progress. The reason is that the wide bandgap semiconductor material has dielectric breakdown field strength higher than that of silicon because the wide bandgap semiconductor material has the bandgap larger than that of silicon. That is, since the dielectric breakdown field strength is higher than that of silicon in the power semiconductor element using the wide bandgap semiconductor material, withstand voltage can be secured even in a case where a thickness of a drift layer (epitaxial layer) is made smaller than that of the power semiconductor element using silicon as the substrate material. Furthermore, in the power semiconductor element using the wide bandgap semiconductor material, on-resistance can be by reducing the thickness of the drift layer. In other words, in the power semiconductor element using the wide bandgap semiconductor material as the substrate material, it is possible to obtain an advantage in which securing sufficient withstand voltage and reducing on-resistance can be both achieved although that there is normally a trade-off relation between securing the withstand voltage and reducing the on-resistance.

For example, silicon carbide (SiC), gallium nitride (GaN), diamond, and the like can be listed as examples of the wide bandgap semiconductor material, but in the following, the description will be provided focusing on SiC.

Since SiC that is the wide bandgap semiconductor material has dielectric breakdown field strength about one-digit higher than that of silicon, on-resistance of the power semiconductor element can be reduced. The reason is that, as described above, when the dielectric breakdown field strength is high, the withstand voltage can be secured even with a thin drift layer (epitaxial layer), and as a result, the on-resistance can be reduced by forming the drift layer thin. Furthermore, thermal conductivity of SiC is about three times thermal conductivity of silicon, and also is excellent in a semiconductor physical property even at a high temperature, and therefore, SiC is suitable for use at the high temperature.

Therefore, recently, it is studied to replace a power semiconductor element using silicon as a substrate material with a power semiconductor element using SiC as a substrate material. Specifically, in a case of exemplifying the inverter INV, among the switching element and the rectifying element which are components of the inverter INV, development is more advanced for a free wheel diode FRD that is the rectifying element so as to replace a pn junction diode using silicon as a substrate material with a Schottky barrier diode using SiC as a substrate material (hereinafter referred to as SiC Schottky barrier diode).

In the case of thus replacing the pn junction diode using silicon as the substrate material with the SiC Schottky barrier diode, there is a report that a switching loss can be reduced to 1/10 because the Schottky barrier diode has no recovery current. The reason is that there is no accumulation of minority carriers in the Schottky barrier diode that is a unipolar element while minority carriers accumulated at the time of switching flow as recovery current in the pn junction diode that is a bipolar element.

Furthermore, it is also studied to replace, as the power transistor Q1 that is the switching element, an IGBT using silicon as a substrate material (hereinafter referred to as Si-IGBT) with a metal oxide semiconductor field effect transistor using SiC as a substrate material (hereinafter referred to as SiC-MOSFET) not only in the rectifying element but also in the switching element. The reason is that an effect of reducing a switching loss can be enhanced by replacing the Si-IGBT with the SiC-MOSFET. The effect is provided because a switching loss can be reduced by replacing the Si-IGBT that is a bipolar element with the SiC-MOSFET that is a unipolar element on the basis of the principle similar to the case of replacing the pn junction diode of silicon with the SiC Schottky barrier diode. Meanwhile, in a case of forming the power transistor Q1 of the inverter INV from the SiC-MOSFET, a parasitic body diode is formed in the SiC-MOSFET, and this body diode functions as the free wheel diode FRD. From this point, the Schottky barrier diode functioning as the free wheel diode FRD can be omitted.

Meanwhile, the Schottky barrier diode and the MOSFET can be manufactured by using silicon, but it is not practical because a thickness of a drift layer is required to be formed large in order to enhance withstand voltage, and consequently, on-resistance is also increased. That is, only when SiC having high dielectric breakdown field strength is used, the withstand voltage can be secured even with the thin drift layer, and consequently, it is possible to achieve both of securing the withstand voltage and reducing the on-resistance. That is, precisely because low resistant SiC that can secure the withstand voltage even with the thin drift layer is used, it is possible to apply the Schottky barrier diode and the MOSFET which are the unipolar elements even to a high withstand voltage range of 600 V to 6.5 kV to which a Schottky barrier diode and a MOSFET using conventional silicon could not be applied.

Furthermore, it is also studied to replace, as the power transistor Q1 that is the switching element, an Si-IGBT with an IGBT using SiC as a substrate material (hereinafter referred to as SiC-IGBT). The reason is that the number of components can be reduced because the SiC-IGBT can increase a driving current amount of the three-phase motor (load) more than that in the SiC-MOSFET having the same withstand voltage and has withstand voltage per device is higher than the Si-IGBT does. As a result, a size (volume) of the three-phase motor system can be reduced. Due to this, underfloor components including the three-phase motor are miniaturized, thereby achieving lowering of a floor of a railway car. Additionally, due to such miniaturization of the underfloor components, a space to install a storage battery SB (see FIG. 1) can be secured in a part of the railway car, and therefore, power can be stored in the storage battery SB without returning power to the overhead line RT via the wheel WHL in a case where the railway car is not traveling. As a result, regeneration efficiency of the railway car can be improved. In other words, a life cycle cost of a railway system can be reduced.

<Structure Unique to SiC Device>

As described above, in a power semiconductor element using SiC as a substrate material (hereinafter referred to as SiC device), it is possible to achieve a design in which electric field strength inside a semiconductor chip formed with the SiC device is enhanced due to the fact that the SiC has high dielectric breakdown field strength. That is, the SiC device has a structure unique to the SiC device in order to achieve the design in which the electric field strength inside the semiconductor chip is enhanced. In the following, the structure unique to this SiC device will be described.

As described above, since SiC has the high dielectric breakdown field strength, it is possible to provide the design in which the electric field strength inside the semiconductor chip is enhanced, and a cost for a semiconductor chip can be reduced when a size of an electric field relaxation portion (termination portion) formed at a peripheral edge portion of the semiconductor chip is reduced. In this case, since the electric field strength applied to a sealing member that contacts the semiconductor chip is also increased, high dielectric breakdown field strength is required in the sealing member used to seal the semiconductor chip formed with the SiC device. For example, in a semiconductor chip formed with a silicon device, the semiconductor chip is sealed with a sealing member such as a silicone gel, but in a semiconductor chip formed with a SiC device, electric field strength applied to a sealing member exceeds the dielectric breakdown field strength of the silicone gel, and therefore, some new solution is required. In other words, in the semiconductor chip formed with the SiC device, a high electric field-resistant sealing member having dielectric breakdown field strength higher than that of a silicone gel is inserted between the peripheral edge portion of the semiconductor chip and the silicone gel. In other words, the structure unique to the SiC device referred to herein is a structure in which the high electric field-resistant sealing member is inserted between the silicone gel and the semiconductor chip formed with the SiC device. According to this structure, since the high electric field-resistant sealing member inserted, the electric field strength inside the silicone gel can be suppressed within an allowable range in the peripheral edge portion of the semiconductor chip formed with the SiC device. As a result, reliability of the semiconductor device including the semiconductor chip formed with the SiC device can be improved.

Thus, the semiconductor chip formed with the SiC device has the structure unique to the SiC device, but according to the study of the present inventors, it is found that there is still room for new improvement relative to the structure unique to the SiC device. Accordingly, such room for new improvement found by the present inventors will be described below.

<Study on Improvement>

Figure 3:
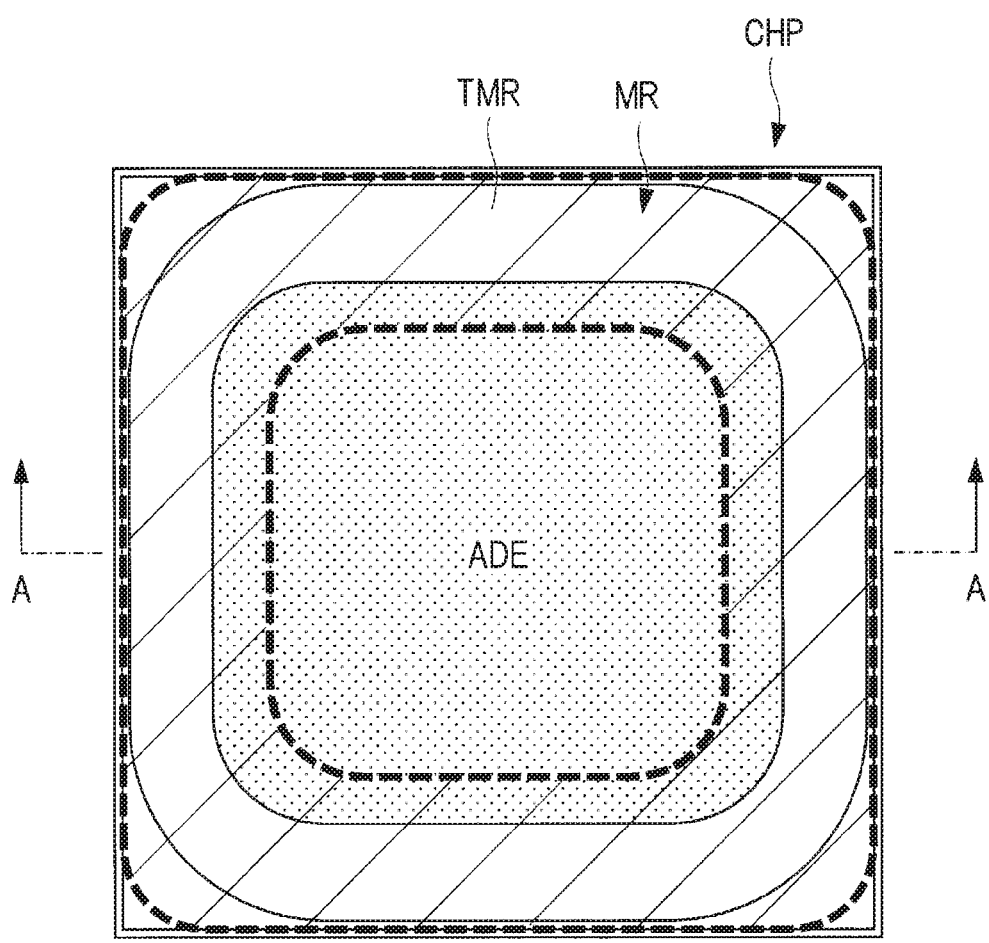
FIG. 3 is a plan view illustrating a schematic structure of a semiconductor chip on which a diode is formed in the related art.

In the following, improvement will be studied by selecting a diode as an example of the SiC device. FIG. 3 is a plan view illustrating a schematic structure of a semiconductor chip CHP on which a diode is formed in the related art. As illustrated in FIG. 3, an anode electrode (anode electrode pad) ADE is formed in a center portion of the semiconductor chip CHP having a rectangular shape, and a termination portion TMR functioning as an electric field relaxation portion is formed in a manner planarly surrounding the anode electrode ADE. Additionally, a high electric field-resistant sealing member MR is formed so as to cover the termination portion TMR. Note that the "related art" referred to in the present specification is a technique that includes a problem to be solved newly found by the inventors and is not a known conventional art, but the related art is the technique described with the intention of a premise technique (technique not yet known) of a novel technical idea.

Figure 4:
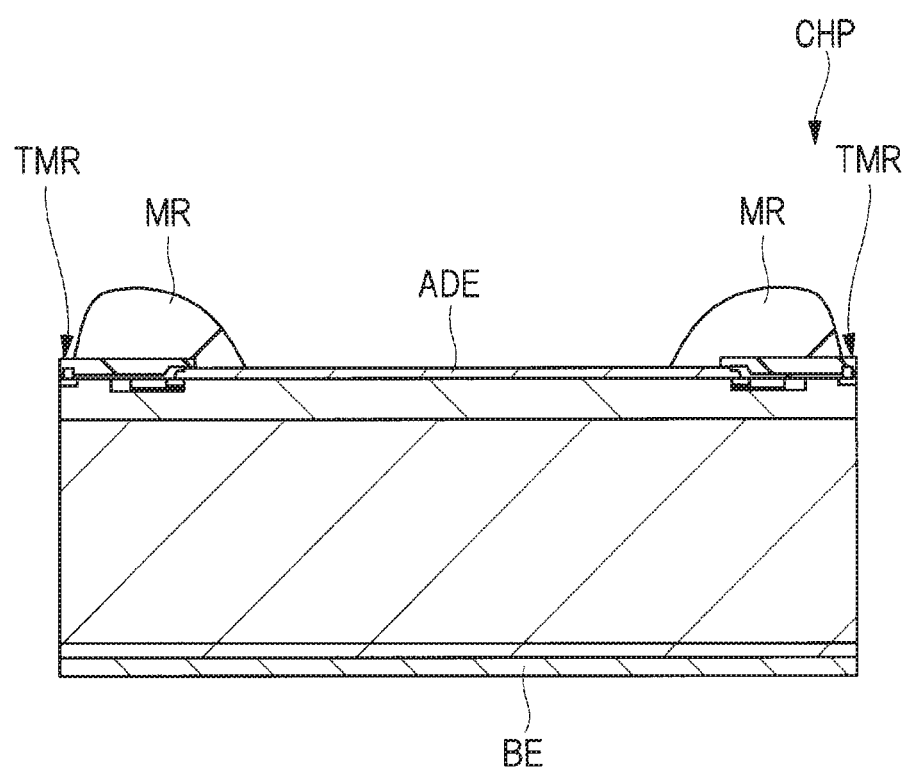
FIG. 4 is a cross-sectional view taken along a line A-A in FIG. 3.

FIG. 4 is a cross-sectional view taken along a line A-A in FIG. 3. As illustrated in FIG. 4, a back-surface electrode functioning as a cathode electrode is formed on a back surface of a semiconductor chip CHP while an anode electrode ADE is formed on a surface of the semiconductor chip CHP. Additionally, the termination portion TMR is formed in a manner interposing the anode electrode ADE, and the high electric field-resistant sealing member MR is formed over a region extending from above the termination portion TMR to the anode electrode ADE. Here, the room for improvement found by the present inventor is in a shape of the high electric field-resistant sealing member MR, and particularly, since the shape is attributable to a manufacturing process for the high electric field-resistant sealing member MR, a manufacturing process for the high electric field-resistant sealing member MR in the related art will be briefly described below.

Figure 5:
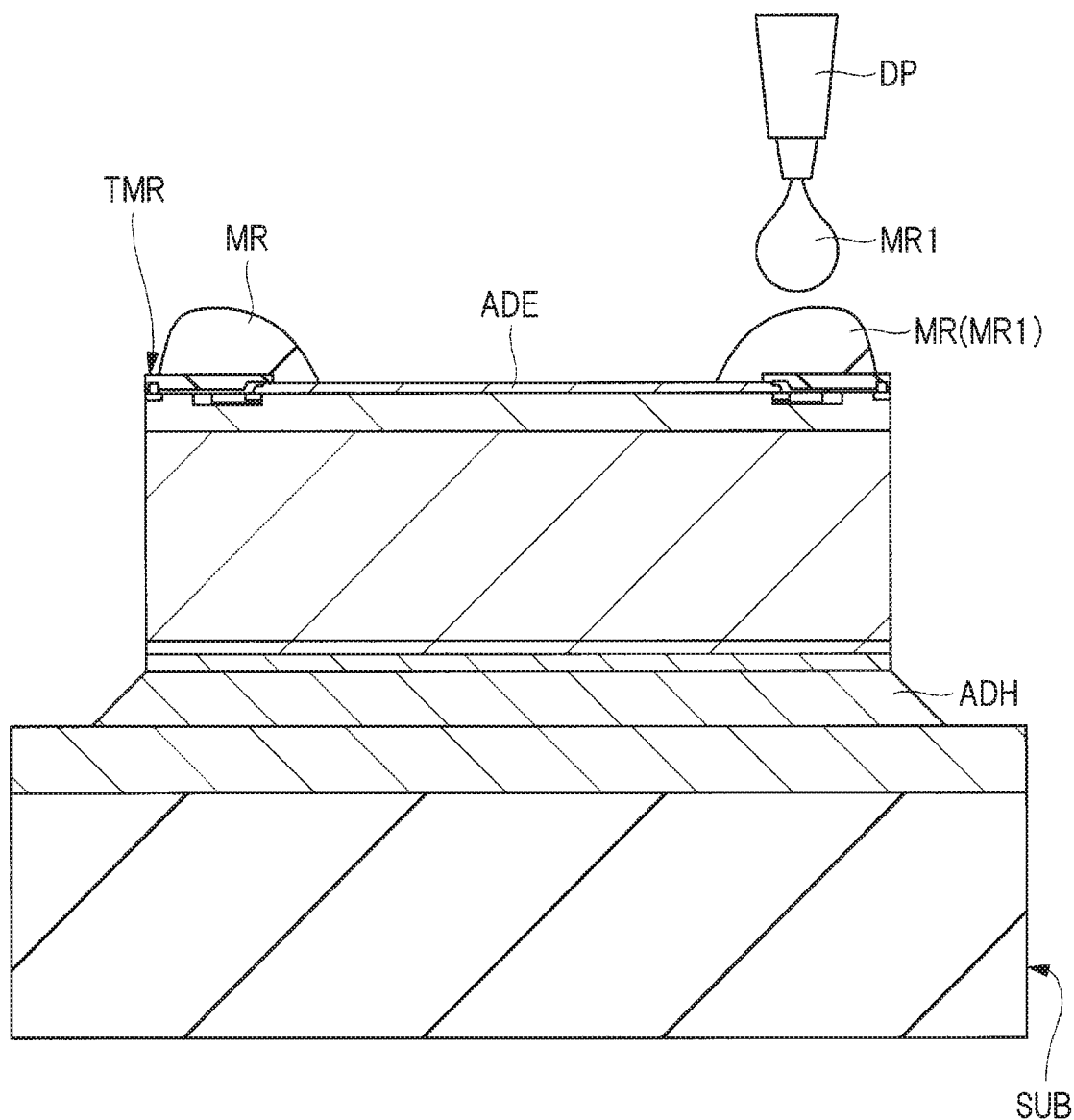
FIG. 5 is a view schematically illustrating a process of forming a high electric field-resistant sealing member.
Figure 6:
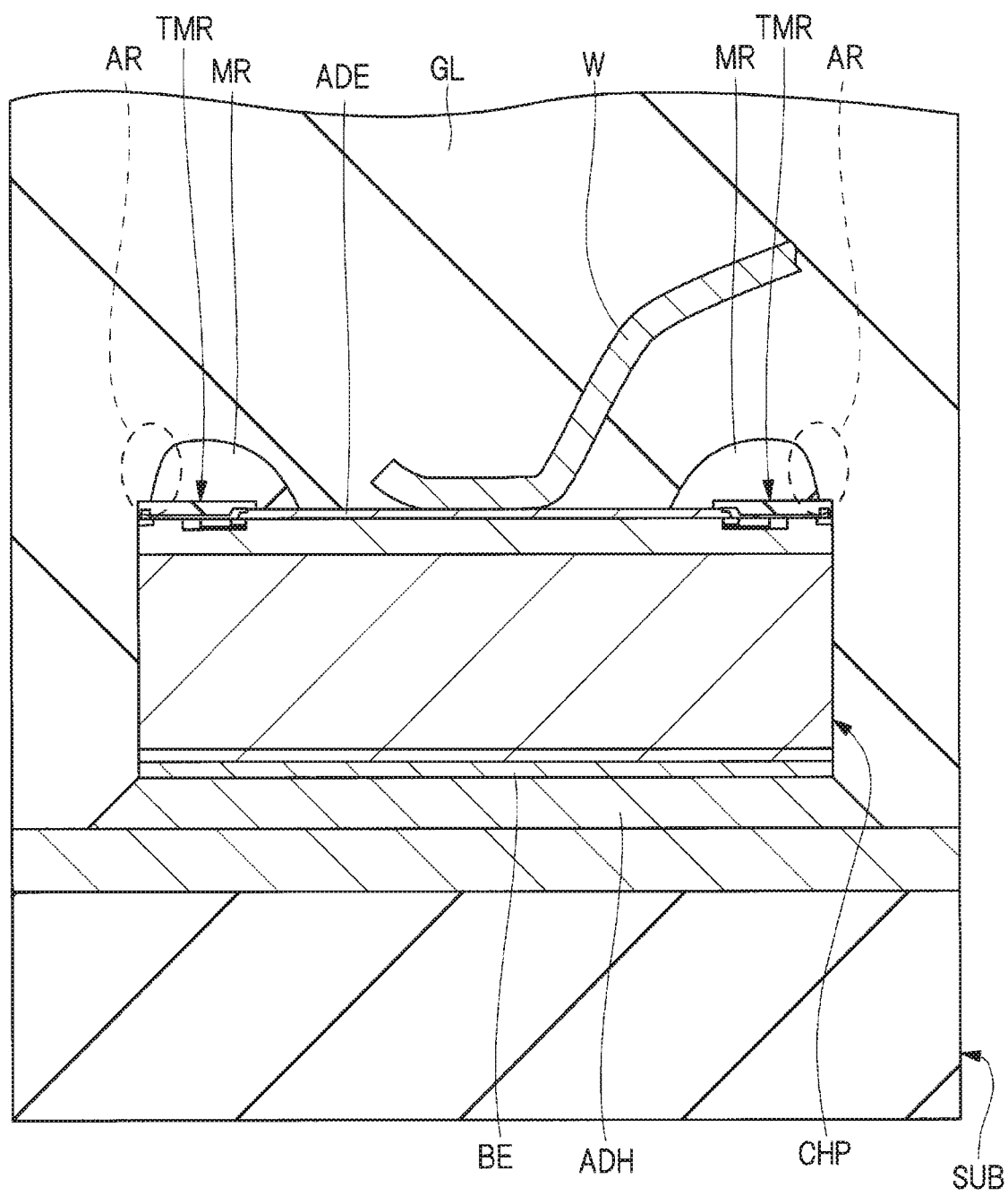
FIG. 6 is a cross-sectional view illustrating a structure of a semiconductor device in the related art.

Specifically, in the related art, a semiconductor wafer is diced into a plurality of segmented semiconductor chips, and then a high electric field-resistant sealing member MR is formed in a state where each of the semiconductor chips is mounted on an insulation substrate. FIG. 5 is a view schematically illustrating a process of forming the high electric field-resistant sealing member MR. In FIG. 5, a semiconductor chip CHP is mounted on an insulation substrate SUB by a solder material (adhesive material) ADH, and then a paste-state high electric field-resistant sealing material MR1 is dropped from a dispenser DP, thereby forming the high electric field-resistant sealing member MR over the region extending from above a termination portion TMR to an anode electrode ADE. After that, as illustrated in FIG. 6, a wire W is connected to the anode electrode ADE formed on the surface of the semiconductor chip CHP and forms a silicone gel GL that is a sealing member so as to cover the semiconductor chip CHP. At this point, as illustrated by a region AR in FIG. 6, a shape of an outer end portion of the high electric field-resistant sealing member MR is formed in a tapered-shape having a trailing edge due to a forming method in an application technique (potting technique) after forming the semiconductor chip illustrated in FIG. 5. As a result, as illustrated in FIG. 6, it is newly found by the present inventors that a film thickness of the high electric field-resistant sealing member MR becomes small in the vicinity of the outer end portion of the high electric field-resistant sealing member MR, and consequently, the electric field cannot be sufficiently relaxed in the vicinity of the outer edge portion of the semiconductor chip CHP. In other words, the new finding by the present inventors is that: in the method of applying the paste-state high electric field-resistant sealing material MR1 to the vicinity of the outer edge portion of the semiconductor chip CHP by the potting method for the segmented semiconductor chip CHP like the related art, the film thickness in the outer end portion of the high electric field-resistant sealing member MR becomes small and the electric field cannot be sufficiently relaxed in this region. As a result, an electric field equal to or higher than the dielectric breakdown field strength is applied to the silicone gel, and reliability of the semiconductor device is degraded.

Regarding this point, the electric field can be sufficiently relaxed in the vicinity of the outer edge portion of the semiconductor chip CHP by designing, sufficiently wide, a width of the termination portion TMR formed in a lower layer of the high electric field-resistant sealing member MR. However, in this case, the size of the termination portion TMR that hardly contributes to electrical conduction is increased on the semiconductor chip CHP using expensive SiC, and as a result, a manufacturing cost of the SiC device is increased. To effectively utilize an excellent material physical property of SiC, it is necessary to devise the shape of the high electric field-resistant sealing member MR such that the electric field in the vicinity of the outer end portion of the semiconductor chip CHP can be relaxed even though the termination portion TMR is reduced.

Furthermore, according to the study of the present inventors, there is room for new improvement in the related art. In other words, in the related art, the process of forming the high electric field-resistant sealing member MR is performed after mounting the segmented semiconductor chips CHP on the insulation substrate SUB as illustrated in FIG. 5, for example. Specifically, as illustrated in FIG. 5, the high electric field-resistant sealing material MR1 is applied by the dispenser DP along a circumference of the termination portion TMR of the semiconductor chip CHP mounted on the insulation substrate SUB via the solder material ADH. In this application method, it is necessary to repeatedly apply the sealing material to all of the semiconductor chips CHP mounted on the insulation substrate SUB while a horizontal position and a height of an application nozzle are aligned for each of the semiconductor chips CHP mounted on the insulation substrate SUB, and the time is required for the manufacturing process. Furthermore, thermosetting treatment is required for the high electric field-resistant sealing member MR formed by applying the paste-state high electric field-resistant sealing material MR1, and the insulation substrate SUB is needed to be heated for some hours in this thermosetting treatment. Additionally, the semiconductor chip CHP is soldered to the insulation substrate SUB with the solder material ADH, but the solder material ADH is liquefied at the time of reflowing, thereby causing thickness variation, horizontal movement, and rotation. Due to this, slight misalignment is generated in each of the plurality of semiconductor chips CHP mounted on the insulation substrate SUB. Regarding this point, the dispenser DP has a function to optically recognize a position of each semiconductor chip CHP and correcting the same, but application accuracy of the high electric field-resistant sealing material MR1 tends to be degraded, and there is a trade-off relation in which the more the application accuracy of the high electric field-resistant sealing material MR1 is improved, the more an application time is increased.

Thus, the present inventors newly found the room for improvement existing in the related art, and a solution is provided to the room for improvement. In the following, a technical idea of the present embodiment provided with such a solution will be described.

<Structure of Semiconductor Device>

Figure 7:
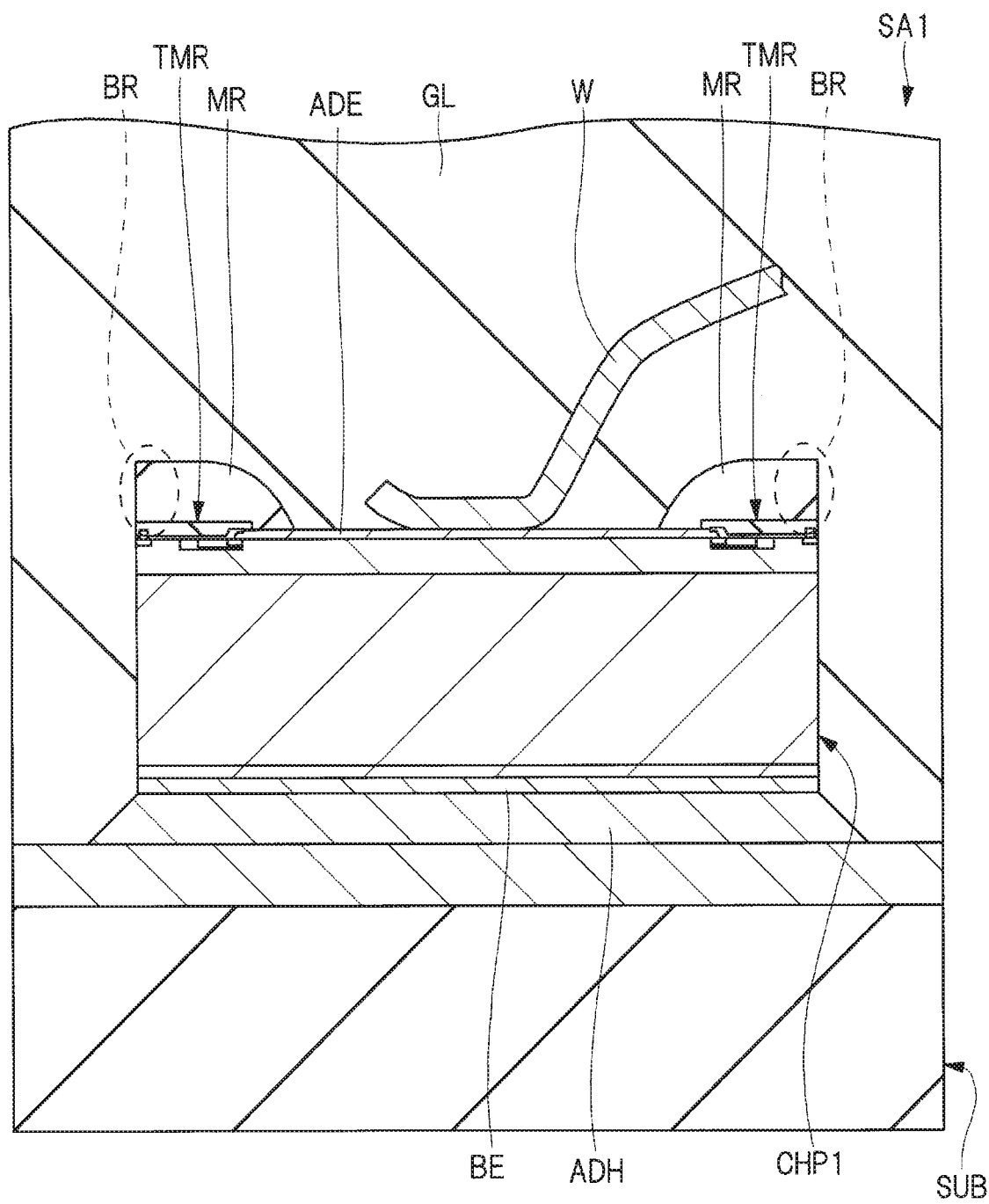
FIG. 7 is a cross-sectional view schematically illustrating a semiconductor device according to an embodiment.

FIG. 7 is a cross-sectional view schematically illustrating a semiconductor device SA1 in the present embodiment. As illustrated in FIG. 7, a semiconductor chip CHP1 is mounted on an insulation substrate SUB via a solder material ADH. A SiC device is formed on this semiconductor chip CHP1, and particularly, a diode is exemplified as the SiC device in the present embodiment.

In FIG. 7, a back-surface electrode BE functioning as a cathode electrode of the diode is formed on a back surface of the semiconductor chip CHP1. On the other hand, a front surface of the semiconductor chip CHP1 is an element formation surface. An anode electrode ADE of the diode is formed on the front surface of the semiconductor chip CHP1, and a termination portion TMR is formed in a manner surrounding the anode electrode ADE. The termination portion TMR is formed over a peripheral edge portion of the semiconductor chip CHP1 and is formed in order to relax electric field strength in the peripheral edge portion of the semiconductor chip CHP1. A diode that is a SiC device is formed on an inner side of the termination portion TMR. In other words, the semiconductor chip CHP1 in the present embodiment includes a semiconductor element forming portion in which the diode is formed on the more inner side than the peripheral edge portion where the termination portion TMR is formed. Additionally, a high electric field-resistant sealing member MR is formed so as to cover the termination portion TMR formed in the peripheral edge portion of the semiconductor chip CHP1 and also cover the vicinity of an end portion of the anode electrode ADE. Furthermore, a wire W is connected to the vicinity of a center portion of the anode electrode ADE. The semiconductor chip CHP1 having the above-described structure is sealed with a silicone gel GL serving as a sealing member. Here, dielectric breakdown field strength of the high electric field-resistant sealing member MR is larger than dielectric breakdown field strength of the silicone gel GL serving as the sealing member. Additionally, the high electric field-resistant sealing member MR is formed so as to cover only the vicinity of the peripheral edge portion of the semiconductor chip CHP1, and has a size smaller than that of the silicone gel GL formed so as to cover the semiconductor chip CHP1. In other words, the high electric field-resistant sealing member MR has volume smaller than volume of the silicone gel GL serving as the sealing member.

Here, for example, the high electric field-resistant sealing member MR directly contacts the silicone gel GL in the semiconductor device SA1 of the present embodiment as illustrated in FIG. 7. In other words, the high electric field-resistant sealing member MR is interposed between the termination portion TMR formed in the peripheral edge portion of the semiconductor chip CHP1 and the silicone gel GL. That is, an upper surface of the termination portion TMR is covered with the high electric field-resistant sealing member MR, and the termination portion TMR does not directly contact the silicone gel GL.

As described above, the semiconductor device S1 of the present embodiment includes a semiconductor material (silicon carbide, gallium nitride, diamond, or the like) having a bandgap larger than that of silicon, and also includes: the semiconductor chip CHP1 having the high electric field-resistant sealing member MR (insulation member) that covers the peripheral edge portion of the element forming surface; and the silicone gel GL serving as the sealing member that covers the semiconductor chip CHP1. Additionally, as illustrated in FIG. 7, an end face of the semiconductor chip CHP1 and the outer end face of the high electric field-resistant sealing member MR include a flush portion. For example, in the high electric field-resistant sealing member MR in the present embodiment has a shape in which a thickness at an outer end portion of the high electric field-resistant sealing member MR is larger than thicknesses of other portions of the high electric field-resistant sealing member MR. The high electric field-resistant sealing member MR is made of a material having dielectric breakdown field strength higher than that of the silicone gel GL, and can be made of any one of a polyimide resin, a polyamideimide resin, a polyetheramideimide resin, and a polyetheramide resin, for example.

<Manufacturing Method for Semiconductor Device>

The semiconductor device SA1 in the present embodiment has the above-described structure, and a manufacturing method therefor will be described below with reference to the drawings. First, a flow of the manufacturing process for the semiconductor device SA1 in the present embodiment will be described with reference to a flowchart, and then details of the manufacturing process will be described.

Figure 8:
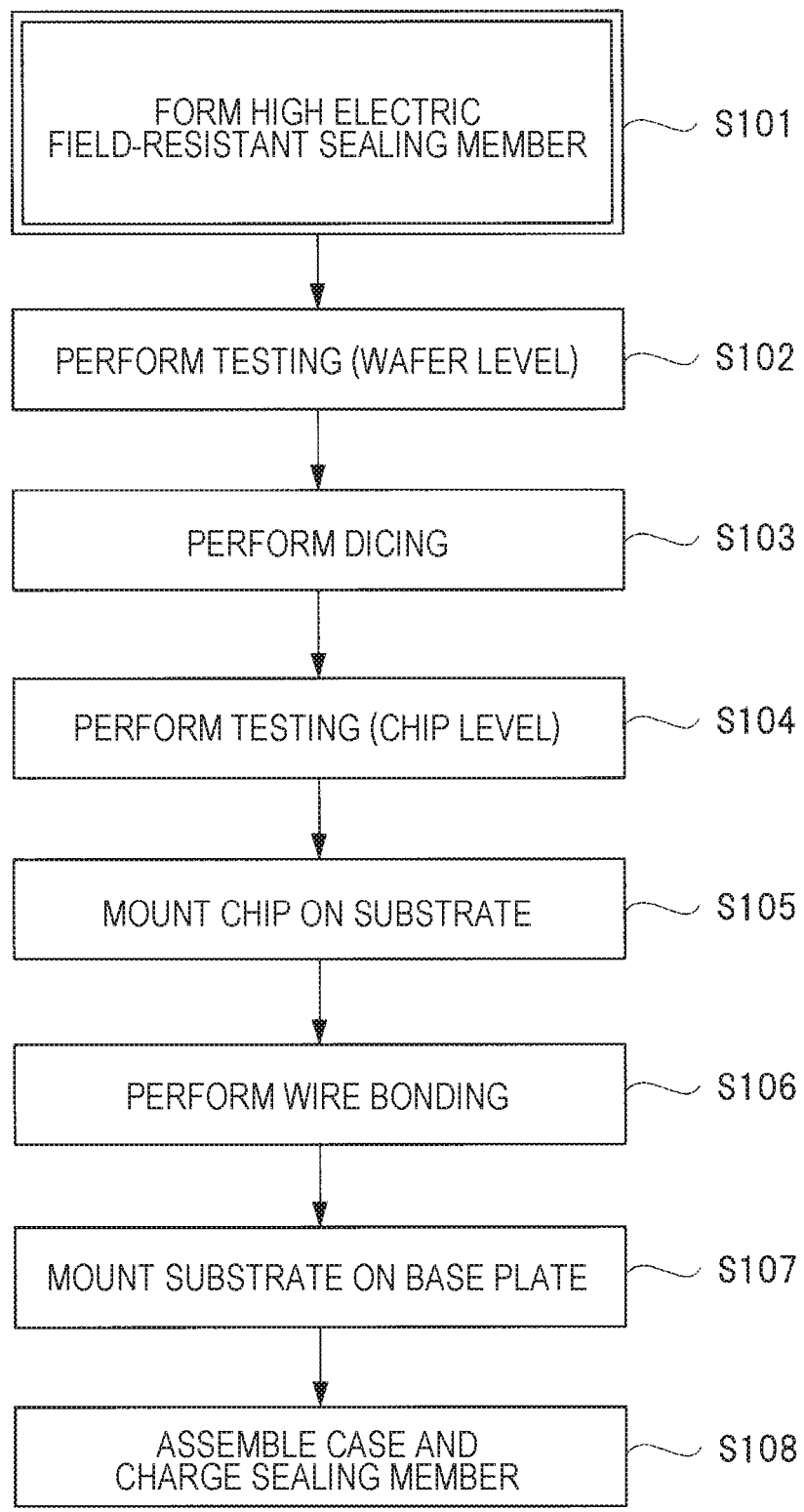
FIG. 8 is a flowchart illustrating a manufacturing process for the semiconductor device according to the embodiment.

FIG. 8 is a flowchart illustrating the flow of the manufacturing process for the semiconductor device SA1 in the present embodiment. In FIG. 8, a semiconductor wafer made of a semiconductor material (SiC) having a bandgap larger than that of silicon and having an element forming surface is prepared. This semiconductor wafer has a plurality of chip regions, and each of the chip regions existing in the semiconductor wafer has a semiconductor element forming portion and a peripheral edge portion surrounding the semiconductor element forming portion, and a diode serving as a SiC device is formed in the semiconductor element forming portion, and additionally a termination portion is formed in the peripheral edge portion.

Next, in a state of the semiconductor wafer, a high electric field-resistant sealing member is formed so as to cover the termination portion formed at the peripheral edge portion of each of the chip regions (S101). After that, testing for the SiC device formed in each of the chip regions is performed in the state of the semiconductor wafer (S102). Subsequently, a plurality of semiconductor chips is obtained by performing dicing for a plurality of chip regions existing in the semiconductor wafer (S103). Then, testing for the SiC device formed on the semiconductor chip is performed in the state of a segmented semiconductor chips (S104). Next, after the semiconductor chips are mounted on a substrate (insulation substrate) (S105), the semiconductor chip and a wire are electrically connected (wire bonding) (S106). Subsequently, after the substrate mounted with the semiconductor chips is placed on a base plate (S107), a silicone gel serving as a case assembling and sealing member is charged into a case (S108). Thus, the semiconductor device in the present embodiment can be manufactured.

Figure 9:
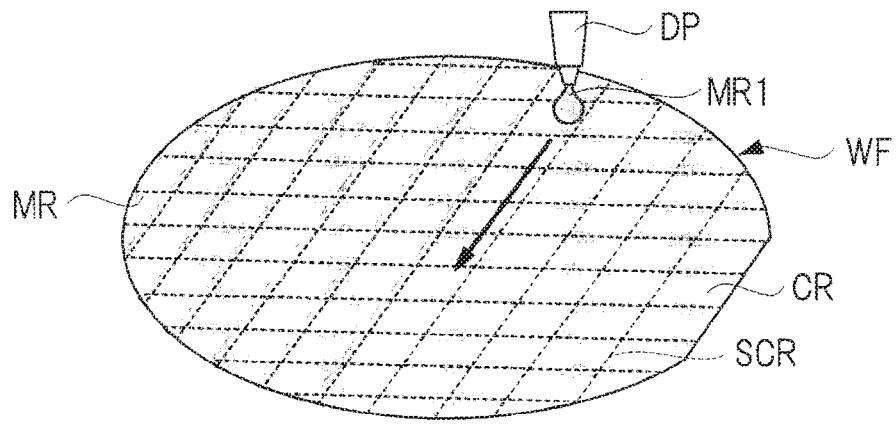
FIG. 9 is a view illustrating a state of applying a high electric field-resistant sealing member onto a semiconductor wafer.

In the following, details of the manufacturing process will be described with reference to the drawings. First, as illustrated in FIG. 9, in a state of a semiconductor wafer WF, a paste-state high electric field-resistant sealing material MR1 is applied along scribe lines SCR that partition chip regions CR. Specifically, as illustrated in FIG. 9, the paste-state high electric field-resistant sealing material MR1 is dropped from a dispenser DP along the scribe lines SCR existing in a lattice form, thereby forming the high electric field-resistant sealing member MR on the semiconductor wafer WF. At this point, for example, a resin containing polyamide imide as a main component is used as the high electric field-resistant sealing member MR. The high electric field-resistant sealing member MR has viscosity of 100 Pa·s, the high electric field-resistant sealing member MR has dielectric breakdown field strength of 210 kV/mm that is a characteristic of 10 times or more the dielectric breakdown field strength of the silicone gel.

Figure 10:
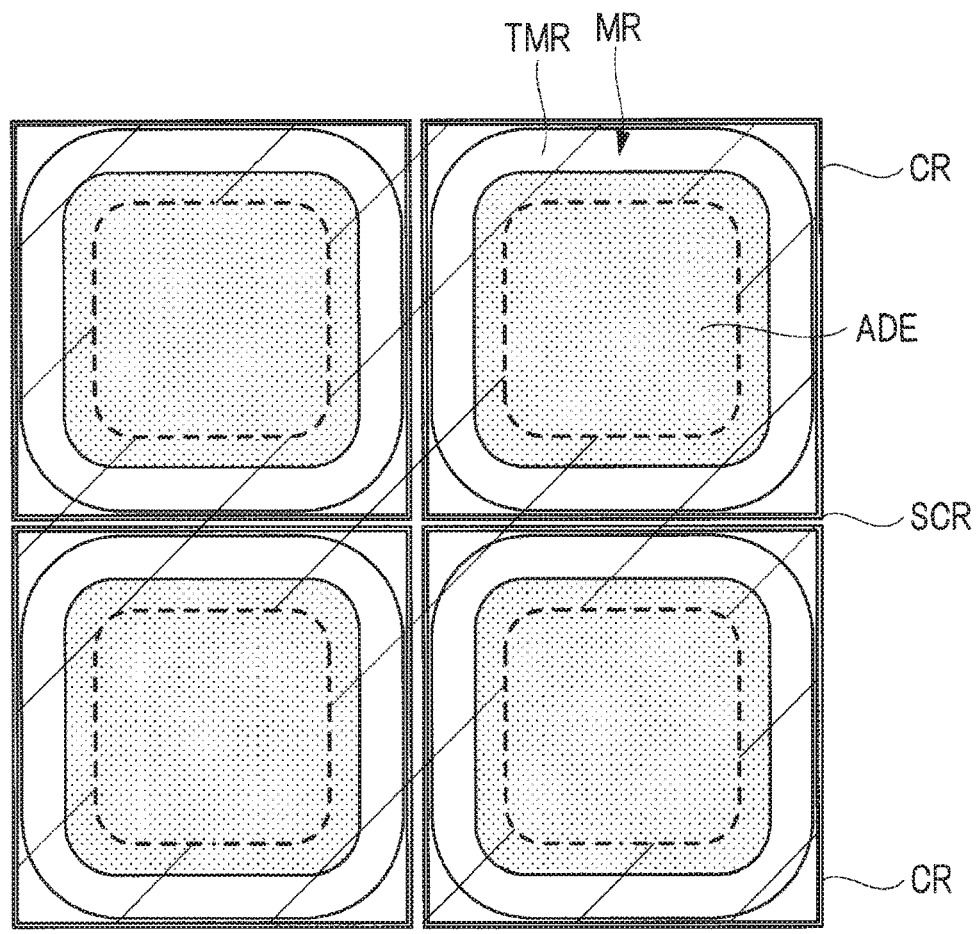
FIG. 10 is an enlarged view illustrating a part of the semiconductor wafer.

FIG. 10 is an enlarged view illustrating a part of a semiconductor wafer, in which four chip regions CR adjacent to each other are illustrated. The redundant high electric field-resistant sealing material MR1 spreads at cross points between longitudinal directions and lateral directions by applying the high electric field-resistant sealing material MR1 along the scribe lines SCR in a lattice form in FIG. 12. As a result, a corner (corner portion) of each termination portion TMR can be effectively covered with the high electric field-resistant sealing member MR.

Figure 11:
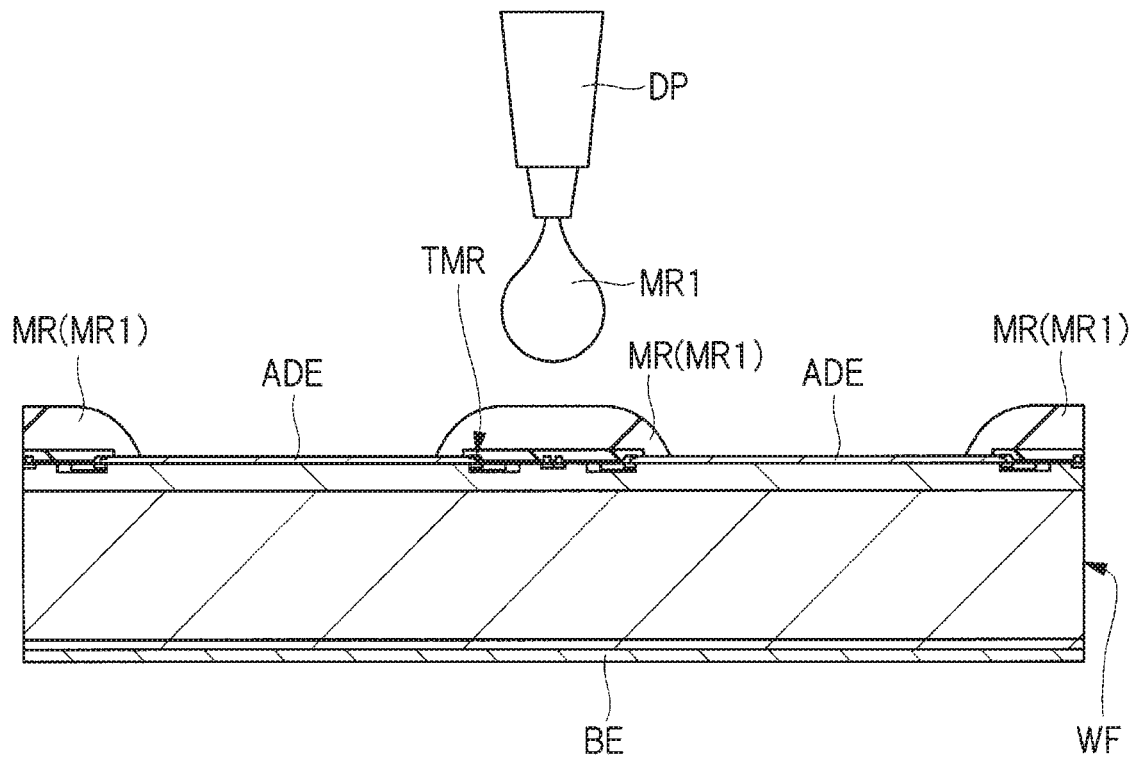
FIG. 11 is a cross-sectional view illustrating a state of dropping the high electric field-resistant sealing member from a dispenser so as to cover a termination portion formed on the semiconductor wafer.

FIG. 11 is a cross-sectional view illustrating a state of dropping the high electric field-resistant sealing material MR1 from the dispenser DP so as to cover each termination portion TMR formed on the semiconductor wafer WF. As illustrated in FIG. 11, it can be grasped that the paste-state high electric field-resistant sealing material MR1 dropped from the dispenser DP covers the termination portion TMR and also is applied so as to cover the vicinity of an end portion of an anode electrode adjacent to the termination portion TMR.

Subsequently, after applying the high electric field-resistant sealing material MR1, heat treatment is performed in order to cure the paste-state high electric field-resistant sealing member MR formed on the semiconductor wafer WF. First, heat treatment is continuously performed under a condition 1 (at 100° C. for 20 minutes) and a condition 2 (at 200° C. and one hour), and then additional high-temperature heat treatment is performed under a condition 3 (in inert atmosphere at 300° C. for one hour). With this additional high-temperature heat treatment, it is possible to suppress occurrence of degassing from the high electric field-resistant sealing member MR in the high-temperature heat treatment (maximum 355° C.) performed in the chip mounting process described later. The relation between heat treatment and degassing can be evaluated by, for example, a thermal desorption gas analyzer (TDS device). In the manufacturing process for the semiconductor device in the present embodiment, occurrence of degassing from the high electric field-resistant sealing member MR is suppressed by applying, to the high electric field-resistant sealing member MR, the heat treatment at 200° C. or more not conventionally used. Meanwhile, a maximum temperature of the heat treatment applied to the high electric field-resistant sealing member MR is at least lower than a maximum temperature in the chip mounting process or lower than a temperature at which thermal decomposition of the high electric field-resistant sealing member MR is started, specifically, 400° C. or less.

Next, after the paste-state high electric field-resistant sealing member MR is cured by the heat treatment, an electric characteristic test in the state of the semiconductor wafer WF is performed. Here, according to the present embodiment, since each termination portion TMR having large electric field strength is covered with the high electric field-resistant sealing member MR, electric discharge into the atmosphere is suppressed, and as a result, high voltage application test can be easily performed.

Figure 12:
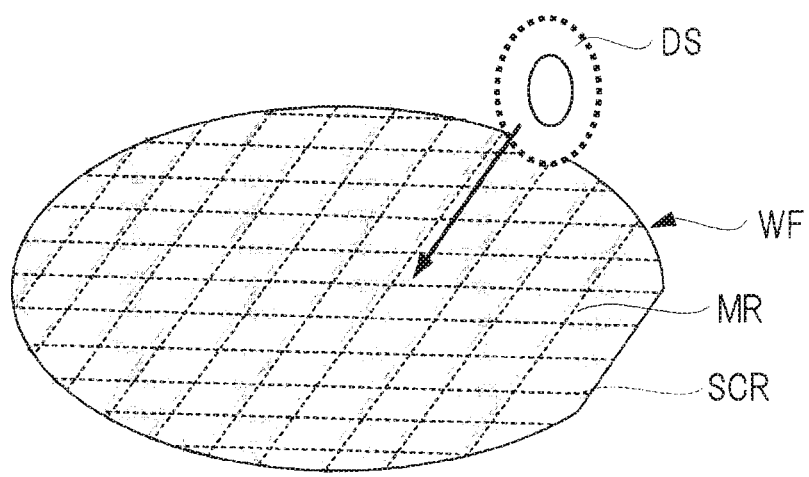
FIG. 12 is a view illustrating a process of cutting the semiconductor wafer along scribe lines of the semiconductor wafer.
Figure 13:
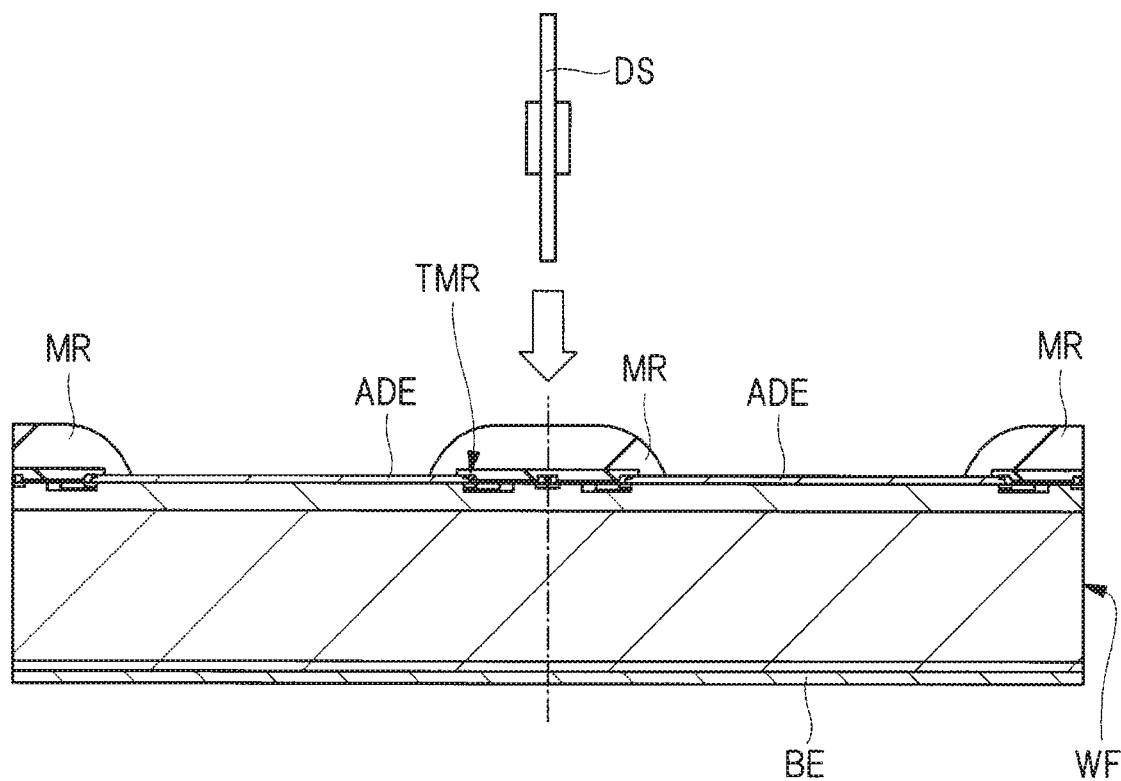
FIG. 13 is a cross-sectional view illustrating a process of cutting the semiconductor wafer.
Figure 14:
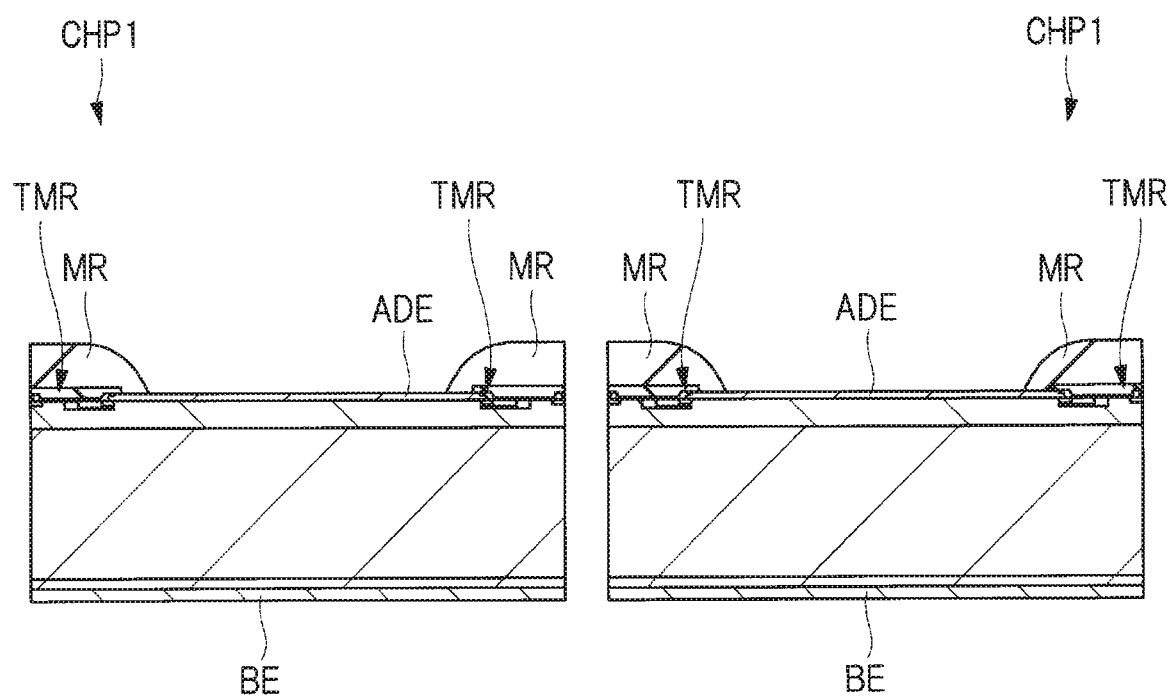
FIG. 14 is a cross-sectional view illustrating a state after cutting the semiconductor wafer.

After that, as illustrated in FIG. 12, the semiconductor wafer WF is cut by a rotating dicing blade DS along scribe lines SCR of the semiconductor wafer WF in which curing of the high electric field-resistant sealing member MR is completed (dicing). FIG. 13 is a cross-sectional view illustrating a state of dicing the semiconductor wafer WF. As illustrated in FIG. 13, dicing is performed along a dotted line that passes through the high electric field-resistant sealing member MR and the termination portion TMR. Consequently, as illustrated in FIG. 14, the high electric field-resistant sealing member MR and the termination portion TMR are cut and the semiconductor wafer WF is segmented into a plurality of semiconductor chips CHP1.

Subsequently, the electrical characteristic test is performed in the state of a semiconductor chip CHP1, and a good semiconductor chip CHP1 is selected. After that, the semiconductor chip CHP1 is mounted on a substrate (insulation substrate) (chip mounting process). At this point, since a solder material having a high melting point is used to bond the semiconductor chip CHP1 to the substrate, the chip mounting process includes heat treatment in a reducing atmosphere at the maximum temperature of 355° C. Then, a wire bonding process is performed to bond a wire to an electrode (anode electrode) of the semiconductor chip CHP1 that has been bonded to the substrate. Next, after the process to bond the substrate mounted with the semiconductor chip CHP1 to the base plate to be a bottom surface of a semiconductor module connected to a heat sink, a case assembling process and a silicone gel sealing process are performed. As described above, the semiconductor device in the present embodiment can be manufactured.

Characteristics (Preconditions) in Embodiment

Figure 15:
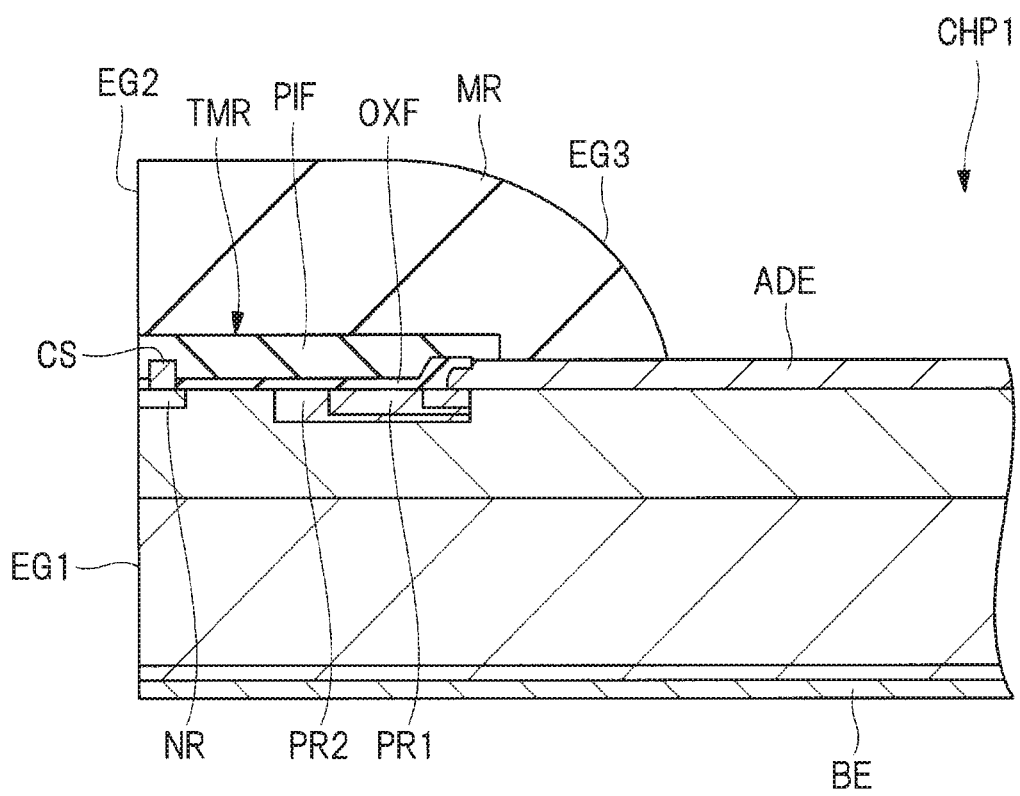
FIG. 15 is an enlarged cross-sectional view of the vicinity of an end portion of a semiconductor chip according to the embodiment.

FIG. 15 is an enlarged cross-sectional view illustrating the vicinity of the end portion of the semiconductor chip CHP1 in the present embodiment. As illustrated in FIG. 15, in the semiconductor chip CHP1 of the present embodiment, a back-surface electrode BE functioning as a cathode electrode of a diode is formed on a back surface of the semiconductor chip CHP1. On the other hand, an anode electrode ADE of the diode and a termination portion TMR formed in an outer region of the anode electrode ADE are formed on a front surface of the semiconductor chip CHP1. A termination portion TMR includes: a p-type semiconductor region PR1 formed inside the semiconductor chip CHP1; and a p-type semiconductor region PR2 that includes the p-type semiconductor region PR1 and has an impurity concentration lower than that of the p-type semiconductor region PR1. Additionally, the termination portion TMR includes: an n-type semiconductor region NR formed apart from the p-type semiconductor region PR2 on an end face side of the semiconductor chip CHP1; and a channel stop layer CS formed on the n-type semiconductor region NR. Furthermore, the termination portion TMR includes: a silicon oxide film OXF extending from the p-type semiconductor region PR1 and the p-type semiconductor region PR2 in a manner reaching the channel stop layer CS; and a polyimide resin film PIF that covers the silicon oxide film OXF and the channel stop layer CS projecting from the silicon oxide film OXF. This polyimide resin film PIF functions as a protective film, and has a film thickness of, for example, 4 μm to 9 μm.

According to the termination portion TMR having the above-described structure, since the p-type semiconductor region PR1 having the high impurity concentration is included in the p-type semiconductor region PR2 having the low impurity concentration, an electric field in the termination portion TMR can be relaxed. Furthermore, as illustrated in FIG. 15, the high electric field-resistant sealing member MR is formed so as to cover the termination portion TMR. Although not illustrated in FIG. 15, for example, a silicone gel GL is formed so as to cover the semiconductor chip CHP1 on which the high electric field-resistant sealing member MR is formed as illustrated in FIG. 7. An electric field from the semiconductor chip CHP1 is applied to the silicone gel GL, and the high electric field-resistant sealing member MR formed on the termination portion TMR is required to have a film thickness of, for example, at least 50 μm or more, preferably, 80 μm or more in order that electric field strength of the electric field applied to the silicone gel GL may not exceed dielectric breakdown field strength (14 kV/mm) of the silicone gel GL. On the other hand, when the film thickness of the high electric field-resistant sealing member MR is excessively large, there is an apparent problem of cracking or the like due to stress increase, and therefore, the thickness is required to be 500 μm or less.

Note that the semiconductor chip CHP1 in the present embodiment is provided for a high withstand voltage product having withstand voltage of 3.3 kV, for example. However, the semiconductor chip CHP1 in the present embodiment can also be applied to a medium withstand voltage product having withstand voltage of 1.7 kV or 1.2 kV. In this case, a lower limit value of the film thickness of the high electric field-resistant sealing member MR can be reduced although it depends on a design of the termination portion TMR, and for example, the film thickness of the high electric field-resistant sealing member MR can be made to 20 μm or more.

Additionally, a polyimide film PIF has a relative dielectric constant of about 2.9, and a polyether amide resin that is a main component constituting the high electric field-resistant sealing member MR has a relative dielectric constant of about 3.2, and any one of these has the relative dielectric constant smaller than a relative dielectric constant (3.8 to 4.1) of the underlying silicon oxide film OXF. On the other hand, the silicone gel GL has a relative dielectric constant of about 2.7, and the relative dielectric constant of the polyimide film PIF and the relative dielectric constant of the high electric field-resistant sealing member MR are larger than the relative dielectric constant of the silicone gel GL. From this fact, a following relation is satisfied: relative dielectric constant of the silicon oxide film OXF>relative dielectric constant of the polyimide film PIF, relative dielectric constant of the high electric field-resistant sealing member MR>relative dielectric constant of the silicone gel GL. At this point, influence from accumulation of electric charge caused by a difference between the relative dielectric constants can be reduced by reducing the difference between the relative dielectric constants, and consequently, reliability of the semiconductor device can be improved.

Here, a first characteristic point in the present embodiment is that: an end face EG1 of the semiconductor chip CHP1 and an outer end portion EG2 of the high electric field-resistant sealing member MR are formed so as to have a flush portion as illustrated in FIG. 15, for example. With this characteristic, according to the present embodiment, the film thickness of the high electric field-resistant sealing member MR can be increased on the end face EG1 of the semiconductor chip CHP1. From this fact, according to the present embodiment, dielectric breakdown can be suppressed in the vicinity of the end face EG1 of the semiconductor chip CHP1 having the high electric field strength.

For example, in the related art, since the outer end portion of the high electric field-resistant sealing member MR is formed with a trailing edge as illustrated in the region AR in FIG. 6, the end face of the semiconductor chip CHP and the outer end portion of the high electric field-resistant sealing member MR are formed not to include a flush portion. As a result, in the related art illustrated in FIG. 6, the high electric field-resistant sealing member MR is hardly formed in the vicinity of the end face of the semiconductor chip CHP having the high electric field strength. This means that the silicone gel GL directly contacts the vicinity of the end face of the semiconductor chip CHP having the high electric field strength. That is, in the related art, since the silicone gel GL that is more likely to undergo dielectric breakdown than the high electric field-resistant sealing member MR is directly contacts the vicinity of the end face of the semiconductor chip CHP having the high electric field strength, dielectric breakdown of the silicone gel GL is easily caused in the vicinity of the end face of the semiconductor chip CHP. In other words, in the related art, the electric field strength cannot be relaxed by the high electric field-resistant sealing member MR in the vicinity of the end face of the semiconductor chip CHP having the high electric field strength, and therefore, the electric field strength applied to the silicone gel GL in the vicinity of the end face of the semiconductor chip CHP exceeds dielectric breakdown field strength of the silicone gel GL, and there is a higher risk of causing dielectric breakdown of the silicone gel GL. Therefore, in the related art, dielectric breakdown of the silicone gel GL is easily caused due to the fact that the high electric field-resistant sealing member MR is hardly formed in the vicinity of the end face of the semiconductor chip CHP having the high electric field strength, and consequently, reliability of the semiconductor device is degraded.

Regarding this point, in the related art, it is conceivable to increase a width of the termination portion TMR formed in the peripheral edge portion of the semiconductor chip CHP in order to avoid increase in the electric field strength in the vicinity of the end face of the semiconductor chip CHP, but in this case, the size of the termination portion TMR not functioning as the element forming portion is increased. This means that the size of the semiconductor chip CHP in increased, thereby causing increase in a manufacturing cost for the semiconductor device. In other words, due to the fact that SiC has the high dielectric breakdown field strength, it may be possible to provide a design in which electric field strength inside the semiconductor chip CHP is enhanced in the semiconductor chip CHP formed with the SiC device. However, in the related art, the design to enhance the electric field strength inside the semiconductor chip CHP cannot be sufficiently achieved due to the fact that the high electric field-resistant sealing member MR is hardly formed in the vicinity of the end face of the semiconductor chip CHP having the high electric field strength. That is, in the related art, it is difficult to achieve a design in which the excellent material property of SiC is sufficiently utilized.

In contrast, according to the present embodiment, for example, the end face of the semiconductor chip CHP1 and the outer end portion of the high electric field-resistant sealing member MR are formed so as to include the flush portion as illustrated in a region BR in FIG. 7. With this structure, according to the present embodiment, the film thickness of the high electric field-resistant sealing member MR can be increased on the vicinity of the end face of the semiconductor chip CHP1. This means that: according to the present embodiment, the high electric field-resistant sealing member MR having the large film thickness can be formed on the vicinity of the end face of the semiconductor chip CHP1. Therefore, according to the present embodiment, since the high electric field-resistant sealing member MR having the large film thickness is formed in the vicinity of the end face of the semiconductor chip CHP1 having the high electric field strength, the electric field strength can be sufficiently relaxed. As a result, according to the present embodiment, the electric field strength applied to the silicone gel GL formed on the high electric field-resistant sealing member MR having the large film thickness can be prevented from exceeding the dielectric breakdown field strength of the silicone gel GL, and consequently, dielectric breakdown of the silicone gel GL can be effectively suppressed. That is, according to the present embodiment, since the high electric field-resistant sealing member MR having the large film thickness can be interposed between the semiconductor chip CHP1 and the silicone gel GL in the vicinity of the end portion of the semiconductor chip CHP1, dielectric breakdown of the silicone gel GL can be effectively suppressed. Therefore, according to the first characteristic point in the present embodiment, it is possible to suppress degradation of reliability of the semiconductor device caused by dielectric breakdown of the silicone gel GL. In other words, according to the first characteristic point in the present embodiment, reliability of the semiconductor device can be improved by forming the high electric field-resistant sealing member MR having the large film thickness in the vicinity of the end face of the semiconductor chip CHP1 having the high electric field strength. In other words, according to the first characteristic point in the present embodiment, since the high electric field-resistant sealing member MR having the large film thickness can be formed in the vicinity of the end face of the semiconductor chip CHP1 having the high electric field strength, it is sufficiently possible to achieve the design in which the electric field strength inside the semiconductor chip CHP1 is enhanced. That is, according to the present embodiment, it is sufficiently possible to achieve the design in which the excellent material property of SiC is utilized. Specifically, it is also possible to achieve a design in which the width of the termination portion TMR is reduced so as to have a high electric field up to the vicinity of the end portion of the semiconductor chip CHP1. This means that the semiconductor chip CHP1 can be downsized by reducing an occupied area of the termination portion TMR that does not function as an element forming portion in the semiconductor chip CHP1 of the present embodiment, and consequently, the manufacturing cost can be reduced.

From the above, dielectric breakdown of the silicone gel GL can be effectively suppressed as a direct effect of the first characteristic point in the present embodiment in which the film thickness of the high electric field-resistant sealing member MR can be formed large on the vicinity of the end face of the semiconductor chip CHP1, and as a result, reliability of the semiconductor device can be improved. Furthermore, it is possible to achieve the design in which the high electric field is made high up to the vicinity of the end portion of the semiconductor chip CHP1 as an indirect effect of the first characteristic point in the present embodiment, and as a result, the size of the termination portion TMR that does not function as the element formation portion can be reduced. From this fact, the size of the semiconductor chip CHP1 can be reduced as the indirect effect of the first characteristic point in the present embodiment, and consequently, the manufacturing cost for the semiconductor device can be reduced.

Meanwhile, the first characteristic point in the present embodiment is that, for example, the end face EG1 of the semiconductor chip CHP1 and the outer end portion EG2 of the high electric field-resistant sealing member MR are at least formed to include flush portions as illustrated in FIG. 15. For example, a portion that is not flush may exist in a part of the outer end portion EG2 of the high electric field-resistant sealing member MR, such as a shape (oblique shape) of a portion surrounded by a region CR illustrated in FIG. 16 or a shape (protruding shape) of a portion surrounded by a region DR illustrated in FIG. 17. That is, the first characteristic point in the present embodiment is that the end face EG1 of the semiconductor chip CHP1 and the outer end portion EG2 of the high electric field-resistant sealing member MR at least include a portion partly flush. In a case of achieving the above-described structure, the high electric field-resistant sealing member MR having the large film thickness is formed in the vicinity of the end face of the semiconductor chip CHP1 having the high electric field strength, and it is possible to sufficiently obtain an electric field relaxation effect by the high electric field-resistant sealing member MR in the vicinity of the end face of the semiconductor chip CHP1.

Next, a second characteristic point in the present embodiment is that, for example, the outer end portion EG2 of the high electric field-resistant sealing member MR is formed to have a thickness larger than thicknesses of other portions of the high electric field-resistant sealing member MR as illustrated in FIG. 15. The second characteristic point in the present embodiment is embodied as a structure in which the film thickness of an inner end portion EG3 of the high electric field-resistant sealing member MR becomes gradually smaller as illustrated in FIG. 15, for example. In other words, it can be said that the second characteristic point in the present embodiment is that a shape of the inner end portion EG3 of the high electric field-resistant sealing member MR is a gentle tapered shape. With this structure, according to the present embodiment, a contact area between the semiconductor chip CHP1 and the high electric field-resistant sealing member MR can be increased. This means that adhesion strength between the semiconductor chip CHP1 and the high electric field-resistant sealing member MR can be improved, and consequently, reliability of the semiconductor device can be improved. Furthermore, according to the second characteristic point in the present embodiment, not only the termination portion TMR but also a peripheral region adjacent to the termination portion TMR can be covered with the high electric field-resistant sealing member MR. With this structure, according to the second characteristic point in the present embodiment, electric field strength can be relaxed by the high electric field-resistant sealing member MR not only in the termination portion TMR but also in the peripheral region adjacent to the termination portion TMR, and reliability of the semiconductor device can be also improved from this point. That is, according to the second characteristic point in the present embodiment, adhesion strength between the high electric field-resistant sealing member MR and the semiconductor chip CHP1 can be improved and an electric field relaxation region can be increased due to the fact that the region of the semiconductor chip CHP1 covered with the high electric field-resistant sealing member MR is increased.

Furthermore, for example, since the anode electrode ADE becomes an equipotential surface in FIG. 15, an electric field from the termination portion TMR spreads around a boundary region between the termination portion TMR and the anode electrode ADE. On the other hand, as illustrated in FIG. 15, in the case where the shape of the inner end portion EG3 of the high electric field-resistant sealing member MR is formed in the gentle tapered shape, the high electric field-resistant sealing member MR is formed so as to cover a range at a fixed distance around the boundary region between the termination portion TMR and the anode electrode ADE. This means that the high electric field-resistant sealing member MR is formed so as to conform to the electric field spreading around the boundary region between the termination portion TMR and the anode electrode ADE, and the electric field relaxation effect by the high electric field-resistant sealing member MR can be achieved with no waste. As a result, according to the second characteristic point in the present embodiment, the region where the electric field strength is high can be covered with the high electric field-resistant sealing member MR. From this fact, according to the present embodiment, electric field strength applied to the silicone gel GL can be prevented from exceeding the dielectric breakdown field strength of the silicone gel GL not only in the outer end portion EG2 of the high electric field-resistant sealing member MR but also in the inner end portion EG3 of the high electric field-resistant sealing member MR, and consequently, dielectric breakdown of the silicone gel GL can be effectively suppressed. Thus, according to the present embodiment, the electric field strength in the outer end portion EG2 of the high electric field-resistant sealing member MR can be relaxed by the first characteristic point, and also the electric field strength in the inner end portion EG3 of the high electric field-resistant sealing member MR can be relaxed by the second characteristic point.

Additionally, according to the second characteristic point in the present embodiment, advantages in the manufacturing method can also be obtained. In other words, even in a case where the bonded portion between the anode electrode ADE of the semiconductor chip CHP1 and the wire W is moved close to the boundary region between the anode electrode ADE and the termination portion TMR due to positional displacement at the time of wire bonding as illustrated in FIG. 7, for example, interference with a rising portion of a heel of a bonded portion hardly occurs when the inner end portion EG3 of the high electric field-resistant sealing member MR is formed in the tapered shape. Consequently, damage to the high electric field-resistant sealing member MR caused by the interference can be suppressed.

Additionally, the tapered shape of the inner end portion of the high electric field-resistant sealing member MR is automatically determined on the basis of applying conditions to apply the paste-state high electric field-resistant sealing material MR1, and it is not necessary to perform a patterning process to form the inner end portion of the high electric field-resistant sealing member MR into the tapered shape. Particularly, accurate patterning is difficult because the semiconductor chip CHP1 mounted on the insulation substrate SUB is misaligned both in an in-plane direction and in a height direction. Regarding this point, in the present embodiment, there is no need to perform the patterning process to form the inner end portion of the high electric field-resistant sealing member MR into the tapered shape, and an advantage of this point is significant. Furthermore, since the film thickness of the high electric field-resistant sealing member MR is typically large such as about 80 μm, the above-described advantage of not requiring the patterning process to form the inner end portion of the high electric field-resistant sealing member MR into the tapered shape is quite significant in the present embodiment, considering that it is difficult to perform a general photolithography process applied to a film of at most about 10 μm.

Meanwhile, the applying conditions to apply the paste-state high electric field-resistant sealing material MR1 can be adjusted within a range in which a desired application film thickness and an application line width can be achieved while setting, as parameters, a nozzle diameter of the dispenser, a discharge pressure, a gap length (distance between the nozzle and an application target), an application speed (in-plane movement speed of the nozzle), a viscosity and a temperature of the high electric field-resistant sealing member MR provided as the application material.

Subsequently, a third characteristic point in the present embodiment is that the high electric field-resistant sealing member MR is not formed for each of the segmented conductor chips CHP1 but the high electric field-resistant sealing member MR is collectively formed in the state of the semiconductor wafer before segmentation into the semiconductor chips CHP1. Specifically, as illustrated in FIG. 9, after applying the paste-state high electric field-resistant sealing material MR1 along the scribe lines SCR of the semiconductor wafer WF, the semiconductor wafer WF is diced along the scribe lines SCR as illustrated in FIG. 12. Consequently, the semiconductor chip CHP having the cross-sectional shape as illustrated in FIG. 15 can be obtained. In other words, according to the third characteristic point in the present embodiment, the semiconductor chip CHP1 having the above-described first characteristic point can be obtained. Thus, according to the present embodiment, the outer end portion EG2 of the high electric field-resistant sealing member MR has a substantially vertical shape as illustrated in FIG. 15, and a state of having a maximum film thickness can be secured at the outer end portion EG2 of the high electric field-resistant sealing member MR. This is important in designing the termination portion TMR. That is, the electric field strength is made high up to the vicinity of the end face EG1 of the semiconductor chip CHP in the termination portion TMR having a small width whereby area efficiency can be improved. Due to this, when the film thickness in the outer end portion of the high electric field-resistant sealing member MR is small like the related art illustrated in FIG. 6, for example, the electric field strength cannot be sufficiently relaxed and the electric field strength of the electric field applied to the silicone gel GL covering the high electric field-resistant sealing member MR exceeds the dielectric breakdown field strength. Therefore, the film thickness in the outer end portion of the high electric field-resistant sealing member MR is required to be large in order to achieve the narrow-width termination portion TMR whereby an excellent physical property of a wide bandgap semiconductor material represented by SiC.

Regarding this point, according to the third characteristic point in the present embodiment, it is possible to achieve the first characteristic point of the present invention in which the film thickness of the high electric field-resistant sealing member MR can be made large on the vicinity of the end face of the semiconductor chip CHP1. From this fact, according to the third characteristic point of the present embodiment, reliability of the semiconductor device can be improved as a result of the fact that the shape of the high electric field-resistant sealing member MR which can effectively suppress dielectric breakdown of the silicone gel GL can be achieved. Furthermore, as a result of achieving the design in which the electric field is high up to the vicinity of the end portion of the semiconductor chip CHP1 by adopting the manufacturing method for the semiconductor device having the third characteristic point in the present embodiment, the size of the termination portion TMR not functioning as the element forming portion can be reduced. Therefore, according to the third characteristic point in the present embodiment, the size of the semiconductor chip CHP1 can be reduced, and consequently, the manufacturing cost for the semiconductor device can be reduced.

Here, as for the shape of the high electric field-resistant sealing member MR, since at least a part of the outer end portion EG2 of the high electric field-resistant sealing member MR has an end portion shape that is vertical or nearly vertical, the vicinity of the end face of the semiconductor chip CHP1 can be sealed in a manner conforming to the structure of the semiconductor chip CHP1 having the high electric field. From this viewpoint, effects similar to those in the structure in FIG. 15 can be obtained even in a case where a part of the outer end portion of the high electric field-resistant sealing member MR has a sloped shape as illustrated in FIG. 16 or in a case where a part of the outer end portion thereof has a protruding shape as illustrated in FIG. 17.

Figure 16:
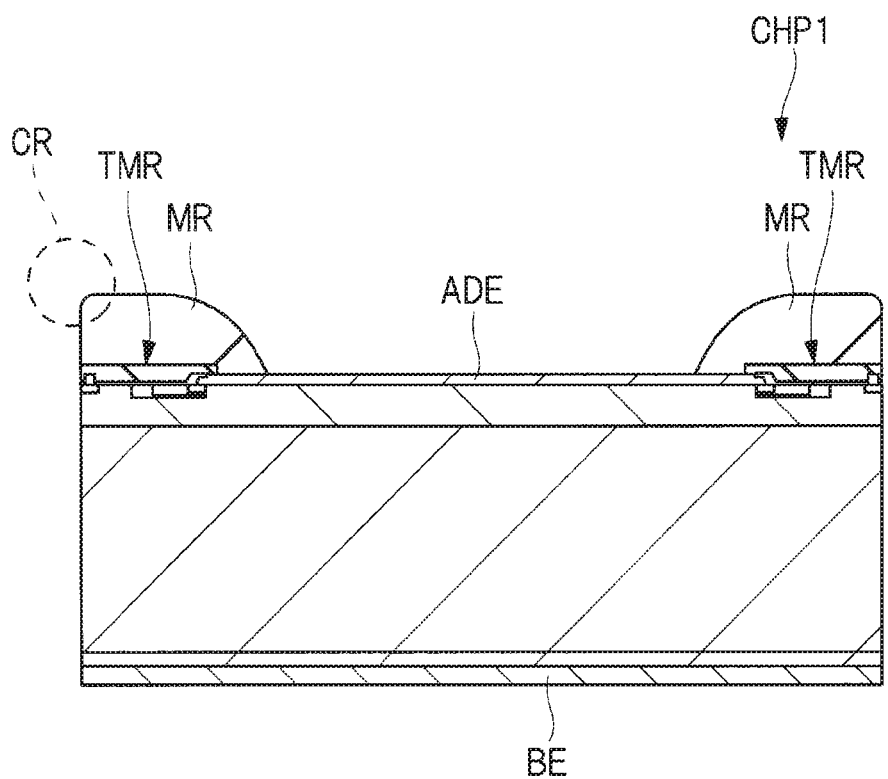
FIG. 16 is a view illustrating a shape in which a part of an outer end portion of the high electric field-resistant sealing member is formed in a sloped shape.
Figure 17:
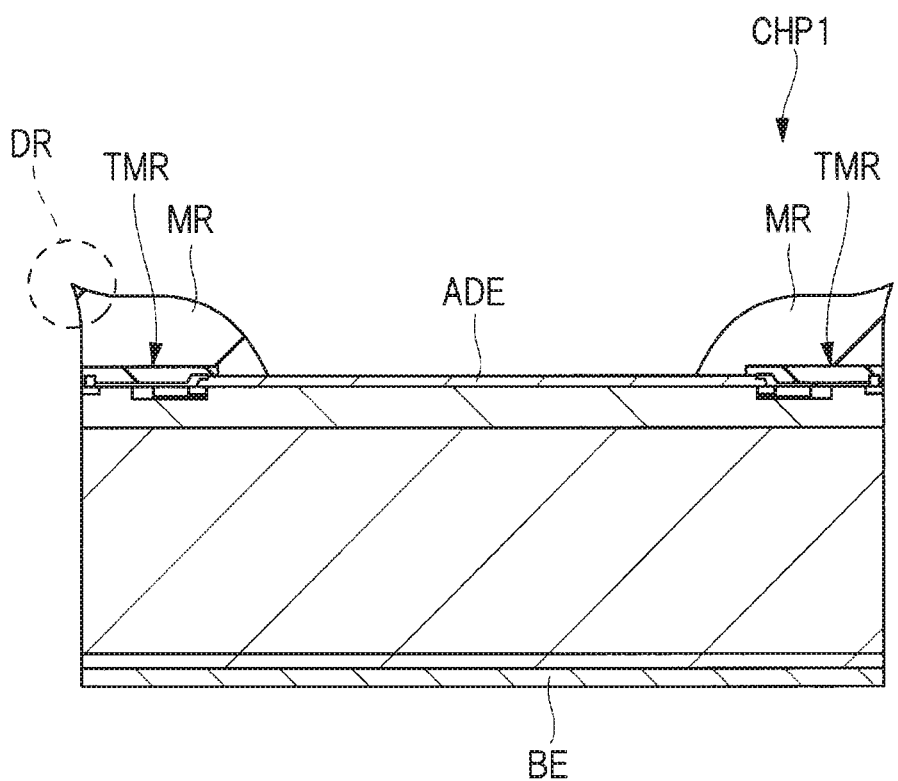
FIG. 17 is a view illustrating a shape in which a part of the outer end portion of the high electric field-resistant sealing member is formed in a protruding shape.

The shape illustrated in FIG. 16 or FIG. 17 is mainly determined by a relation between strength of thermal curing condition of the high electric field-resistant sealing member MR and dicing conditions (blade rotation speed and movement speed), but the shape can be optimized considering another element such as an adhesion property between the high electric field sealing member MR and the semiconductor chip CHP1 after dicing.

According to the third characteristic point in the present embodiment, following advantages can be obtained. In other words, like the related art illustrated in FIG. 5, in the method of applying the high electric field-resistant sealing material MR1 for each of the semiconductor chips CHP mounted on the insulation substrate SUB, inclination of the semiconductor chip CHP or misalignment is an in-plane position, rotation, or the like is caused due to unevenness of the solder material ADH that bonds the semiconductor chip CHP to the insulation substrate SUB. From this fact, highly accurate positional correction technique is required for the dispenser DP used to apply the high electric field-resistant sealing material MR1. For example, since an application amount of the high electric field-resistant sealing material MR1 is sensitive to a distance between the nozzle and a target, it is necessary to have not only a function to correct an in-plane position of the nozzle by using an image recognition technique but also functions to detect a distance to the semiconductor chip CHP with a sensor and correct inclination of the semiconductor chip CHP. In contrast, according to the third characteristic point in the present embodiment, it is only to perform once alignment for an entire semiconductor wafer at the beginning, and latter suitably correct the in-plane position of the nozzle by using the image recognition technique, and a highly accurate application technique can be achieved without requiring a height adjustment function with a sensor. Thus, according to the third characteristic point in the present embodiment, a cost for an application device can be reduced and also an image recognition time in the application processing of the high electric field-resistant sealing material MR1 and a time to move the nozzle for each of the semiconductor chips can be cut down, and therefore, an effect of shortening the manufacturing time can be obtained.

Furthermore, according to the third characteristic point of the present embodiment, the high electric field-resistant sealing member MR is not formed for each of the segmented conductor chips CHP1, but the high electric field-resistant sealing member MR can be collectively formed in the state of the semiconductor wafer before segmentation into the semiconductor chips CHP1, and therefore, a turnaround time (TAT) in the manufacturing process can be cut down. At the same time, since the high electric field-resistant sealing material MR1 is applied in the state of the semiconductor wafer in which the respective chip regions are provided at equal intervals and inclined uniform, accuracy in the forming process and the inspection process for the high electric field-resistant sealing member MR can be improved. Consequently, according to the present embodiment, a disposal cost due to formation failure of the high electric field-resistant sealing member MR can be reduced, the inspection process can be simplified, and a device cost such as the dispenser can be reduced.

Particularly, describing supplementary about the inspection process, for example, a withstand voltage test on the semiconductor wafer is simplified by forming the high electric field-resistant sealing member MR in the state of the semiconductor wafer. For example, in the method of forming the high electric field-resistant sealing member MR for each of the semiconductor chips mounted on the insulation substrate like the related art, the high electric field-resistant sealing member MR has not formed yet on the semiconductor wafer in a stage of the semiconductor wafer. From this fact, in the related art, a withstand voltage test is performed on the semiconductor wafer in a state where the high electric field-resistant sealing member MR has not been formed yet. In this case, when high voltage is applied to the semiconductor wafer, the voltage exceeds the withstand voltage in the air and electric discharge to the air occurs. Therefore, it is necessary to provide a special ancillary facility to prevent such electric discharge to the air by adopting Fluorinert dropping or by locally increasing atmospheric pressure. In contrast, according to the present embodiment, since the high electric field-resistant sealing member MR is formed in the state of the semiconductor wafer, the above-described ancillary facility is unnecessary, and it is possible to obtain advantages of simplifying and accelerating the inspection process.

On the other hand, in the manufacturing method for a semiconductor device according to the present embodiment in which the high electric field-resistant sealing member MR is formed in the state of the semiconductor wafer, high-temperature heat treatment performed in the chip mounting process to mount the semiconductor chip on the insulation substrate is also applied to the high electric field-resistant sealing member MR. Therefore, in the manufacturing method for a semiconductor device according to the present embodiment, a problem of degassing from the high electric field-resistant sealing member MR caused by applying the high-temperature heat treatment to the high electric field-resistant sealing member MR may become apparent. Regarding this point, in the present embodiment, the degassing process from the high electric field-resistant sealing member MR can be performed in a stage before the chip mounting process by performing, for example, additional heat treatment at a higher temperature (about 200° C. to 360° C.) in addition to normal heat treatment performed for thermal curing after the forming process of the high electric field-resistant sealing member MR. Consequently, according to the present embodiment, even in a case where there is the process of forming the high electric field-resistant sealing member MR in a process before the chip mounting process, it is possible to suppress occurrence of degassing from the high electric field-resistant sealing member MR caused by the high-temperature heat treatment in the chip mounting process. As a result, according to the present embodiment, reliability of the semiconductor device can be improved.

<Study on Further Improvement>

As described above, in the manufacturing method for a semiconductor device according to the present embodiment, the high electric field-resistant sealing member MR is not formed for each of the segmented conductor chips CHP1 but the high electric field-resistant sealing member MR is collectively formed in the state of the semiconductor wafer before segmentation into the semiconductor chips CHP1. Regarding this manufacturing method for a semiconductor device, the present inventor found room for improvement described below as a result of study on further improvement from the viewpoint of improving reliability of the semiconductor device, and therefore, such room for improvement will be described.

Figure 18:
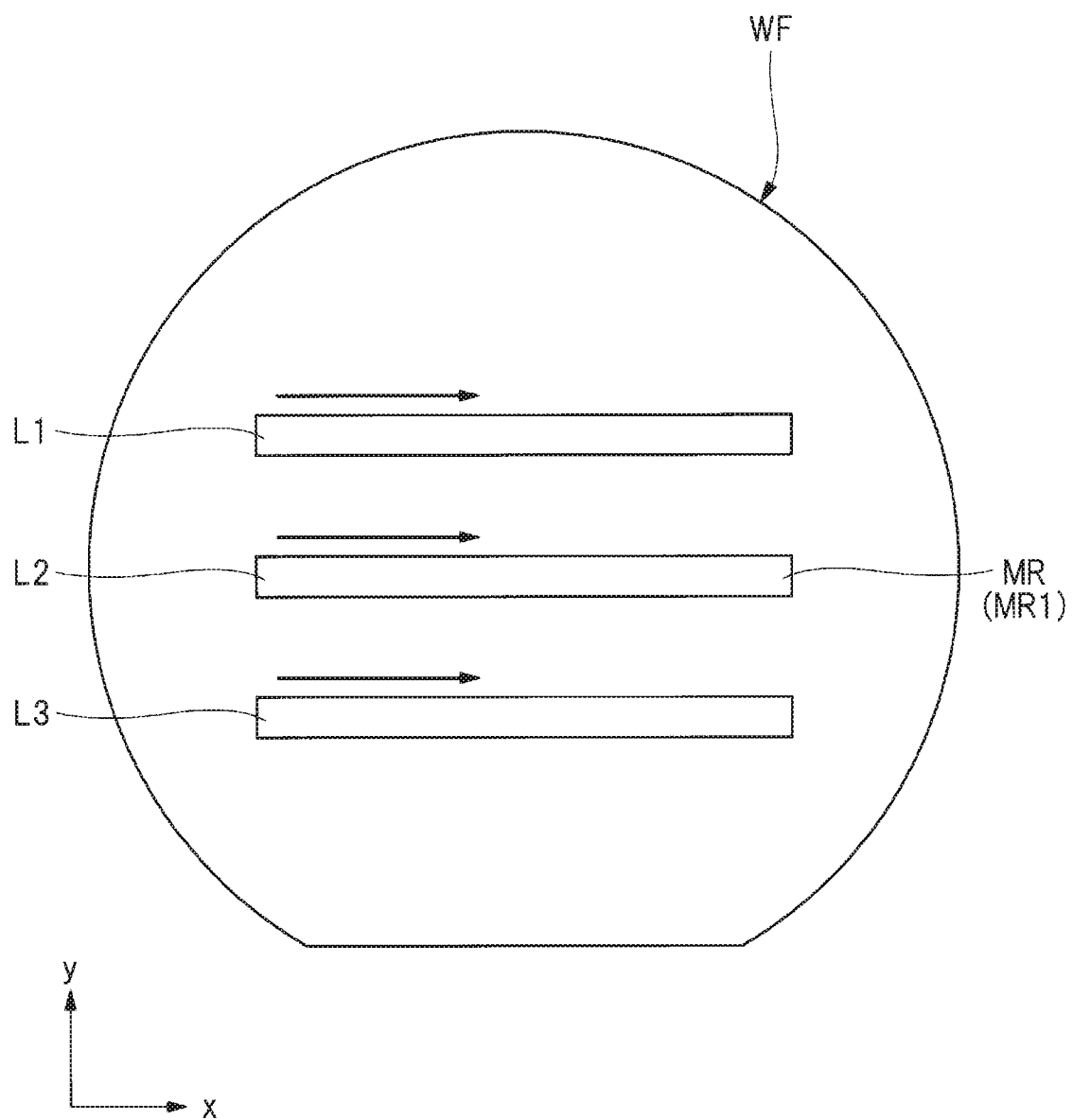
FIG. 18 is a plan view illustrating a state of applying the high electric field-resistant sealing member to the semiconductor wafer.

FIG. 18 is a plan view illustrating a state of applying the high electric field-resistant sealing material MR1 to the semiconductor wafer WF. For example, as illustrated in FIG. 18, in the manufacturing method for a semiconductor device according to the present embodiment, the paste-state high electric field-resistant sealing material MR1 is applied along an x direction by using a dispenser. Consequently, for example, three lines L1 to L3 each consisting of the high electric field resistance member MR extending in the x direction are formed as illustrated in FIG. 18.

Figure 19:
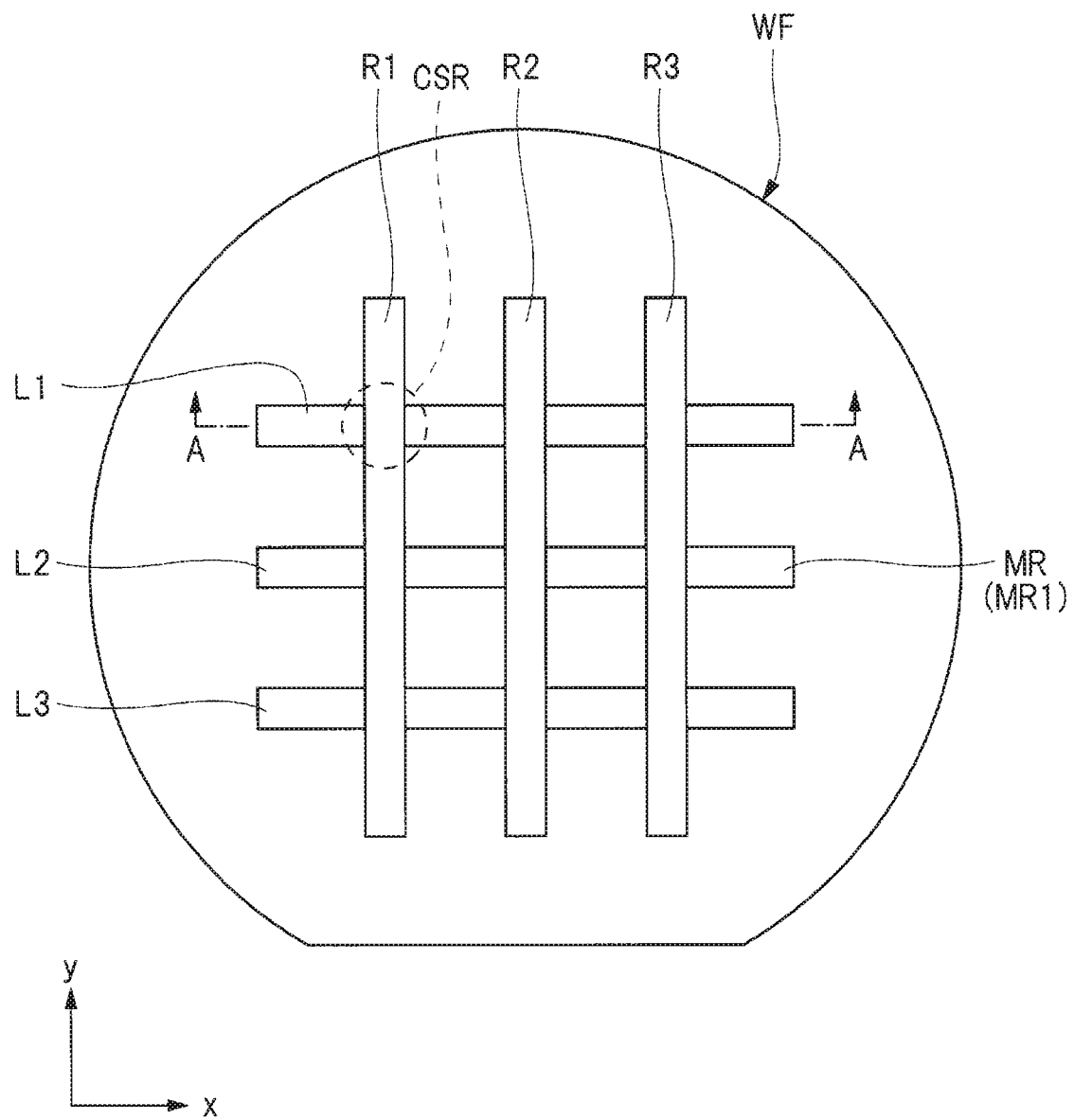
FIG. 19 is a plan view illustrating a state of applying the high electric field-resistant sealing member to the semiconductor wafer.

Subsequently, as illustrated in FIG. 19, in the manufacturing method for a semiconductor device according to the present embodiment, the paste-state high electric field-resistant sealing material MR1 is applied along a y direction by using the dispenser. Consequently, for example, three lines R1 to R3 each consisting of the high electric field-resistant sealing member MR extending in the y direction are formed as illustrated in FIG. 19. As a result, the three lines L1 to L3 extending in the x direction respectively cross with the three lines R1 to R3 extending in the y direction in cross regions CSR.

Here, in a case of uniforming an application amount of the paste-state high electric field-resistant sealing material MR1 applied along the x direction and an application amount of the paste-state high electric field-resistant sealing material MR1 applied along the y direction, a thickness of the paste-state high electric field-resistant sealing member MR formed in each of the cross regions CSR is twice that of the paste-state high electric field-resistant sealing member MR formed in each of non-cross regions other than the cross regions CSR.

Figure 20:
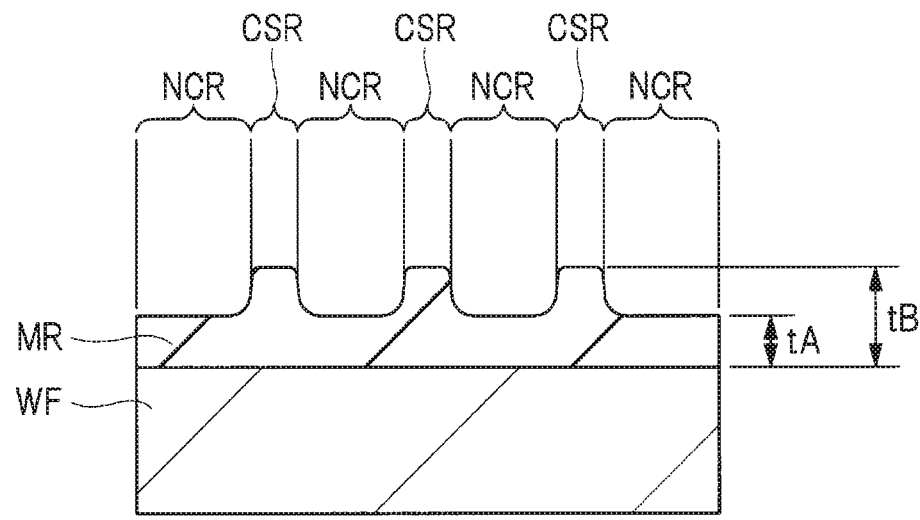
FIG. 20 is a cross-sectional view taken along a line A-A in FIG. 19.

FIG. 20 is a cross-sectional view taken along a line A-A in FIG. 19. As illustrated in FIG. 20, the high electric field-resistant sealing member MR is formed on the semiconductor wafer WF. At this point, in a case of defining the thickness of the paste-state high electric field-resistant sealing member MR formed in each cross region CSR as "tB" and defining the thickness of the paste-state high electric field-resistant sealing member MR formed in each non-cross region NCR as "tA", substantially "tB"=2×"tA" is satisfied. In other words, the thickness of the paste-state high electric field-resistant sealing member MR formed in each cross region CSR becomes nearly twice the thickness of the paste-state high electric field-resistant sealing member MR formed in each non-cross region NCR.

Figure 21:
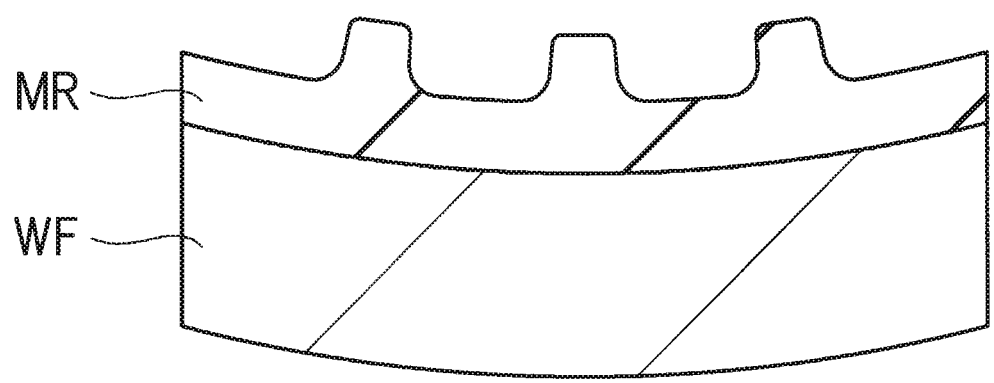
FIG. 21 is a cross-sectional view schematically illustrating warpage of a semiconductor wafer.

Additionally, in the manufacturing method for a semiconductor device according to the present embodiment, heat treatment to cure the paste-state high electric field-resistant sealing member MR is performed after applying the high electric field-resistant sealing material MR1. With this heat treatment, the paste-state high electric field-resistant sealing member MR is cured and shrinks. Therefore, assuming that a side where the high electric field-resistant sealing member MR is formed is an upper side of the semiconductor wafer WF, the semiconductor wafer WF is warped like a bowl shape by curing and shrinkage of the paste-state high electric field-resistant sealing member MR as illustrated in FIG. 21.

Particularly, the larger the thickness of the paste-state high electric field-resistant sealing member MR is, the more the paste-state high electric field-resistant sealing member MR is cured and shrinks. Here, in a case of uniforming an application amount of the paste-state high electric field-resistant sealing material MR1 applied along the x direction and an application amount of the paste-state high electric field-resistant sealing material MR1 applied along the y direction, the thickness of the paste-state high electric field-resistant sealing member MR formed in each cross region CSR is substantially twice that of the paste-state high electric field-resistant sealing member MR formed in each non-cross region NCR. Therefore, the semiconductor wafer WF is warped more. Furthermore, in recent years, a diameter of the SiC wafer (semiconductor wafer WF) is also increased from the viewpoint of reducing the manufacturing cost for the semiconductor device. Additionally, considering a fact that the large-diameter semiconductor wafer WF is more likely to be influenced by warpage, the warpage of the semiconductor wafer WF caused by curing and shrinkage of the paste-state high electric field-resistant sealing member MR is particularly likely to be apparent in the case of using the large-diameter semiconductor wafer WF.

Figure 22:
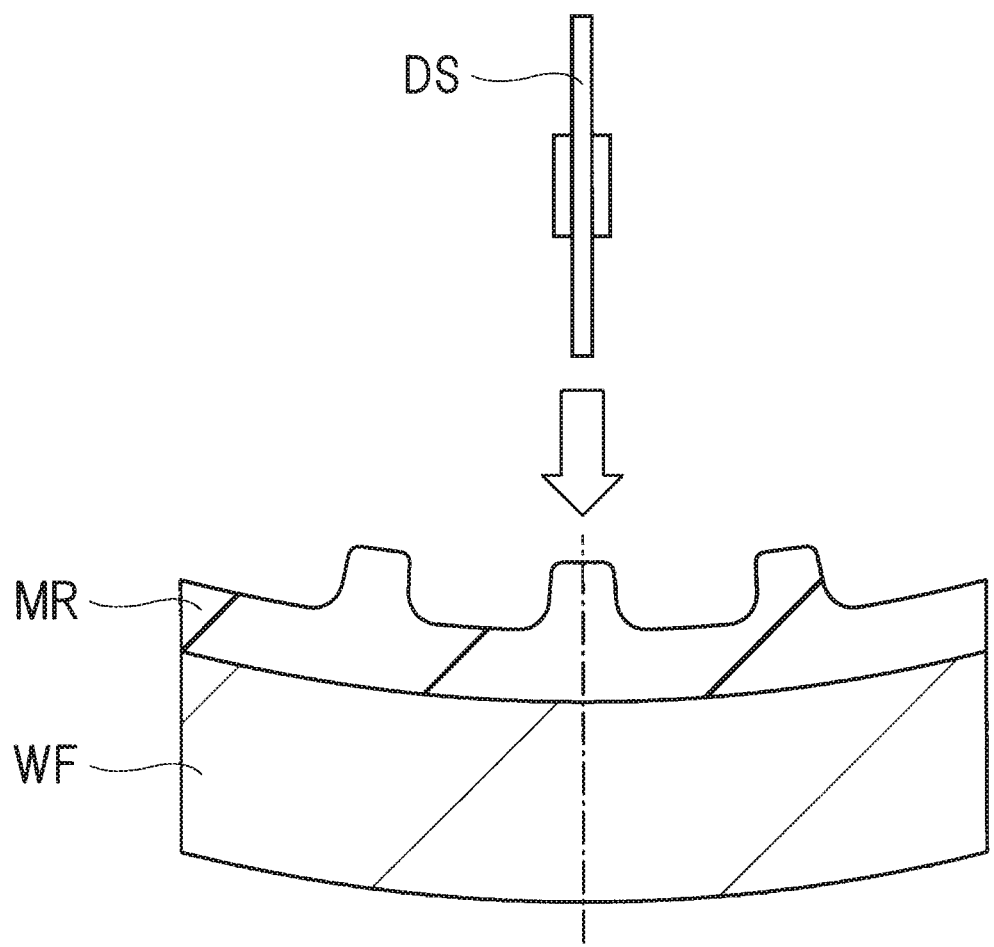
FIG. 22 is a view illustrating a state of performing a dicing process for a warped semiconductor wafer.

Thus, when the semiconductor wafer WF is warped, degradation of a yield rate is caused in the dicing process performed thereafter. FIG. 22 is a view illustrating a state of performing a dicing process for a warped semiconductor wafer WF. As illustrated in FIG. 22, in the dicing process, the semiconductor wafer WF is segmented into a plurality of semiconductor chips by cutting scribe lines of the semiconductor wafer WF by using the dicing blade DS. At this point, since the scribe lines also exist inside each cross region in a plan view, the high electric field-resistant sealing member MR formed in each cross region and having the large thickness is to be inevitably cut by the dicing blade DS. While the dicing blade DS is adapted to be able to cut smoothly a material constituting the semiconductor wafer WF, the dicing blade does not have a structure in which cutting the high electric field-resistant sealing member MR is sufficiently considered. From this fact, in a case where the high electric field-resistant sealing resin MR formed in each cross region and having the large thickness by using the dicing blade DS, the dicing blade DS may be damaged, thereby degrading a yield rate in the dicing process. Furthermore, in a case where the semiconductor wafer WF is warped, the yield rate in the dicing process is degraded as a result of the fact that the semiconductor wafer WF is not sufficiently fixed in the dicing process and the semiconductor wafer WF wobbles.

From the above, in the case of uniforming the application amount of the paste-state high electric field-resistant sealing material MR1 applied along the x direction and the application amount of the paste-state high electric field-resistant sealing material MR1 applied along the y direction, a manufacturing yield rate of the semiconductor device is degraded due to the fact that the thickness of the high electric field-resistant sealing member MR formed in each cross region is substantially twice that of the high electric field-resistant sealing member MR formed in each non-cross region. In other words, as a result of the fact that the thickness of the high electric field-resistant sealing member MR formed in each cross region is substantially twice that of the high electric field-resistant sealing member MR formed in each non-cross region, the yield rate in the dicing process is degraded due to synergistic factors including: a first factor that the thickness of the high electric field-resistant sealing member MR to be cut by the dicing blade DS is substantially twice; and a second factor that the semiconductor wafer WF is warped.

Furthermore, degradation of reliability of the semiconductor device is also caused by the fact that the thickness of the high electric field-resistant sealing member MR formed in each cross region is substantially twice that of the high electric field-resistant sealing member MR formed in each non-cross region.

Figure 23:
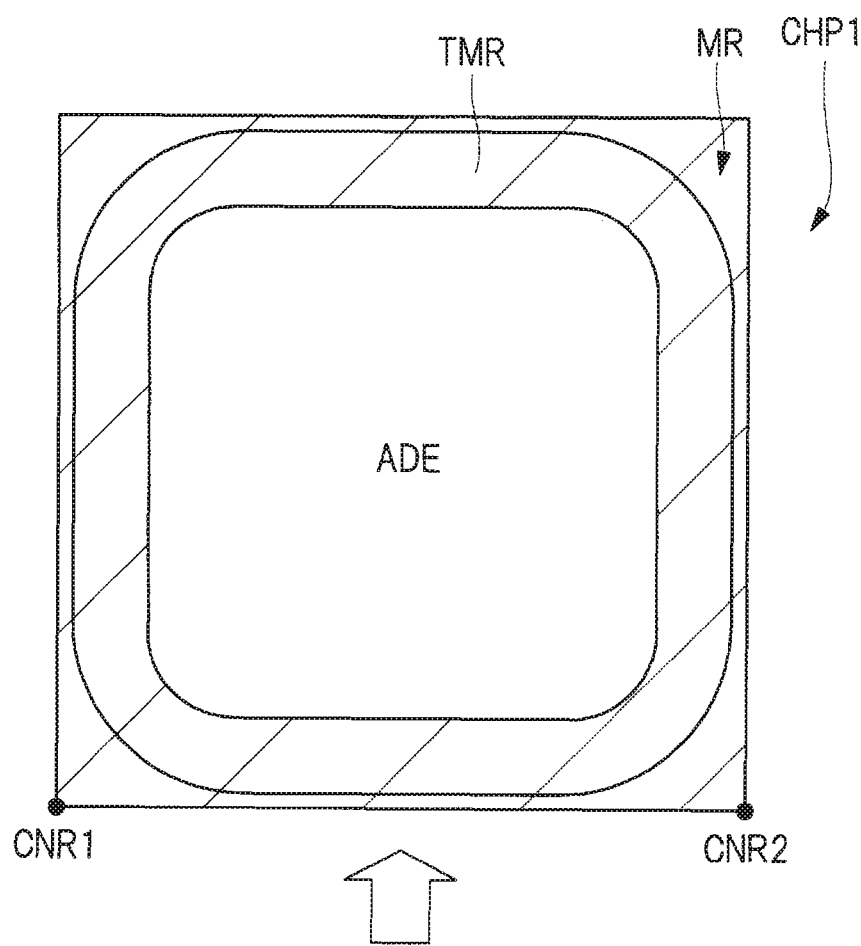
FIG. 23(a) is a view illustrating a schematic planar structure of a semiconductor chip.
FIG. 23(b) is a side view from an arrow direction in FIG. 23(a).
Figure 23:
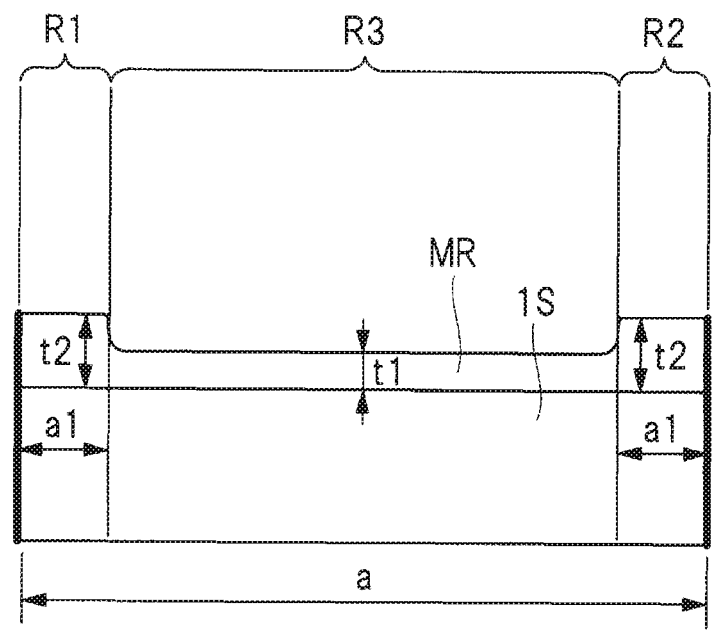

Specifically, FIG. 23(a) is a diagram illustrating a schematic planar structure of a semiconductor chip CHP1, and FIG. 23(b) is a side view from an arrow direction in FIG. 23(a).

First, in FIG. 23(a), the semiconductor chip CHP1 has a rectangular shape, and the anode electrode ADE is formed in a center portion. Then, the termination region TMR is formed so as to surround the anode electrode ADE, and a high electric field-resistant sealing member MR is formed so as to cover the termination region TMR. Note that, in FIG. 23(a), a lower left corner of the semiconductor chip CHP1 is defined as a "corner CNR1", and a lower right corner of the semiconductor chip CHP1 is corner CNR2".

Next, in FIG. 23(b), the semiconductor chip CHP1 includes: a semiconductor substrate 1S including a semiconductor material (for example, SiC) having a bandgap larger than that of silicon; and a high electric field-resistant sealing member MR formed on the surface of the semiconductor substrate 1S. Additionally, a side surface of the semiconductor chip CHP1 is formed of a region R1 including the corner CNR1, a region R2 including the corner CNR2, and a region R3 interposed between the region R1 and the region R2.

Here, in a case of defining a side length of the semiconductor chip CHP1 connecting the corner CNR1 and the corner CNR2 as "a" as illustrated in FIG. 23(b), it is defined that, for example, "the region R1 is the region including the corner CNR1, in which a distance al from the corner CNR1 is 0.15× a or less" in the present embodiment. Similarly, it is defined that "the region R2 is the region including the corner CNR2, in which a distance al from the corner CNR2 is 0.15× a or less". On the other hand, it is defined that "the region R3 is the region interposed between the region R1 and the region R2".

At this point, in a case of defining a minimum film thickness of the high electric field-resistant sealing member MR in the region R3 as "t1" and defining a maximum film thickness of the high electric field-resistant sealing member MR in the region R1 as "t2", "t2" is about twice as much as "t1". Scribe lines of the semiconductor wafer along which dicing is performed also exist in each cross region formed with the high electric field-resistant sealing member MR and having the thickness substantially twice that of the high electric field-resistant sealing member MR formed in each non-cross region, and also a region to become a corner of the semiconductor chip later is included in this cross region. From this fact, the thickness of the high electric field-resistant sealing member MR formed in each of the region R1 and the region R2 of a segmented semiconductor chip CHP inevitably becomes substantially twice the thickness of the high electric field-resistant sealing member MR formed in the region R3. That is, the thickness of the high electric field-resistant sealing member MR in each of the region R1 including the corner CNR1 and the region R2 including the corner CNR2 becomes substantially twice the thickness in the region R3 that does not include the corner.

Figure 24:
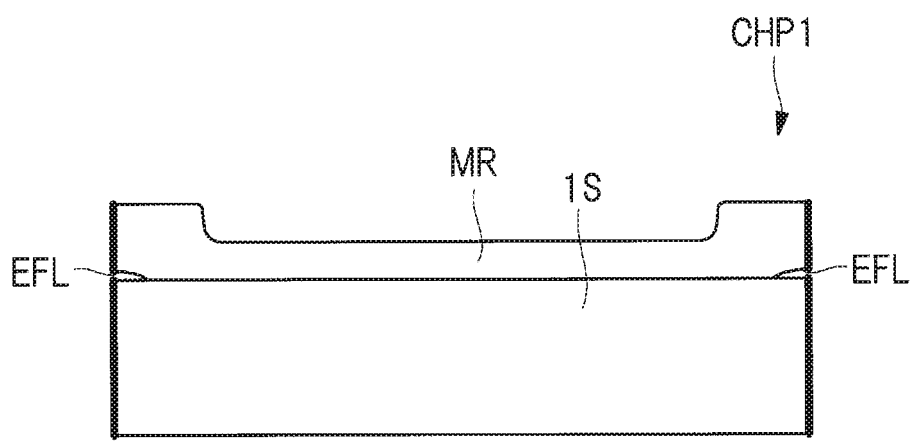
FIG. 24 is a diagram schematically illustrating peeling of the high electric field-resistant sealing member from the semiconductor substrate.

As a result, the high electric field-resistant sealing member MR is easily peeled from the semiconductor substrate 1S starting from a corner in the semiconductor chip CHP1 because the thickness of the high electric field-resistant sealing member MR formed at the corner is large as illustrated in FIG. 24, for example. The reason is that expansion and contraction of a member are caused by a temperature cycle generated by repeating activation/stop of the semiconductor device. That is, the reason is that, as a result of a fact that a thermal expansion coefficient of the high electric field-resistant sealing member MR that is an organic material differs from a thermal expansion coefficient of the semiconductor substrate 1S made of an inorganic material by about one digit, the high electric field-resistant sealing member MR is more easily peeled from the semiconductor substrate 1S in a boundary region between the semiconductor substrate 1S and the region having a large thickness of the high electric field-resistant sealing member MR than in a boundary region between the semiconductor substrate 1S and the region having a small thickness of the high electric field-resistant sealing member MR.

In the case of uniforming the application amount of the paste-state high electric field-resistant sealing material MR1 applied along the x direction and the application amount of the paste-state high electric field-resistant sealing material MR1 applied along the y direction, the thickness of the high electric field-resistant sealing member MR formed in each cross region becomes substantially twice the thickness of the high electric field-resistant sealing member MR formed in each non-cross region. Due to this fact, not only the manufacturing yield rate of the semiconductor device is degraded but also reliability of the semiconductor device after manufacture is degraded. That is, according to further study by the present inventors, it is found that there is still room for further improvement from both of the viewpoint of improving the manufacturing yield rate and the viewpoint of improving reliability of the semiconductor device after manufacture in the manufacturing method for a semiconductor device in which the high electric field-resistant sealing member MR is collectively formed in the state of the semiconductor wafer before segmentation into the semiconductor chips CHP1. Accordingly, in the present embodiment, a new solution is provided to such room for further improvement found by the present inventors. In the following, the technical idea of the present embodiment provided with the new solution will be described.

Further Characteristics of Embodiment

«Structural Characteristics»

Figure 25:
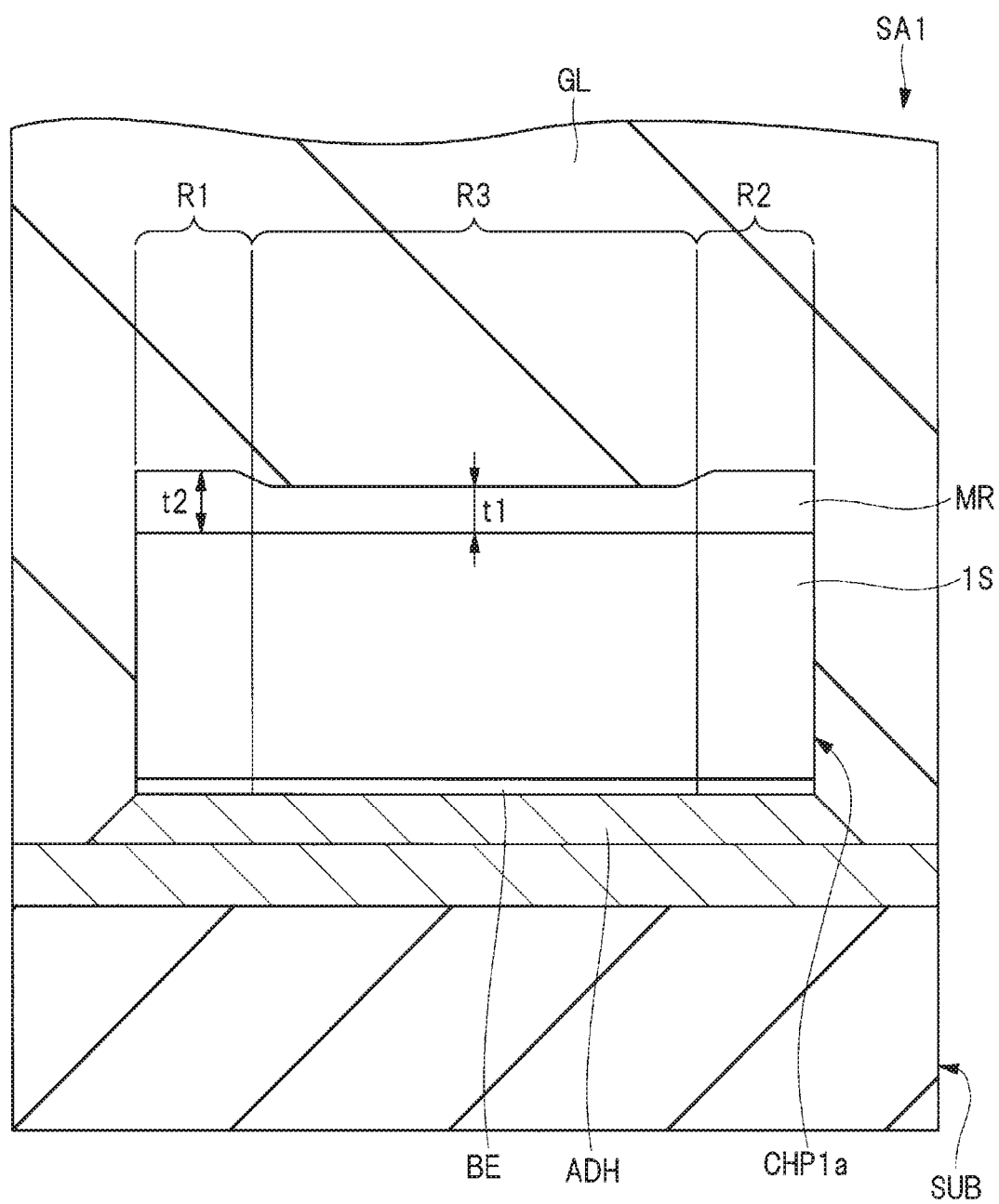
FIG. 25 is a diagram illustrating a schematic structure of the semiconductor device according to the embodiment.

FIG. 25 is a diagram illustrating a schematic structure of the semiconductor device SA1 according to the embodiment. As illustrated in FIG. 25, in the semiconductor device SA1 of the present embodiment, a semiconductor chip CHP1a is mounted on an insulation substrate SUB via a solder material ADH.

In FIG. 25, a side surface of the semiconductor chip CHP1a is illustrated. A SiC device is formed in this semiconductor chip CHP1a, and particularly, a diode is exemplified as the SiC device in the present embodiment.

In FIG. 25, the semiconductor chip CHP1a includes a semiconductor substrate 1S using SiC as a semiconductor material, and a back-surface electrode BE functioning as a cathode electrode of the diode is formed on a back surface of the semiconductor substrate 1S. On the other hand, in the side view illustrated in FIG. 7, the high electric field-resistant sealing member MR is formed on an entire front surface of the semiconductor chip CHP1a. Additionally, the semiconductor chip CHP1a is sealed with a silicone gel GL. The high electric field-resistant sealing member MR has dielectric breakdown field strength larger than dielectric breakdown field strength of the silicone gel GL used as a sealing member.

Here, for example, as illustrated in FIG. 25, it is assumed that the side surface of the semiconductor chip CHP1a is formed of a region R1, a region R2, and a region R3. In this case, a fourth characteristic point in the present embodiment is that: in a case of defining a minimum film thickness of the high electric field-resistant sealing member MR in the region R3 as "t1" and defining a maximum film thickness of the high electric field-resistant sealing member MR in the region R1 as "t2", a relation of $t2 \leq 1.5 \times t1$ is satisfied. In other words, the fourth characteristic point of the present embodiment is that the maximum film thickness of the high electric field-resistant sealing member MR in the region R1 including a corner is far smaller than a thickness that is about twice the minimum film thickness of the high electric field-resistant sealing member MR in the region R3.

That is, in the present embodiment, the maximum film thickness of the high electric field-resistant sealing member MR in the region R1 including the corner is limited to within a necessary sufficient range in which the dielectric breakdown field strength can be secured without increasing the maximum thickness thereof. The reason is that: in a case where the thickness of the high electric field-resistant sealing member MR is made excessively large while the high electric field-resistant sealing member MR is provided in order to secure the dielectric breakdown field strength, this may cause degradation of the manufacturing yield rate of the semiconductor device and may cause degradation of reliability of the semiconductor device after manufacture as described above in <Study on Further Improvement>.

Regarding this point, in the semiconductor chip CHP1 of the present embodiment, the maximum film thickness of the high electric field-resistant sealing member MR formed in the region R1 including the corner is 1.5 times or less the minimum film thickness of the high electric field-resistant sealing member MR formed in the region R3. That is, in the semiconductor chip CHP1 of the present embodiment, the maximum film thickness of the high electric field-resistant sealing member MR formed in the corner-containing region R1 is formed smaller than the thickness that is about twice the minimum film thickness of the high electric field-resistant sealing member MR formed in the region R3. As a result, according to the present embodiment, it is possible to secure dielectric breakdown strength in the region R1 including the corner required to secure the dielectric breakdown field strength, while effectively suppressing adverse effects of degrading the manufacturing yield rate of the semiconductor device and degrading reliability of the semiconductor device after manufacture.

Thus, according to the fourth characteristic point in the present embodiment in which the relation of t2≤1.5×t1 is satisfied in the case of defining the minimum film thickness of the high electric field-resistant sealing member MR in the region R3 as "t1" and defining the maximum film thickness of the high electric field-resistant sealing member MR in the region R1 as "t2", it is possible to achieve both of improving the manufacturing yield rate of the semiconductor device and improving reliability of the semiconductor device. However, it is desirable that a relation of t2≤1.2×t1 be satisfied from the viewpoint of effectively suppressing the adverse effect of degrading the manufacturing yield rate of the semiconductor device caused by warpage of the semiconductor wafer or the like.

Meanwhile, in a case of expressing the relation of t2≤1.5×t1 with specific numerical values, the specific numerical values are different in each product having different withstand voltage and size of the semiconductor device, but for example, in a case of exemplifying the specific numerical values, it can be expressed as that "a relation of t2≤120 μm is satisfied".

«Characteristic on Manufacturing Method (First Method)»

Next, a manufacturing method for a semiconductor device having the fourth characteristic point in the above-described present embodiment will be described with reference to the drawings.

The manufacturing method for a semiconductor device according to the present embodiment has a precondition of the above-described third characteristic point in which the high electric field-resistant sealing member MR is not formed for each of the segmented conductor chips CHP1 but the high electric field-resistant sealing member MR is collectively formed in the state of the semiconductor wafer before segmentation into the semiconductor chips CHP1.

That is, a semiconductor wafer WF including a semiconductor material having a bandgap larger than that of silicon and having a surface is prepared. Then, in the process of forming the high electric field-resistant sealing member MR in the present embodiment, for example, the paste-state high electric field-resistant sealing material MR1 is applied in parallel lines along the x direction of the semiconductor wafer WF, and the paste-state high electric field-resistant sealing material MR1 is applied in parallel lines in the y direction orthogonal to the x direction while the high electric field-resistant sealing member MR that has been applied in the x direction is still in the paste state before being dried. After that, high-temperature heat treatment is applied to the semiconductor wafer WF to cure the paste-state high electric field-resistant sealing member MR.

Note that, in the present embodiment, the description is provided assuming that the "x direction" is a "first direction" and the "y direction" is a "second direction", but the technical idea of the present embodiment is not limited thereto and the "y direction" may be the "first direction" and the "x direction" may be the "second direction".

Figure 26:
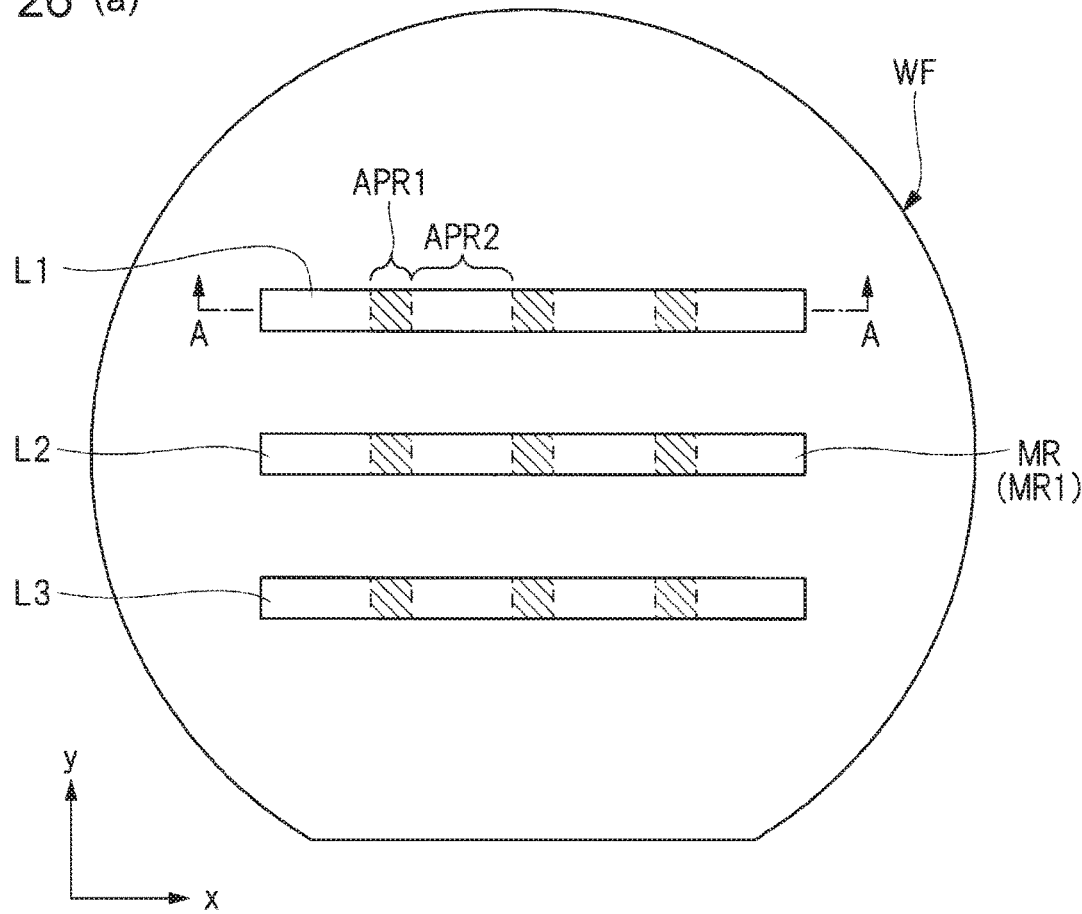
FIG. 26(a) is a schematic diagram illustrating a state of applying a paste-state high electric field-resistant sealing member in an x-direction of the semiconductor wafer.
FIG. 26(b) is a cross-sectional view taken along a line A-A in FIG. 26(a).
Figure 26:
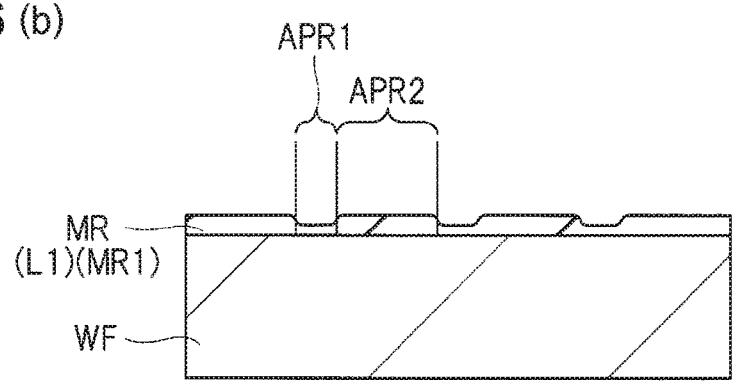

FIG. 26(a) is a schematic view illustrating a state of applying the paste-state high electric field-resistant sealing member MR in the x direction of the semiconductor wafer WF. Here, the x direction is a lateral direction at the time of viewing the surface of the semiconductor wafer WF from above while an orientation flat portion of the semiconductor wafer WF is set on a lower side. For example, as illustrated in FIG. 26(a), in the manufacturing method for a semiconductor device according to the present embodiment, the paste-state high electric field-resistant sealing material MR1 is applied along the x direction by using a dispenser. Consequently, as illustrated in FIG. 26(a), three lines L1 to L3 each consisting of the high electric field-resistant sealing member MR extending in the x direction are formed.

Each of the three lines L1 to L3 includes: cross regions APR1 crossing with three lines R1 to R3 (see FIG. 27(a)) extending in the y direction as described later; and non-cross regions APR2 not overlapping with these three lines R1 to R3 (see FIG. 27(a)). Additionally, each of the three lines L1 to L3 is formed by, for example, applying the paste-state high electric field-resistant sealing material MR1 at an interval of 6 mm and a width of 1.9 mm by using the dispenser.

FIG. 26(b) is a cross-sectional view taken along line A-A in FIG. 26(a). As illustrated in FIG. 26(b), in the process of applying the paste-state high electric field-resistant sealing material MR1 in the x direction, an application amount of the high electric field-resistant sealing material MR1 in each of the cross regions APR1 is set smaller than an application amount of the high electric field-resistant sealing material MR1 in each of the non-cross regions APR2 other than the cross regions APR1.

Figure 27:
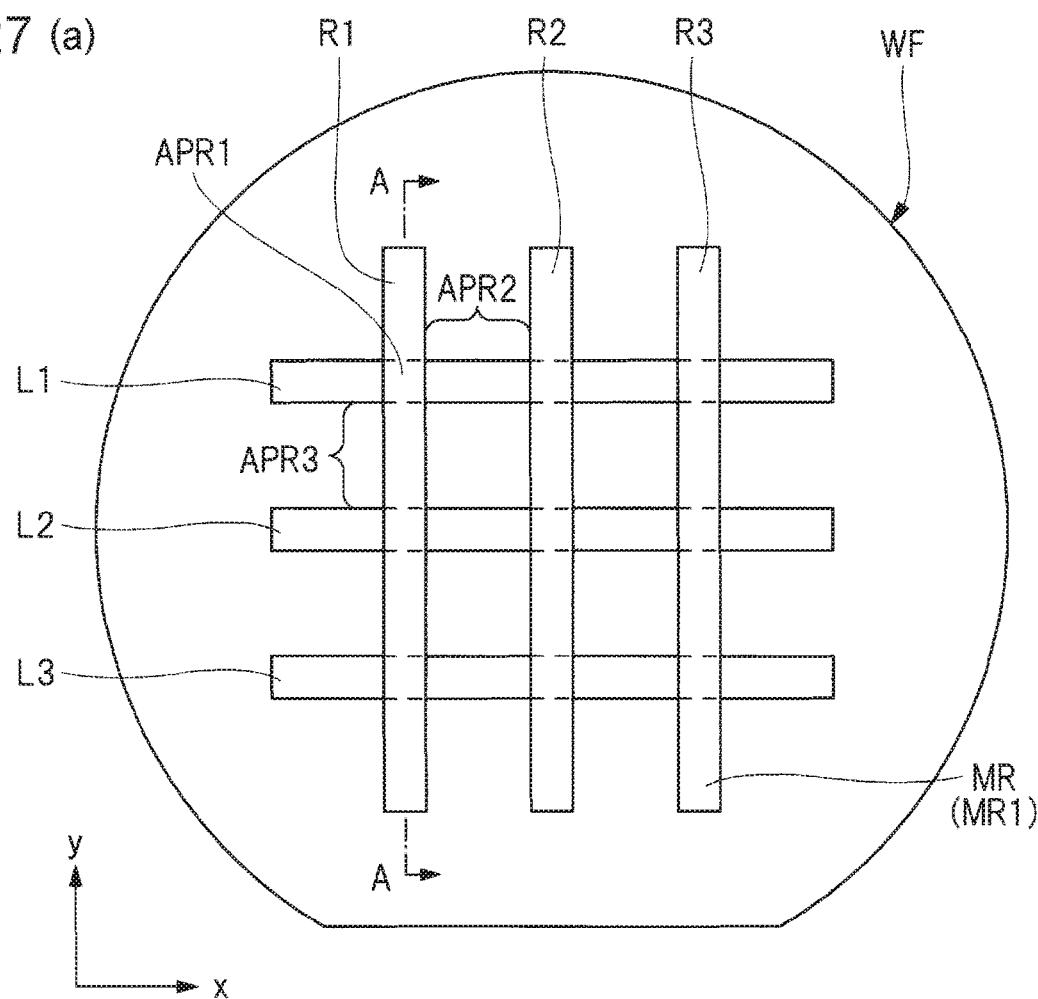
FIG. 27(a) is a schematic diagram illustrating a state of applying a paste-state high electric field-resistant sealing member in a y-direction of the semiconductor wafer.
FIG. 27(b) is a cross-sectional view taken along a line A-A in FIG. 27(a).
Figure 27:
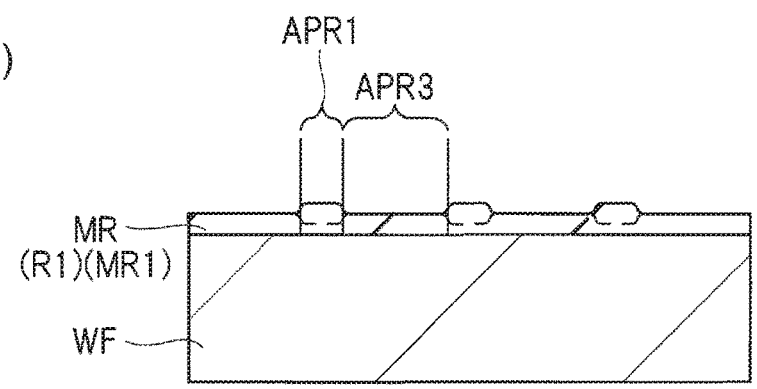

Subsequently, FIG. 27(a) is a schematic view illustrating a state of applying the high electric field-resistant sealing material MR1 in the y direction of the semiconductor wafer WF. Here, the y direction is a vertical direction at the time of viewing the surface of the semiconductor wafer WF from above while the orientation flat portion of the semiconductor wafer WF is set on the lower side. For example, as illustrated in FIG. 27(a), in the manufacturing method for a semiconductor device according to the present embodiment, the paste-state high electric field-resistant sealing material MR1 is applied along the y direction by using a dispenser. Consequently, for example, three lines R1 to R3 each consisting of the high electric field-resistant sealing member MR extending in the y direction are formed as illustrated in FIG. 27(a).

Each of the three lines R1 to R3 includes: cross regions APR1 respectively crossing with the three lines L1 to L3 extending in the x direction; and non-cross regions APR3 not overlapping with these three lines L1 to L3. Additionally, each of the three lines R1 to R3 is formed by, for example, applying the paste-state high electric field-resistant sealing material MR1 at an interval of 7 mm and a width of 1.9 mm by using the dispenser.

FIG. 27(b) is a cross-sectional view taken along line A-A in FIG. 27(a). As illustrated in FIG. 27(b), in the process of applying the paste-state high electric field-resistant sealing material MR1 in the y direction, an application amount of the high electric field-resistant sealing material MR1 in each of the cross regions APR1 and an application amount of the high electric field-resistant sealing material MR1 in each of the non-cross regions APR3 other than the cross regions APR1 are uniformly set.

After that, the high electric field-resistant sealing member MR formed on the semiconductor wafer WF is heated at 100° C. for 20 minutes (1), and at 200° C. for one hour (2), and then at 300° C. for one hour (3) in a nitrogen atmosphere while the semiconductor wafer WF is horizontally held. As described above, the high electric field-resistant sealing members MR can be formed on the semiconductor wafer WF.

Here, as illustrated in FIGS. 26(a) and 26(b), for example, a fifth characteristic point in the present embodiment is to first set the application amount of the paste-state high electric field-resistant sealing material MR1 in each cross region APR1 smaller than the application amount of the high electric field-resistant sealing material MR1 in each non-cross region APR2 in the process of applying the high electric field-resistant sealing material MR1 in the x direction. On the other hand, as illustrated in FIGS. 27(a) and 27(b), for example, the application amount of the high electric field-resistant sealing material MR1 in each cross region APR1 and the application amount of the high electric field-resistant sealing material MR1 in each non-cross region APR3 are uniformly set in the process of applying the paste-state high electric field-resistant sealing material MR1 in the y direction.

Specifically, setting the application amount of the high electric field-resistant sealing material MR1 in each cross region APR1 smaller than the application amount of the high electric field-resistant sealing material MR1 in each non-cross region APR2 can be achieved by, for example, setting a movement speed of the dispenser in the cross region APR1 faster than a movement speed of the dispenser in the non-cross region APR2 while keeping a constant discharge amount from the dispenser. Also, such setting can be also achieved by, for example, setting a pressure to discharge the high electric field-resistant sealing material MR1 from the dispenser at a first pressure in the non-cross region APR2 while setting a pressure to discharge the high electric field-resistant sealing material MR1 from the dispenser at a second pressure lower than the first pressure in the cross region APR1 in a state that the movement speed from the dispenser is set constant.

Consequently, according to the present embodiment, the high electric field-resistant sealing member MR having the shape illustrated in FIG. 25 can be formed on the semiconductor substrate 1S through the dicing process and the sealing process after curing the paste-state high electric field-resistant sealing member MR. As a result, according to the present embodiment, it is possible to achieve the fourth characteristic point in which the relation of $t2 \leq 1.5 \times t1$ is satisfied in the case of defining the minimum film thickness of the high electric field-resistant sealing member MR in the region R3 as "t1" and defining the maximum film thickness of the high electric field-resistant sealing member MR in the region R1 as "t2" in FIG. 25. Therefore, according to the present embodiment, improving the manufacturing yield rate of the semiconductor device and improving reliability of the semiconductor device can be both achieved.

Meanwhile, in the manufacturing method for a semiconductor device according to the present embodiment, the description has been provided for the example in which application in the x direction is performed while setting differently the application amount of the high electric field-resistant sealing material MR1 applied to each cross region APR1 and the application amount of the high electric field-resistant sealing material MR1 applied to each non-cross region APR2, and after that, application in the y direction is performed while uniformly setting the application amount of the high electric field-resistant sealing material MR1 applied to the cross region APR1 and that applied to the non-cross region APR3. However, the technical idea of the present embodiment is not limited thereto, and application of the high electric field-resistant sealing material MR1 may be performed by performing application of the high electric field-resistant sealing material MR1 in the y direction in which the application amounts are uniformly set, and then performing application in the x direction in which the application amounts are set differently.

First Modified Example

«Structural Characteristics»

Figure 28:
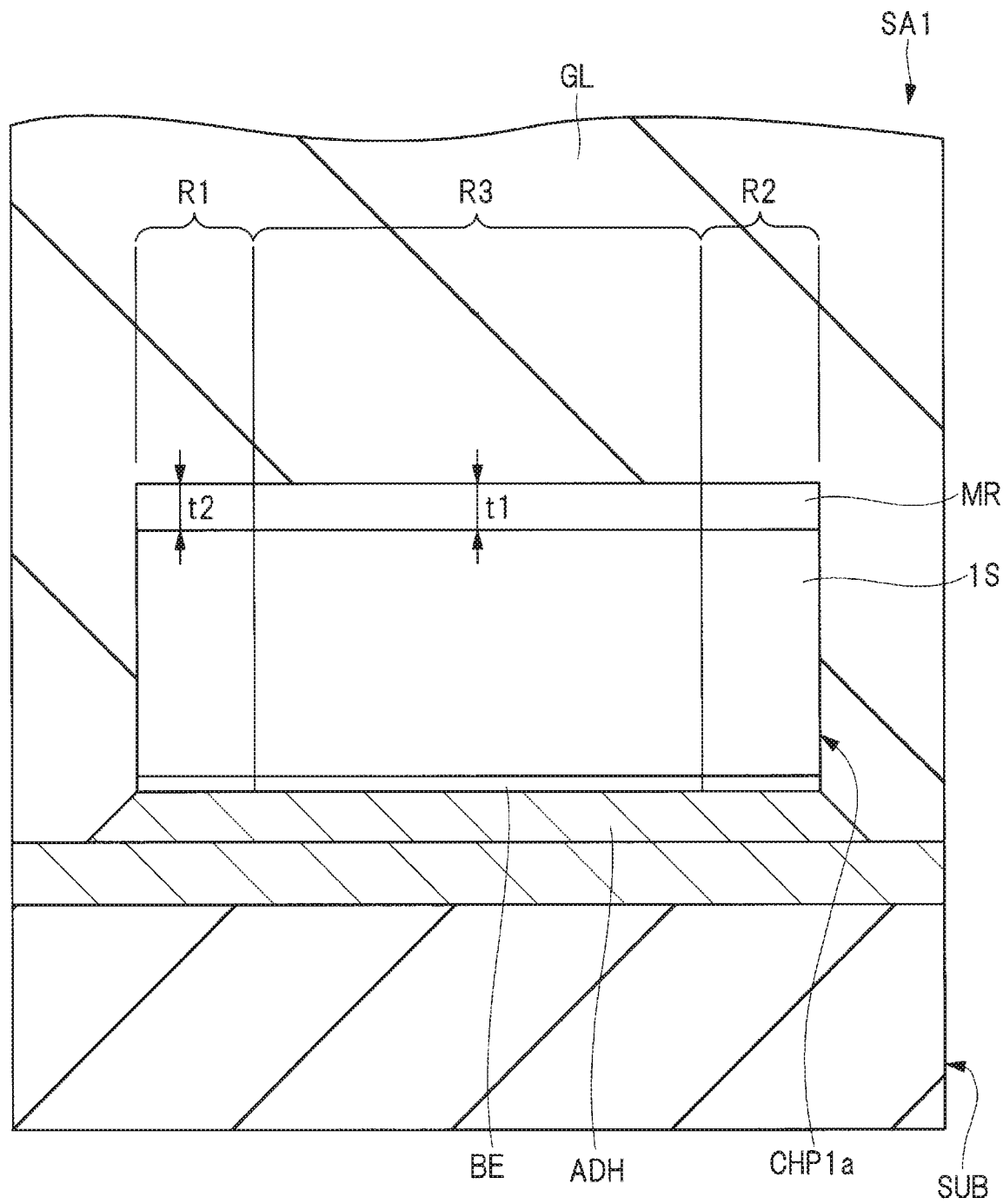
FIG. 28 is a diagram illustrating a schematic structure of a semiconductor device in a first modified example.

Next, a technical idea of first modified example will be described. FIG. 28 is a diagram illustrating a schematic structure of the semiconductor device in the first modified example. In FIG. 28, a structural characteristic point in the first modified example is that the high electric field-resistant sealing member MR formed on the semiconductor substrate 1S is formed to have a uniform thickness in a side view of the semiconductor chip CHP1a illustrated in FIG. 28. Specifically, as illustrated in FIG. 28, in a case of defining a minimum film thickness of the high electric field-resistant sealing member MR in a region R3 as "t1" and defining a maximum film thickness of the high electric field-resistant sealing member MR in a region R1 as "t2", a relation of approximately t2=t1 is satisfied.

In this case, in the semiconductor chip CHP1a in the first modified example, the maximum film thickness of the high electric field-resistant sealing member MR in the region R1 including a corner is far smaller than a thickness that is about twice the minimum film thickness of the high electric field-resistant sealing member MR in the region R3. As a result, according to the first modified example, it is possible to effectively suppress the adverse effects of degrading the manufacturing yield rate of the semiconductor device and degrading reliability of the semiconductor device after manufacture.

Here, in the case where the thickness of the high electric field-resistant sealing member MR in the region R3 and the thickness of the high electric field-resistant sealing member MR in the region R1 including the corner are formed to have substantially the same thickness, there is a question on whether dielectric breakdown strength can be secured in the region R1 including the corner required to secure the dielectric breakdown field strength.

As for this point, the dielectric breakdown field strength does not constantly become lowest at the corner by devising an internal structure of the semiconductor chip CHP1a.

In the following, this point will be described. For example, it is known that dielectric breakdown is likely to occur in the vicinity of an intermediate position between a center portion of a side and a corner rather than in the corner of the semiconductor chip CHP1a depending on a structure of the semiconductor chip CHP1a using SiC as the semiconductor material. This is considered to be caused by a so-called off angle whereby the surface of the actual semiconductor chip CHP1a is deviated from a specific plane direction by about 4 degrees and electric field concentration is likely to occur. Additionally, as a result of receiving influence of non-uniform diffusion of ions at the time of ion implantation due to such an off angle, dielectric breakdown is more likely to occur in the vicinity of the intermediate position between the center portion of the side and the corner than in the corner of the semiconductor chip CHP1a depending on the structure of the semiconductor chip CHP1a.

For example, in FIG. 7 of "PTL 2" described in the "Background Art" above, the exemplary structure in which an angle "(2)" or an angle "(4)" has breakdown field strength higher than breakdown field strength in a side "(1)" is illustrated, and it can be grasped that the dielectric breakdown field strength does not become constantly minimal at the corner in the semiconductor chip having this structure. Therefore, for example, even in the case where the thickness of the high electric field-resistant sealing member MR in the region R3 and the thickness of the high electric field-resistant sealing member MR in the region R1 including the corner are formed to have substantially the same thickness in FIG. 28, the dielectric breakdown strength can be secured in the region R1 including the corner required to secure the dielectric breakdown field strength.

From the above, according to the first modified example in which the thickness of the high electric field-resistant sealing member MR in the region R3 and the thickness of the high electric field-resistant sealing member MR in the region R1 including the corner are formed to have substantially the same thickness, improving the manufacturing yield rate of the semiconductor device and improving reliability of the semiconductor device can be both achieved by applying the first modified example particularly to the semiconductor chip having the structure in which dielectric breakdown field strength is most required to be secured on the side rather than the corner.

«Characteristic on Manufacturing Method (Second Method)»

Figure 29:
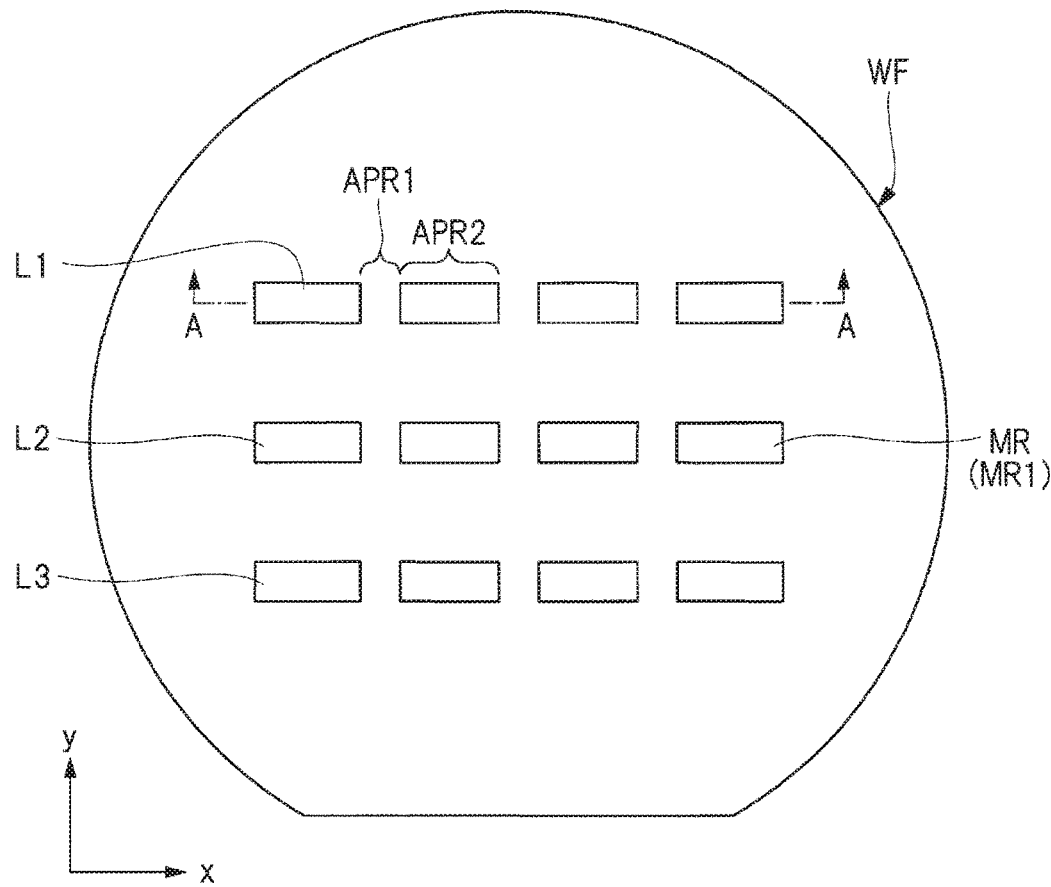
FIG. 29(a) is a schematic diagram illustrating a state of applying the paste-state high electric field-resistant sealing member in the x-direction of the semiconductor wafer.
FIG. 29(b) is a cross-sectional view taken along a line A-A in FIG. 29(a).
Figure 29:
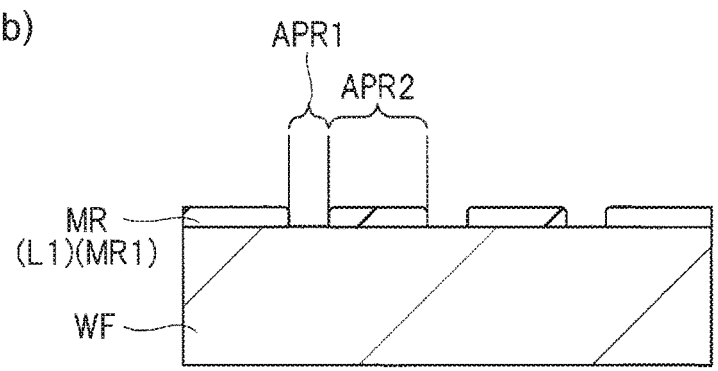

FIG. 29(a) is a schematic view illustrating a state of applying the paste-state high electric field-resistant sealing material MR1 in the x direction of the semiconductor wafer WF. For example, as illustrated in FIG. 29(a), in the manufacturing method for a semiconductor device according to the first modified example, the paste-state high electric field-resistant sealing material MR1 is applied along the x direction by using the dispenser. Consequently, as illustrated in FIG. 29(a), three lines L1 to L3 each consisting of the high electric field-resistant sealing member MR extending in the x direction are formed.

Each of the three lines L1 to L3 includes: cross regions APR1 crossing with three lines R1 to R3 (see FIG. 30(a)) extending in the y direction as described later; and non-cross regions APR2 not overlapping with these three lines R1 to R3 (see FIG. 30(a)).

FIG. 29(b) is a cross-sectional view taken along line A-A in FIG. 29(a). As illustrated in FIG. 29(b), in the process of applying the paste-state high electric field-resistant sealing material MR1 in the x direction, the high electric field-resistant sealing material MR1 is not applied to each of the cross regions APR1 and an application amount of the high electric field-resistant sealing material MR1 to satisfy a desired thickness is applied to each of the non-cross regions APR2 other than the cross regions APR1. That is, in the process of applying the paste-state high electric field-resistant sealing material MR1 in the x direction, the application amount of the high electric field-resistant sealing material MR1 to satisfy the desired thickness is applied only to each non-cross region APR2 while stepping over each cross region APR1.

Figure 30:
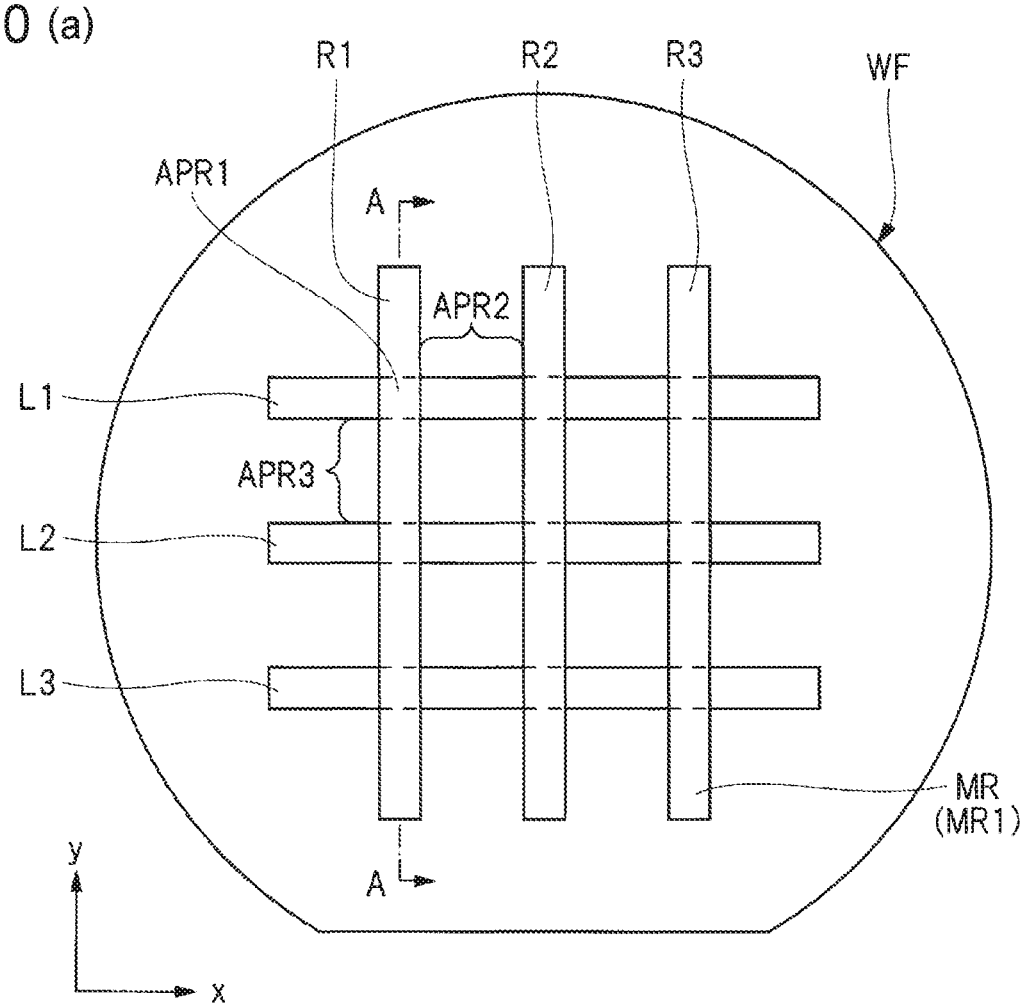
FIG. 30(a) is a schematic diagram illustrating a state of applying the paste-state high electric field-resistant sealing member in the y-direction of the semiconductor wafer.
FIG. 30(b) is a cross-sectional view taken along a line A-A in FIG. 30(a).
Figure 30:
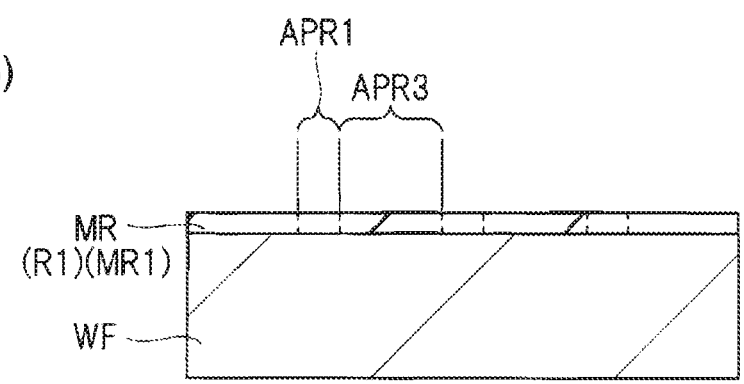

Subsequently, FIG. 30(a) is a schematic view illustrating a state of applying the paste-state high electric field-resistant sealing material MR1 in the y direction of the semiconductor wafer WF. For example, as illustrated in FIG. 30(a), in the manufacturing method for a semiconductor device according to the first modified example, the paste-state high electric field-resistant sealing material MR1 is applied along the y direction by using the dispenser. Consequently, for example, three lines R1 to R3 each consisting of the high electric field-resistant sealing member MR extending in the y direction are formed as illustrated in FIG. 30(a).

Each of the three lines R1 to R3 includes: the cross regions APR1 respectively crossing with the three lines L1 to L3 extending in the x direction; and the non-cross regions APR3 not overlapping with these three lines L1 to L3.

FIG. 30(b) is a cross-sectional view taken along line A-A in FIG. 30(a). As illustrated in FIG. 30(b), in the process of applying the paste-state high electric field-resistant sealing material MR1 in the y direction, the application amount of the high electric field-resistant sealing material MR1 in each of the cross regions APR1 and the application amount of the high electric field-resistant sealing material MR1 in each of the non-cross regions APR3 other than the cross regions APR1 are uniformly set.

After that, the high electric field-resistant sealing member MR formed on the semiconductor wafer WF is heated at 100° C. for 20 minutes (1), and at 200° C. for one hour (2), and then at 300° C. for one hour (3) in a nitrogen atmosphere while the semiconductor wafer WF is horizontally held. As described above, the high electric field-resistant sealing members MR can be formed on the semiconductor wafer WF.

Here, a characteristic point in the first modified example is firstly not to apply the paste-state high electric field-resistant sealing material MR1 to each cross region APR1 but apply the high electric field-resistant sealing material MR1 to each non-cross regions APR2 in the process of applying the paste-state high electric field-resistant sealing material MR1 in the x direction as illustrated in FIGS. 29(a) and 29(b). On the other hand, as illustrated in FIGS. 30(a) and 30(b), for example, the application amount of the high electric field-resistant sealing material MR1 in each cross region APR1 and the application amount of the high electric field-resistant sealing material MR1 in each non-cross region APR3 are uniformly set in the process of applying the paste-state high electric field-resistant sealing material MR1 in the y direction.

At this point, even when the high electric field-resistant sealing material MR1 is intermittently applied in the x direction, viscosity of the high electric field-resistant sealing material MR1 is once lowered and spreads slightly in the horizontal direction at the time of heating and curing the high electric field-resistant sealing material MR1, and therefore, the high electric field-resistant sealing material MR1 in each cross region APR1 is uniformly continued during this time. As a result, a use amount of the high electric field-resistant sealing material MR1 can be reduced and the thickness of the high electric field-resistant sealing member MR in each cross region APR1 can be formed to have a thickness substantially equal to the thickness in each non-cross region APR2.

Consequently, according to the first modified example, the high electric field-resistant sealing member MR having the shape illustrated in FIG. 28 can be formed on the semiconductor substrate 1S through the dicing process and the sealing process after curing the paste-state high electric field-resistant sealing member MR. As a result, as illustrated in FIG. 28, according to the first modified example in which the thickness of the high electric field-resistant sealing member MR in the region R3 and the thickness of the high electric field-resistant sealing member MR in the region R1 including the corner are formed to have substantially the same thickness, both of improving the manufacturing yield rate of the semiconductor device and improving reliability of the semiconductor device can be achieved by applying the first modified example particularly to the semiconductor chip having the structure in which dielectric breakdown field strength is most required to be secured on the side rather than the corner.

Second Modified Example

Figure 31:
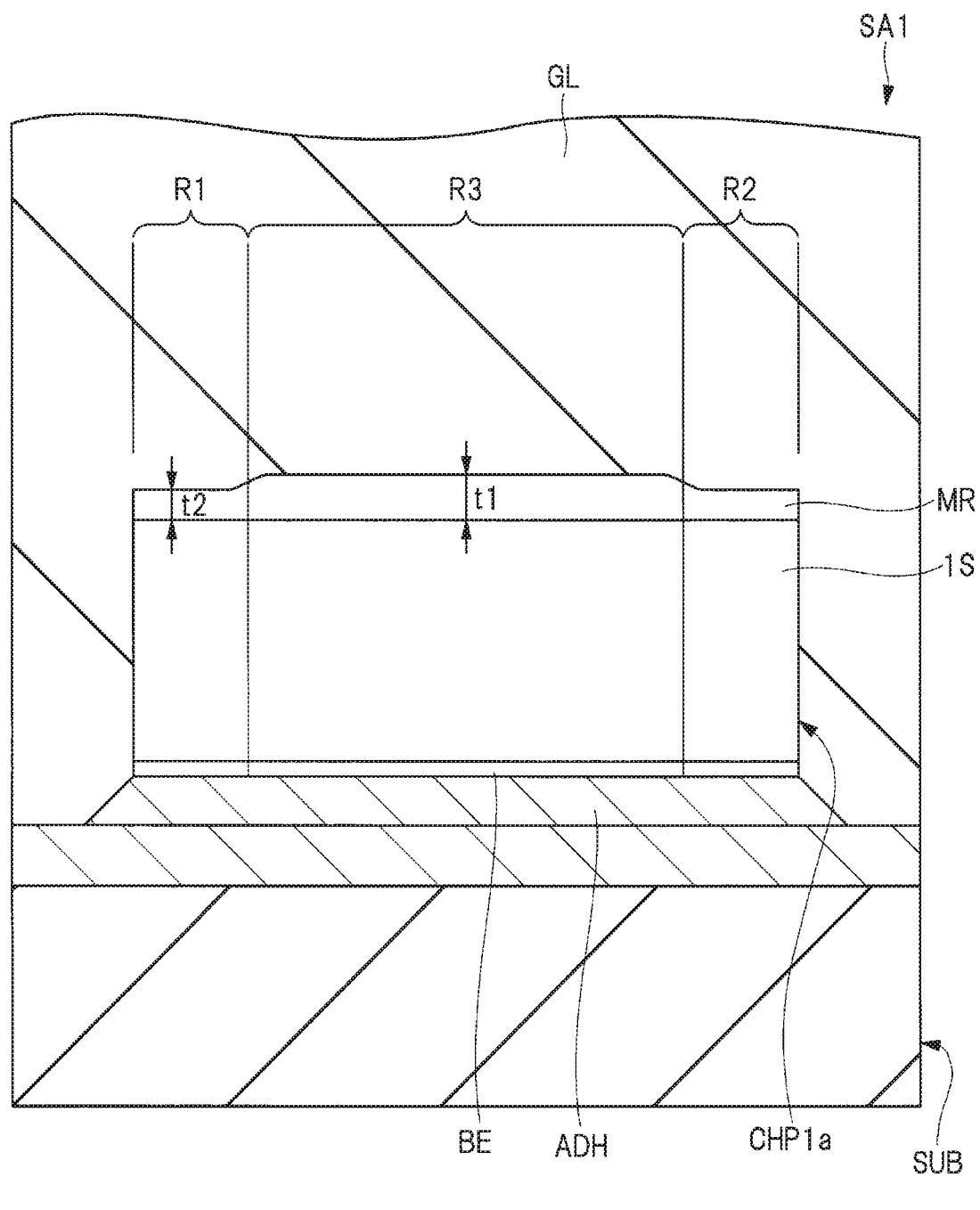
FIG. 31 is a diagram illustrating a schematic structure of a semiconductor device in a second modified example.

«Structural Characteristics» Next, a technical idea of second modified example will be described. FIG. 31 is a diagram illustrating a schematic structure of the semiconductor device SA1 in the second modified example. In FIG. 31, the structural characteristic point in the second modified example is that a relation of t2<t1 is satisfied in a case of defining the minimum film thickness of the high electric field-resistant sealing member MR in the region R3 as "t1" and defining the maximum film thickness of the high electric field-resistant sealing member MR in the region R1 as "t2" in a side view of the semiconductor chip CHP1a illustrated in FIG. 31.

In this case, in the semiconductor chip CHP1a of second modified example, the maximum film thickness of the high electric field-resistant sealing member MR formed in the region R1 including a corner is smaller than the minimum film thickness of the high electric field-resistant sealing member MR formed in the region R3. As a result, according to second modified example, both of improving the manufacturing yield rate of the semiconductor device and improving reliability of the semiconductor device can be achieved by applying the second modified example particularly to the semiconductor chip having the structure in which dielectric breakdown field strength is most required to be secured on the side rather than the corner.

«Characteristic on Manufacturing Method (Third Method)»

Figure 32:
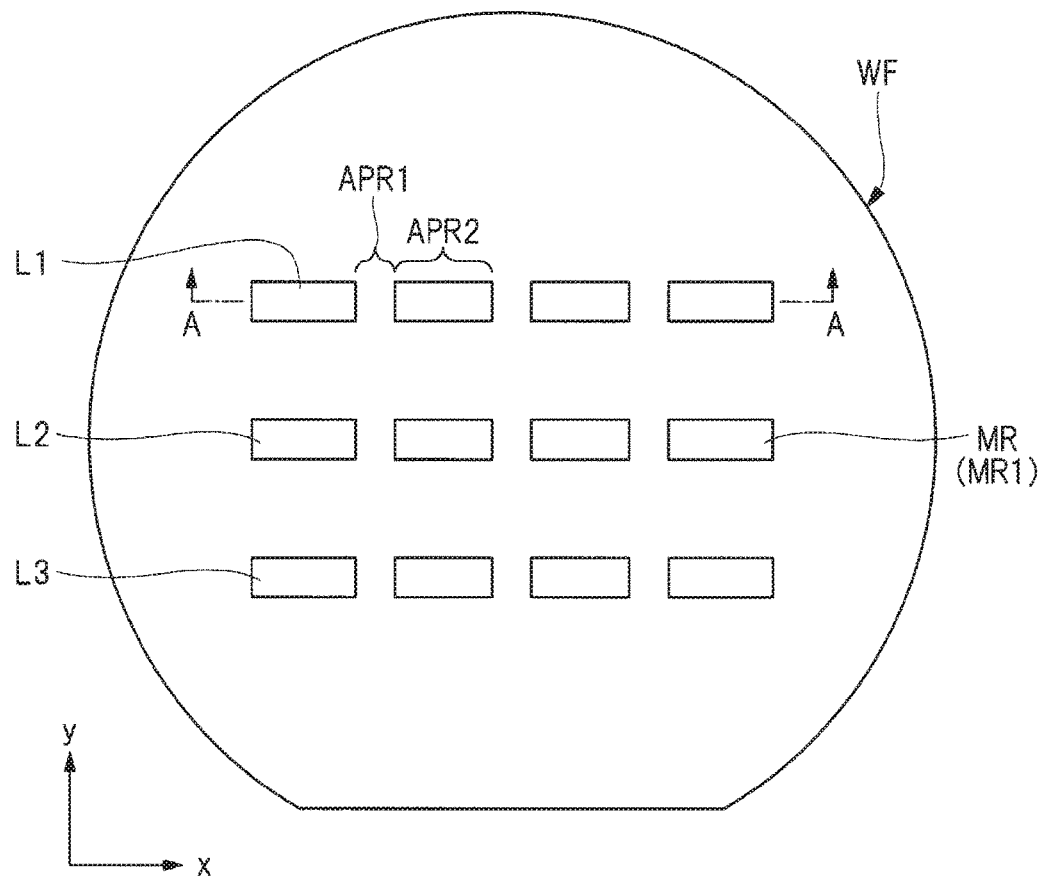
FIG. 32(a) is a schematic diagram illustrating a state of applying the paste-state high electric field-resistant sealing member in the x-direction of the semiconductor wafer.
FIG. 32(b) is a cross-sectional view taken along a line A-A in FIG. 32(a).
Figure 32:
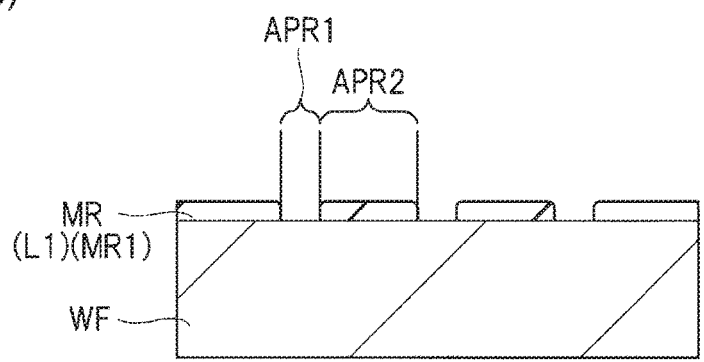

FIG. 32(a) is a schematic view illustrating a state of applying the paste-state high electric field-resistant sealing material MR1 in the x direction of the semiconductor wafer WF. For example, as illustrated in FIG. 32(a), in the manufacturing method for a semiconductor device according to the second modified example, the paste-state high electric field-resistant sealing material MR1 is applied along the x direction by using the dispenser. Consequently, as illustrated in FIG. 32(a), three lines L1 to L3 each consisting of the high electric field-resistant sealing member MR extending in the x direction are formed.

Each of the three lines L1 to L3 includes: cross regions APR1 crossing with three lines R1 to R3 (see FIG. 33(a)) extending in the y direction as described later; and non-cross regions APR2 not overlapping with these three lines R1 to R3 (see FIG. 33(a)).

FIG. 32(b) is a cross-sectional view taken along line A-A in FIG. 32(a). As illustrated in FIG. 32(b), in the process of applying the paste-state high electric field-resistant sealing material MR1 in the x direction, the high electric field-resistant sealing material MR1 is not applied to each of the cross regions APR1, and an application amount of the high electric field-resistant sealing material MR1 to satisfy a desired thickness is applied to each of the non-cross regions APR2 other than the cross regions APR1.

Figure 33:
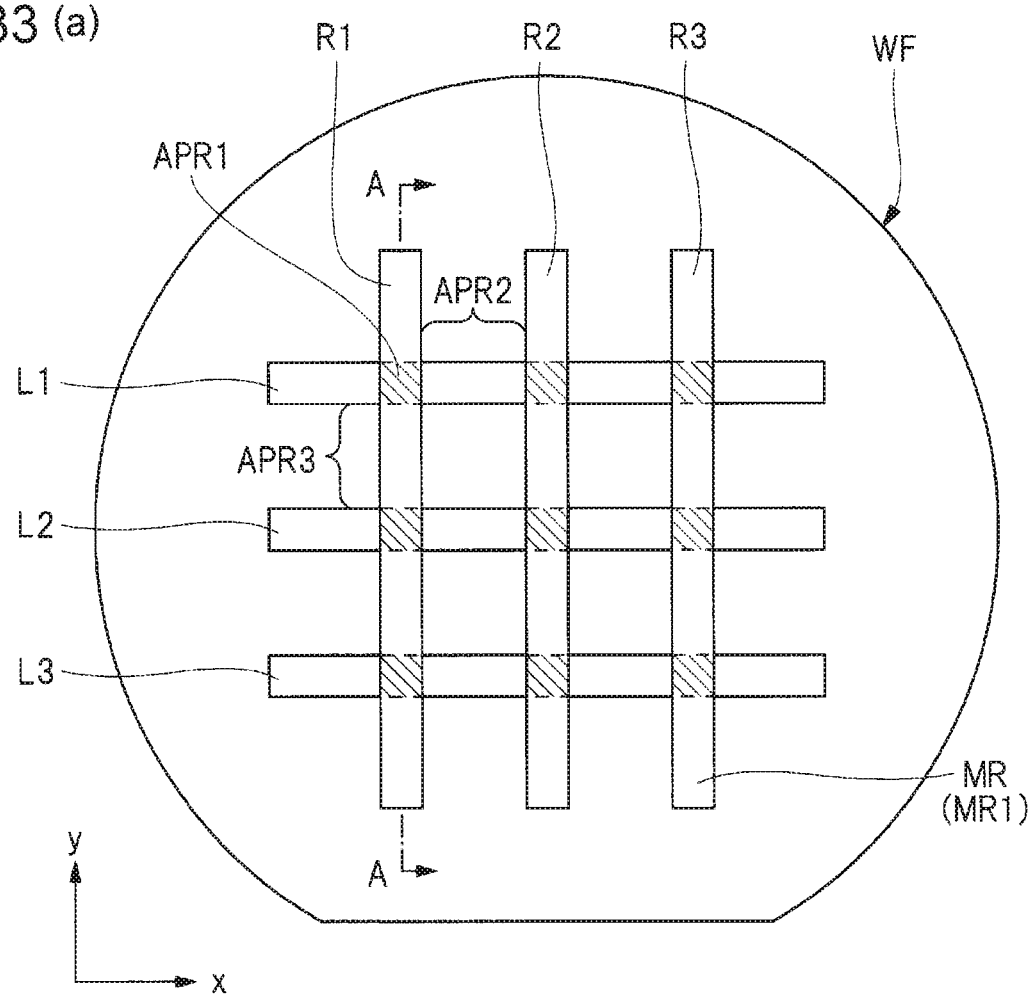
FIG. 33(a) is a schematic diagram illustrating a state of applying the paste-state high electric field-resistant sealing member in the y-direction of the semiconductor wafer.
FIG. 33(b) is a cross-sectional view taken along a line A-A in FIG. 33(a).
Figure 33:
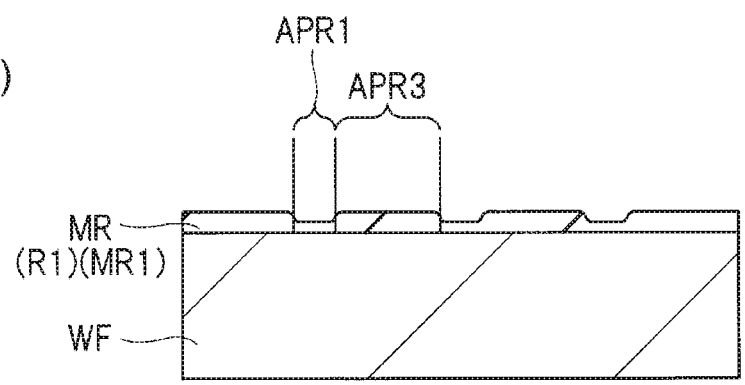

Subsequently, FIG. 33(a) is a schematic view illustrating a state of applying the paste-state high electric field-resistant sealing material MR1 in the y direction of the semiconductor wafer WF. For example, as illustrated in FIG. 33(a), in the manufacturing method for a semiconductor device according to the second modified example, the paste-state high electric field-resistant sealing material MR1 is applied along the y direction by using the dispenser. Consequently, three lines R1 to R3 each consisting of the high electric field-resistant sealing member MR extending in the y direction are formed as illustrated in FIG. 33(a).

Each of the three lines R1 to R3 includes: the cross regions APR1 respectively crossing with the three lines L1 to L3 extending in the x direction; and the non-cross regions APR3 not overlapping with these three lines L1 to L3.

FIG. 33(b) is a cross-sectional view taken along line A-A in FIG. 33(a). As illustrated in FIG. 33(b), in the process of applying the paste-state high electric field-resistant sealing material MR1 in the y direction, an application amount of the high electric field-resistant sealing material MR1 in each of the cross regions APR1 is set smaller than an application amount of the high electric field-resistant sealing material MR1 in each of the non-cross regions APR3 other than the cross regions APR1.

After that, the high electric field-resistant sealing member MR formed on the semiconductor wafer WF is heated at 100° C. for 20 minutes (1), and at 200° C. for one hour (2), and then at 300° C. for one hour (3) in a nitrogen atmosphere while the semiconductor wafer WF is horizontally held. As described above, the high electric field-resistant sealing members MR can be formed on the semiconductor wafer WF.

Here, as illustrated in FIGS. 32(a) and 32(b), for example, a characteristic point in the second modified example is to firstly apply the high electric field-resistant sealing material MR1 to each non-cross region APR2 in the process of applying the paste-state high electric field-resistant sealing material MR1 in the x direction instead of applying the paste-state high electric field-resistant sealing material MR1 to each cross region APR1. On the other hand, as illustrated in FIGS. 33(a) and 33(b), for example, the application amount of the high electric field-resistant sealing material MR1 in each cross region APR1 is set smaller than the application amount of the high electric field-resistant sealing material MR1 in each non-cross region APR3 in the process of applying the paste-state high electric field-resistant sealing material MR1 in the y direction.

Consequently, according to the second modified example, the high electric field-resistant sealing member MR having the shape illustrated in FIG. 31 can be formed on the semiconductor substrate 1S through the dicing process and the sealing process after curing the paste-state high electric field-resistant sealing member MR. As a result, as illustrated in FIG. 31, according to the characteristic point of the second modified example in which the thickness of the high electric field-resistant sealing member MR formed in the region R3 is formed smaller than the thickness of the high electric field-resistant sealing member MR formed in the region R1 including the corner, both of improving the manufacturing yield rate of the semiconductor device and improving reliability of the semiconductor device can be achieved by applying the second modified example particularly to the semiconductor chip having the structure in which dielectric breakdown field strength is most required to be secured on the side rather than the corner.

«Characteristic on Manufacturing Method (Fourth Method)»

Next, another manufacturing method in the second modified example will be described.

Figure 34:
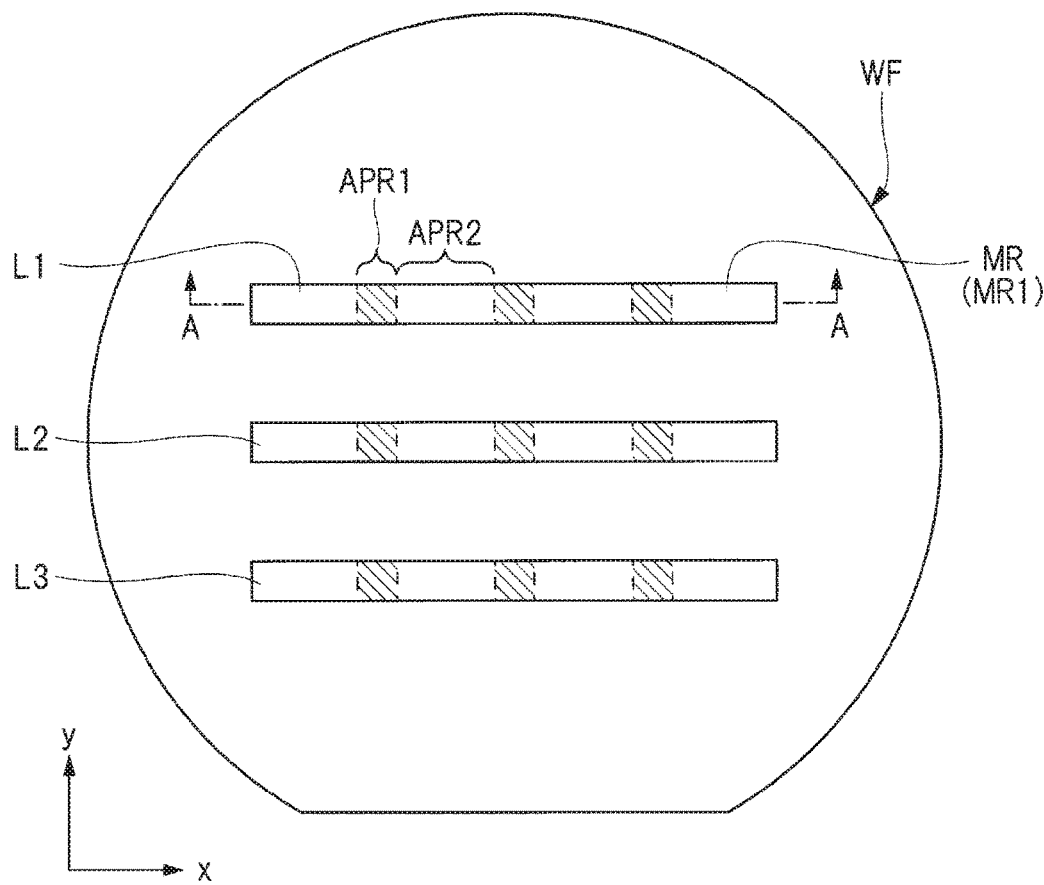
FIG. 34(a) is a schematic diagram illustrating a state of applying the paste-state high electric field-resistant sealing member in the x-direction of the semiconductor wafer.
FIG. 34(b) is a cross-sectional view taken along a line A-A in FIG. 34(a).
Figure 34:
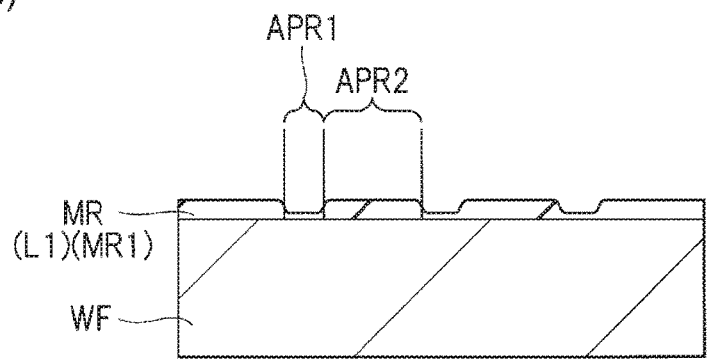

FIG. 34(a) is a schematic view illustrating a state of applying the paste-state high electric field-resistant sealing material MR1 in the x direction of the semiconductor wafer WF. For example, as illustrated in FIG. 34(a), in the manufacturing method for a semiconductor device according to the second modified example, the paste-state high electric field-resistant sealing material MR1 is applied along the x direction by using the dispenser. Consequently, as illustrated in FIG. 34(a), three lines L1 to L3 each consisting of the high electric field-resistant sealing member MR extending in the x direction are formed.

Each of the three lines L1 to L3 includes: cross regions APR1 crossing with three lines R1 to R3 (see FIG. 35(a)) extending in the y direction as described later; and non-cross regions APR2 not overlapping with these three lines R1 to R3 (see FIG. 35(a)).

FIG. 34(b) is a cross-sectional view taken along line A-A in FIG. 34(a). As illustrated in FIG. 34(b), in the process of applying the paste-state high electric field-resistant sealing material MR1 in the x direction, an application amount of the high electric field-resistant sealing material MR1 in each of the cross regions APR1 is set smaller than an application amount of the high electric field-resistant sealing material MR1 in each of the non-cross regions APR2 other than the cross regions APR1.

Figure 35:
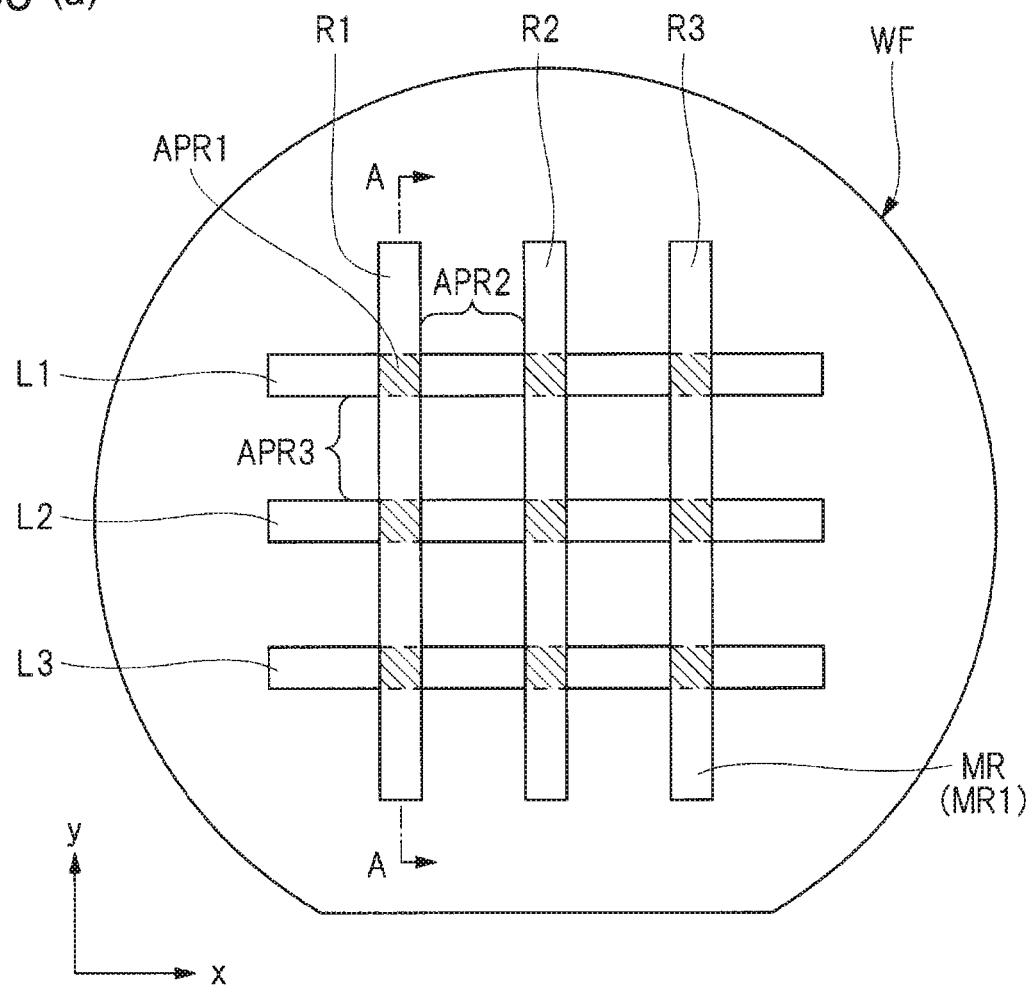
FIG. 35(a) is a schematic diagram illustrating a state of applying the paste-state high electric field-resistant sealing member in the y-direction of the semiconductor wafer.
FIG. 35(b) is a cross-sectional view taken along a line A-A in FIG. 35(a).
Figure 35:
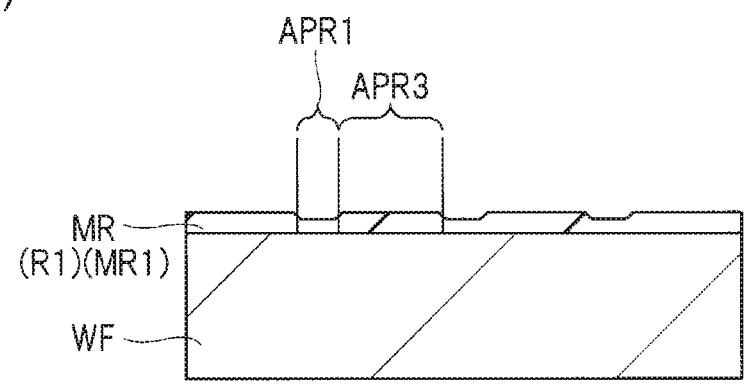

Subsequently, FIG. 35(a) is a schematic view illustrating a state of applying the paste-state high electric field-resistant sealing material MR1 in the y direction of the semiconductor wafer WF. For example, as illustrated in FIG. 35(a), in the manufacturing method for a semiconductor device according to the second modified example, the paste-state high electric field-resistant sealing material MR1 is applied along the y direction by using the dispenser. Consequently, three lines R1 to R3 each consisting of the high electric field-resistant sealing member MR extending in the y direction are formed as illustrated in FIG. 35(a).

Each of the three lines R1 to R3 includes: the cross regions APR1 respectively crossing with the three lines L1 to L3 extending in the x direction; and the non-cross regions APR3 not overlapping with these three lines L1 to L3.

FIG. 35(b) is a cross-sectional view taken along line A-A in FIG. 35(a). As illustrated in FIG. 35(b), in the process of applying the paste-state high electric field-resistant sealing material MR1 in the y direction, an application amount of the high electric field-resistant sealing material MR1 in the each of cross regions APR1 is set smaller than an application amount of the high electric field-resistant sealing material MR1 in each of the non-cross regions APR3 other than the cross regions APR1.

After that, the high electric field-resistant sealing member MR formed on the semiconductor wafer WF is heated at 100° C. for 20 minutes (1), and at 200° C. for one hour (2), and then at 300° C. for one hour (3) in a nitrogen atmosphere while the semiconductor wafer WF is horizontally held. As described above, the high electric field-resistant sealing members MR can be formed on the semiconductor wafer WF.

With the above-described manufacturing method also, the high electric field-resistant sealing member MR having the shape illustrated in FIG. 31 can be formed on the semiconductor substrate 1S through the dicing process and the sealing process after curing the paste-state high electric field-resistant sealing member MR. As a result, as illustrated in FIG. 31, according to the characteristic point of the second modified example in which the thickness of the high electric field-resistant sealing member MR in the region R3 is formed thinner than the thickness of the high electric field-resistant sealing member MR in the region R1 including the corner, both of improving the manufacturing yield rate of the semiconductor device and improvement of reliability of the semiconductor device can be achieved by applying the second modified example particularly to the semiconductor chip having the structure in which dielectric breakdown field strength is most required to be secured on the side rather than the corner.

<Verification Results>

Next, verification results of the effects of the present embodiment (including modified examples) will be described.

FIG. 36 is a diagram illustrating specific numerical examples of respective parameters for each of a plurality of chips A to E defined by the respective parameters.

In FIG. 36, a "lateral dimension" represents a lateral width of a chip, and a "vertical dimension" represents a vertical width of the chip. An "application method" represents an application method for the electric field highly resistant sealing member MR by using the dispenser, the "first method" corresponds to the application method in the above-described embodiment and the "third method" corresponds to the application method of the above-described second modified example. Additionally, "no modulation" represents the application method described in "Study on Further Improvement" (see FIGS. 18 to 20).

A "resin width 1" represents a dimension (minimum portion) (mm) that is half a width of the high electric field-resistant sealing member (resin) applied in the lateral direction, and a "resin width 2" represents a dimension (minimum portion) (mm) that is half a width of the high electric field-resistant sealing member (resin) applied in the vertical direction.

"t2" represents a maximum thickness (μm) of the region R1 (region R2) of the high electric field-resistant sealing member (resin) in a side view of each chip (see FIG. 25), and "t1" represents a minimum thickness (μm) of the region R3 of the high electric field-resistant sealing member (resin) in a side view of each chip (see FIG. 25).

"Warpage of wafer" represents warpage of a semiconductor wafer after curing the high electric field-resistant sealing member, in which "o" represents there is no warpage in appearance, and "x" represents that there is warpage in appearance.

"Yield rate of dicing" represents a yield rate in the dicing process to perform segmentation into chips, in which "o" represents that the yield rate is 95% or more, and "x" represents that the yield rate is less than 95%.

"Peeling resistance" represents occurrence of peeling after 1000 times of power cycle tests at 175° C. in each of the chips obtained by dicing, in which "o" represents no peeling, and "x" represents occurrence of peeling.

As illustrated in FIG. 36, as for chips A to D corresponding to the present embodiment (including the modified examples) out of the chips A to E, "wafer warpage" indicates that there is no warpage, also the "yield rate of dicing" is 95% or more, and "peeling resistance" is excellent. Therefore, according to the present embodiment, it can be grasped that there is a proof that improving the manufacturing yield rate of the semiconductor device and improving reliability of the semiconductor device can be both achieved.

<Structure of Semiconductor Module>

Figure 37:
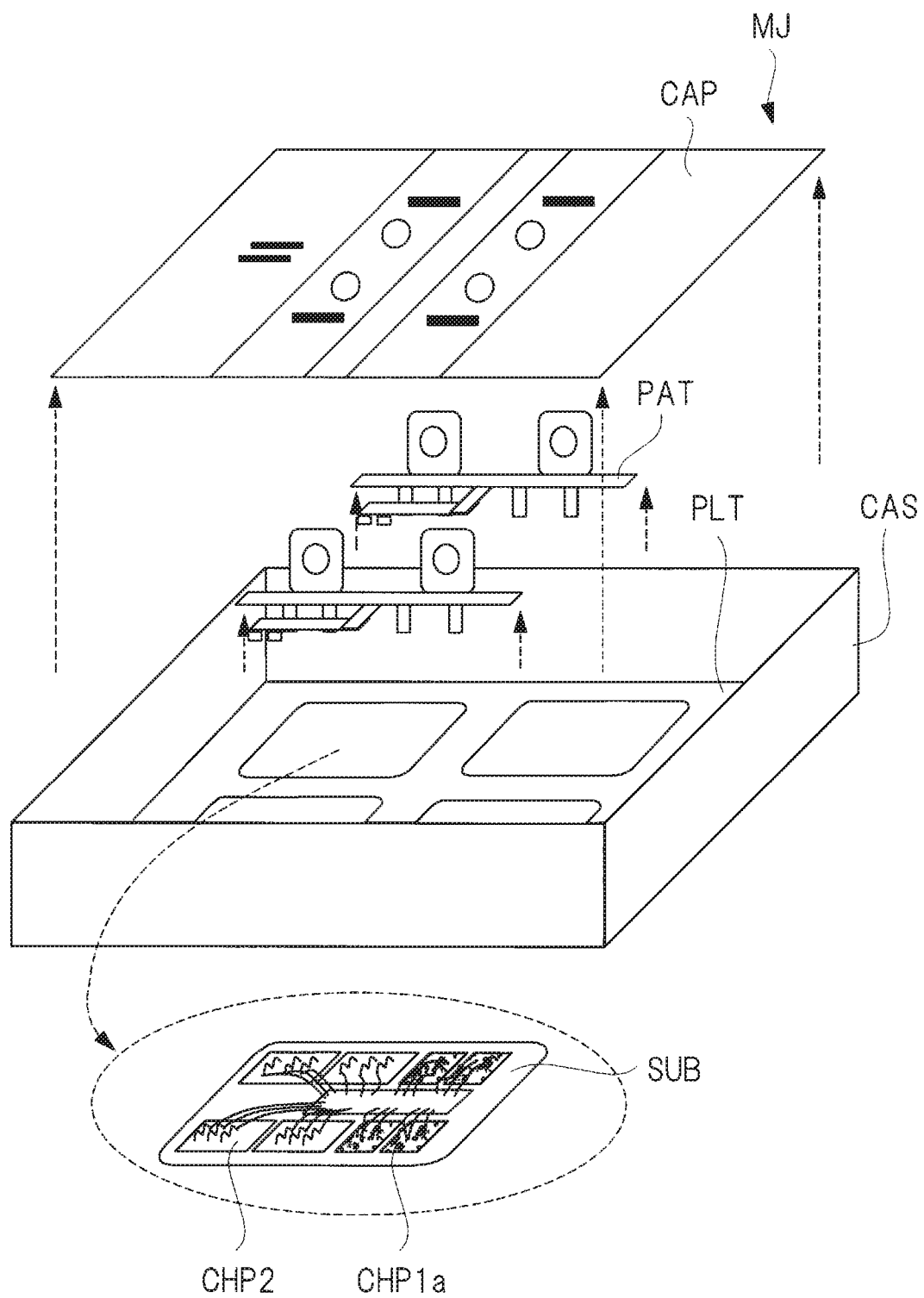
FIG. 37 is a schematic view illustrating a structure of a semiconductor module according to an embodiment.
Figure 38:
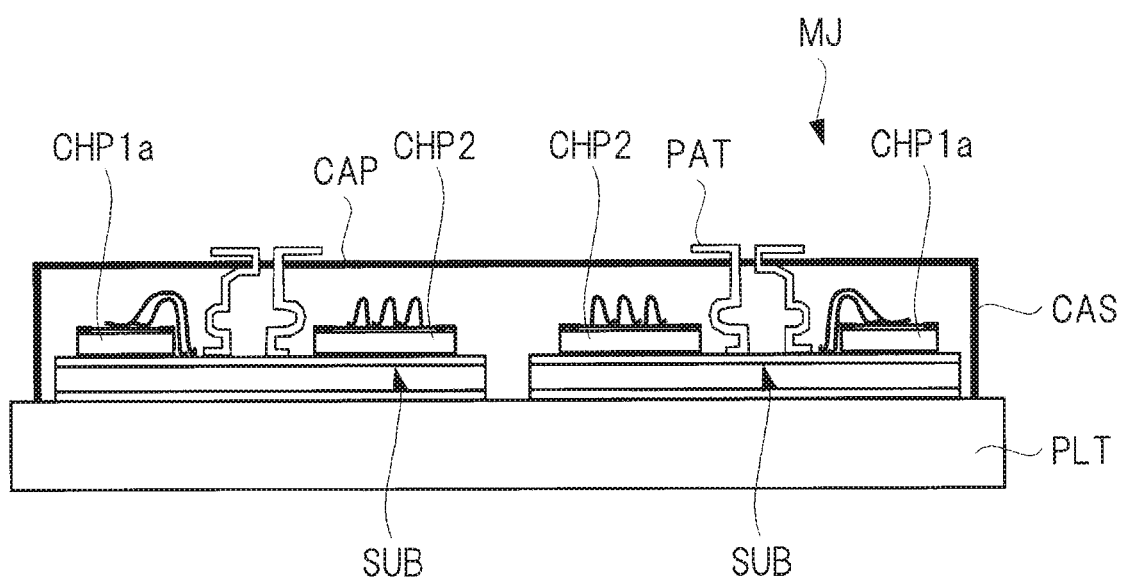
FIG. 38 is a schematic diagram illustrating a structure of the semiconductor module according to the embodiment.

Subsequently, a structure of a semiconductor module according to the present embodiment will be described. FIGS. 37 and 38 are schematic diagrams illustrating a structure of the semiconductor module MJ according to the present embodiment. As illustrated in FIGS. 37 and 38, for example, a plurality of semiconductor chips CHP1a according to the present embodiment on each of which a diode is formed and a plurality of semiconductor chip CHP2 on each of which a Si-IGBT functioning as switching elements is formed are mounted on an insulation substrate SUB.

Figure 39:
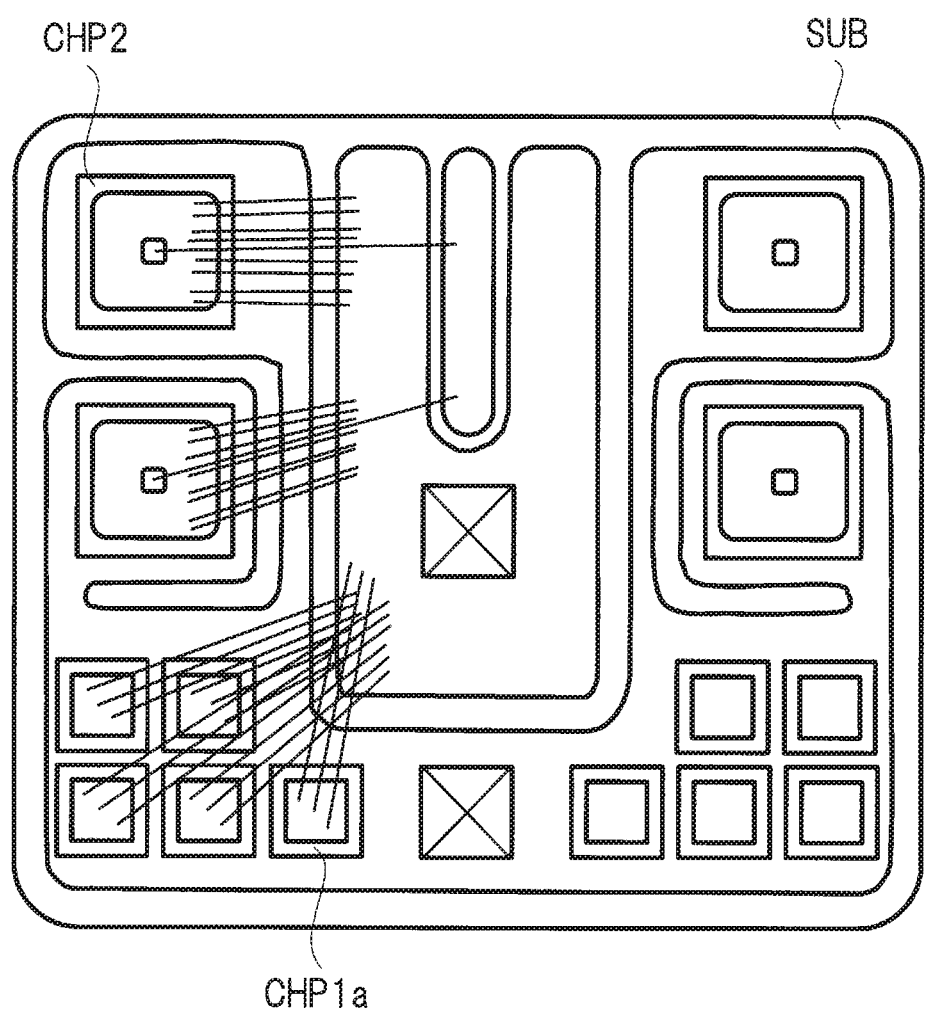
FIG. 39 is a schematic diagram illustrating an exemplary planner structure of an insulation substrate according to an embodiment.

FIG. 39 is a schematic diagram illustrating an exemplary planar structure of the insulation substrate SUB. As illustrated in FIG. 39, for example, ten semiconductor chips CHP1a formed with the diodes (SiC devices) and four semiconductor chips CHP2 formed with the Si-IGBTs are mounted on the insulation substrate SUB. As illustrated in FIG. 39, a terminal is formed in a center portion of the insulation substrate SUB, and this terminal and the plurality of semiconductor chips CHP1a are electrically connected by wires, and also the terminal and the plurality of semiconductor chips CHP2 are electrically connected by wires.

Additionally, as illustrated in FIGS. 37 and 38, the insulation substrate SUB on which the plurality of semiconductor chips CHP1a and the plurality of semiconductor chips CHP2 are mounted is placed on a base plate PLT constituting a lower surface of a case CAS. On this base plate PLT, a plurality of insulation substrates SUB is arranged. Each of the insulation substrates SUB arranged on the base plate PLT is connected to a member (heat radiation member and connection member) PAT, and the member PAT is connected to a cap CAP serving as a lid of the case CAS. Additionally, an internal space of the case CAS is sealed with, for example, a silicone gel (sealing member).

Thus, a semiconductor module MJ according to the present embodiment is structured. A power conversion device represented by an inverter or a converter can be implemented by combining a plurality of semiconductor modules MJ according to the present embodiment.

While the present invention made by the present inventors is specifically described above on the basis of the embodiment thereof, the present invention is not limited to the above-described embodiment, and various kinds of modifications can be made in a range without departing from the gist of the present invention.

The technical idea of the above embodiment can be applied to, for example, a SiC hybrid module in which a Si-IGBT and a SiC-diode (SiC-Schottky barrier diode) are combined, and can also be applied to a full SiC module consisting of a SiC-MOSFET, and to a full SiC module in which a SiC-IGBT and a SiC-diode are combined. Furthermore, the technical idea of the above embodiment is not limited thereto, and can also be applied to a technique to combine, for example: a semiconductor element using a wide bandgap semiconductor material such as SiC, GaN, or diamond; a semiconductor element using a semiconductor material having a general bandgap, such as silicon, gallium arsenide, or germanium. Moreover, the technical idea of the above embodiment can also be applied to a technique to combine semiconductor elements such as a Schottky barrier diode, a pn junction diode, a MOSFET, a junction FET, a bipolar transistor, and an IGBT.

REFERENCE SIGNS LIST

CHP1a semiconductor chip
GL silicone gel
MR high electric field-resistant sealing member
R1 region
R2 region
R3 region

The invention claimed is:

1. A semiconductor device comprising:
   a semiconductor chip including a semiconductor material having a bandgap larger than a bandgap of silicon; and
   a sealing member to seal the semiconductor chip;
   wherein
   the semiconductor chip includes an insulation member formed on a surface of the semiconductor substrate in side view and having a dielectric breakdown field strength higher than the sealing member,
   a side surface of the semiconductor chip includes
      a first region including a first corner;
      a second region including a second corner; and
      a third region interposed between the first region and the second region, and
      a minimum film thickness of the insulation member in the third region t1 is greater than a maximum film thickness of the insulation member in the first region t2 such that t2<t1.

2. The semiconductor device according to claim 1, wherein a relation of 0.5×t1≤t2≤1.2×t1 is satisfied.

3. The semiconductor device according to claim 1, wherein a relation of t2≤120 μm is satisfied.

4. The semiconductor device according to claim 1, wherein
   the insulation member contains any one of a polyimide resin, a polyamideimide resin, a polyetheramideimide resin, and a polyetheramide resin, and
   the sealing member consists of a silicone gel.

5. The semiconductor device according to claim 1, wherein the semiconductor material is any one of silicon carbide, gallium nitride, and diamond.

6. A semiconductor module comprising a plurality of semiconductor chips according to claim 1.

7. A power conversion device comprising a plurality of semiconductor modules according to claim 6.

8. A manufacturing method for a semiconductor device, comprising steps of:
   (a) preparing a semiconductor wafer that includes a semiconductor material having a bandgap larger than a bandgap of silicon and has a surface;
   (b) applying a paste-state insulation material to a first application region and a second application region along a first direction of the surface; and
   (c) applying a paste-state insulation material to the first application region and a third application region along a second direction crossing with the first direction on the surface,
   wherein an application amount of the insulation material in the first application region is set smaller than an application amount of the insulation material in the second application region in the step (b).

9. The manufacturing method for a semiconductor device according to claim 8, wherein the application amount of the insulation material in the first application region is set smaller than the application amount of the insulation material in the third application region in the step (c).

10. The manufacturing method for a semiconductor device according to claim 8, wherein
the insulation material is applied by using a dispenser in the step (b), and
a movement speed of the dispenser in the first application region is set faster than a movement speed of the dispenser in the second application region in the step (b).

11. The manufacturing method for a semiconductor device according to claim 8, wherein
the insulation material is applied by using a dispenser in the step (b), and
in the step (b), a pressure to discharge the insulation material from the dispenser is set to a first pressure in the second application region while a pressure to discharge the insulation material from the dispenser is set to a second pressure that is lower than the first pressure in the first application region.

12. The manufacturing method for a semiconductor device according to claim 8, further comprising a step (d) of obtaining a semiconductor chip by dicing the semiconductor wafer after the step (c).

13. The manufacturing method for a semiconductor device according to claim 12, further comprising a step (e) of sealing the semiconductor chip with a sealing member after the step (d).

14. A manufacturing method for a semiconductor device, comprising steps of:
(a) preparing a semiconductor wafer that includes a semiconductor material having a bandgap larger than a bandgap of silicon and has a surface;
(b) applying a paste-state insulation material to a second application region along a first direction of the surface while stepping over a first application region; and
(c) applying a paste-state insulation material to the first application region and a third application region along a second direction that crosses with the first direction on the surface,
wherein the paste-state insulation material is not applied to the first application region in the step (b).

* * * * *